(12) United States Patent
Yamada et al.

(10) Patent No.: US 6,856,026 B2
(45) Date of Patent: Feb. 15, 2005

(54) SEMICONDUCTOR CHIP, WIRING BOARD AND MANUFACTURING PROCESS THEREOF AS WELL AS SEMICONDUCTOR DEVICE

(75) Inventors: Yuichiro Yamada, Kyoto (JP); Tsuyoshi Hamatani, Ohtsu (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/616,981

(22) Filed: Jul. 11, 2003

(65) Prior Publication Data

US 2004/0017012 A1 Jan. 29, 2004

Related U.S. Application Data

(62) Division of application No. 09/972,884, filed on Oct. 10, 2001, now Pat. No. 6,693,358.

(30) Foreign Application Priority Data

| Oct. 23, 2000 | (JP) | 2000-322908 |
| Oct. 31, 2000 | (JP) | 2000-331833 |
| Nov. 17, 2000 | (JP) | 2000-350976 |
| Nov. 17, 2000 | (JP) | 2000-350977 |

(51) Int. Cl.[7] .............................................. H01L 23/48
(52) U.S. Cl. .................. 257/774; 257/784; 257/622; 257/680; 438/108
(58) Field of Search ................... 257/774, 622, 257/784, 680; 438/107

(56) References Cited

U.S. PATENT DOCUMENTS

| 3,648,131 A | | 3/1972 | Stuby |
| 3,761,782 A | | 9/1973 | Youmans |
| 4,806,706 A | * | 2/1989 | Machida et al. ............ 174/250 |
| 5,122,856 A | | 6/1992 | Komiya |
| 6,184,465 B1 | * | 2/2001 | Corisis ........................ 174/52.4 |
| 6,187,615 B1 | | 2/2001 | Kim et al. |
| 6,432,796 B1 | * | 8/2002 | Peterson ..................... 438/401 |
| 6,444,499 B1 | * | 9/2002 | Swiss et al. ................. 438/127 |
| 6,495,769 B1 | * | 12/2002 | Saito et al. .................. 174/255 |
| 6,555,416 B2 | * | 4/2003 | Nakamura et al. .......... 438/108 |
| 6,603,190 B2 | * | 8/2003 | Kosaki et al. ............... 257/618 |
| 6,693,358 B2 | * | 2/2004 | Yamada et al. ............. 257/774 |

FOREIGN PATENT DOCUMENTS

| JP | 05075014 | 3/1993 |
| JP | 08264712 | 10/1996 |
| WO | 9910925 | 3/1999 |

OTHER PUBLICATIONS

Japanese Office Action dated Feb. 3, 2003 with English translation.

\* cited by examiner

*Primary Examiner*—Jasmine Clark
(74) *Attorney, Agent, or Firm*—Stevens, Davis, Miller & Mosher, LLP

(57) ABSTRACT

A semiconductor chip which does not increase the thickness or the board area of a semiconductor device wherein semiconductor chips are layered and does not increase the wire length between the semiconductor chips even in the case that a plurality of semiconductor chips are layered on a wiring board and a process thereof, as well as a semiconductor device, and the like, are provided.

The semiconductor chip has a semiconductor substrate 13, first external electrodes 21 formed on the first surface 14 of the semiconductor substrate 13, second external electrodes 22 formed on the second surface 17 of the semiconductor substrate 13 and through holes 16 created in the semiconductor substrate 13, wherein the through holes 16 are provided in the inclined planes 15 formed so that the inner angles made up of the second surface 17 and the inclined planes 15 are obtuse angles and the first external electrodes 21 and the second external electrodes 22 are electrically connected through conductive patterns 19 formed so as to follow the inner walls of the through holes 16 and the inclined planes 15.

14 Claims, 70 Drawing Sheets

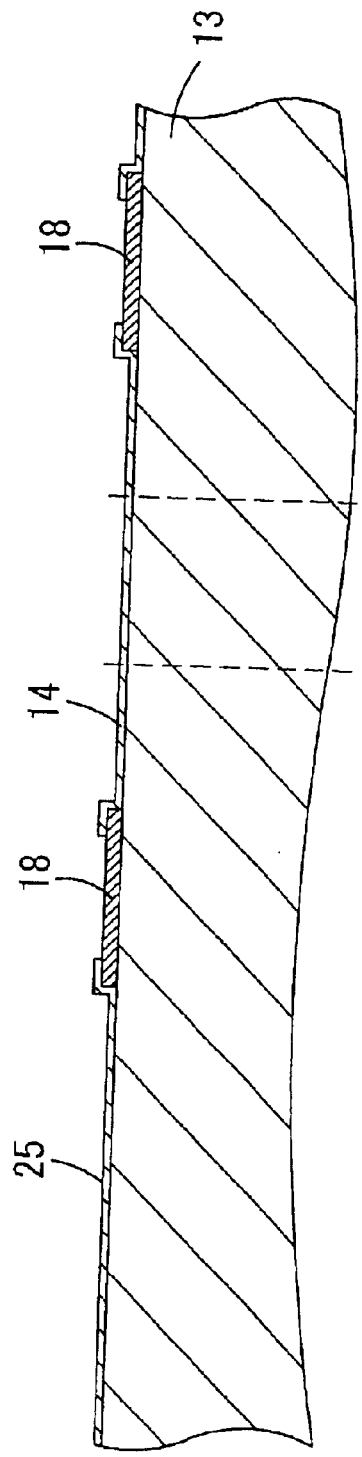
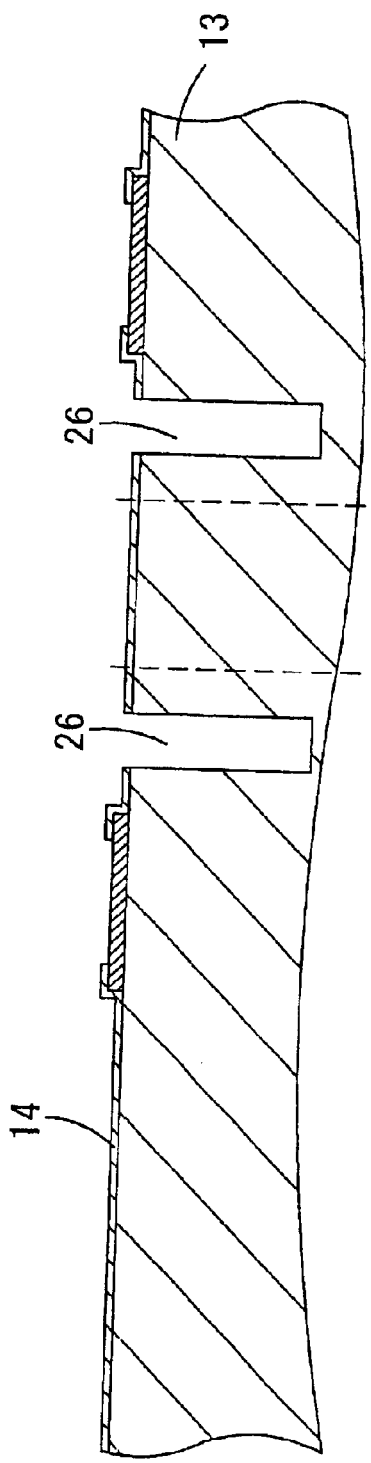

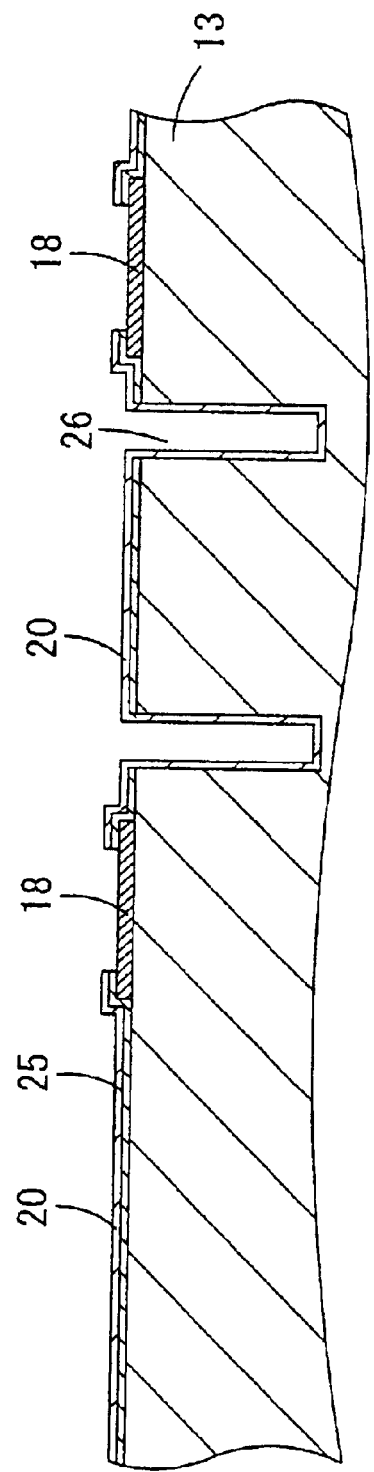
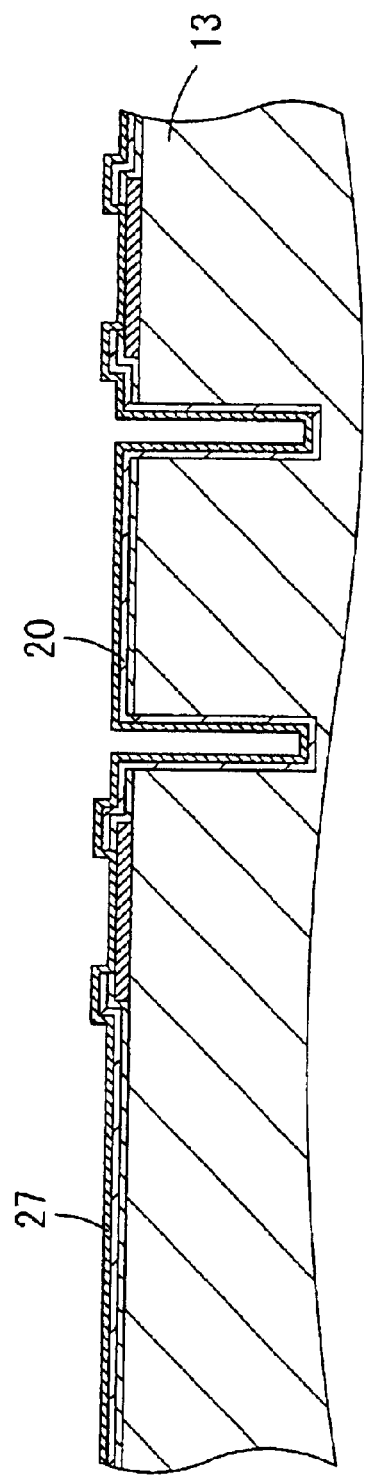

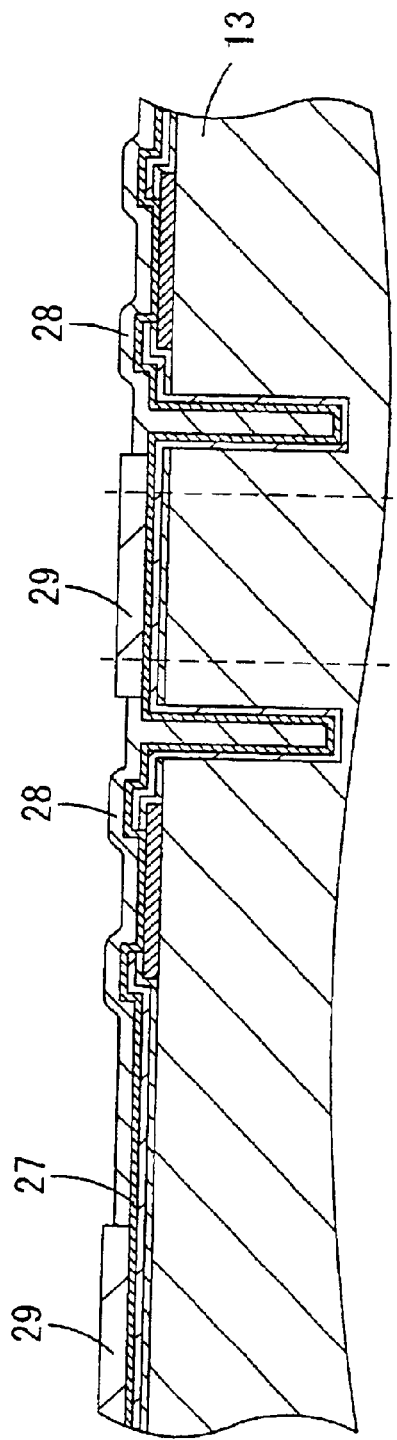
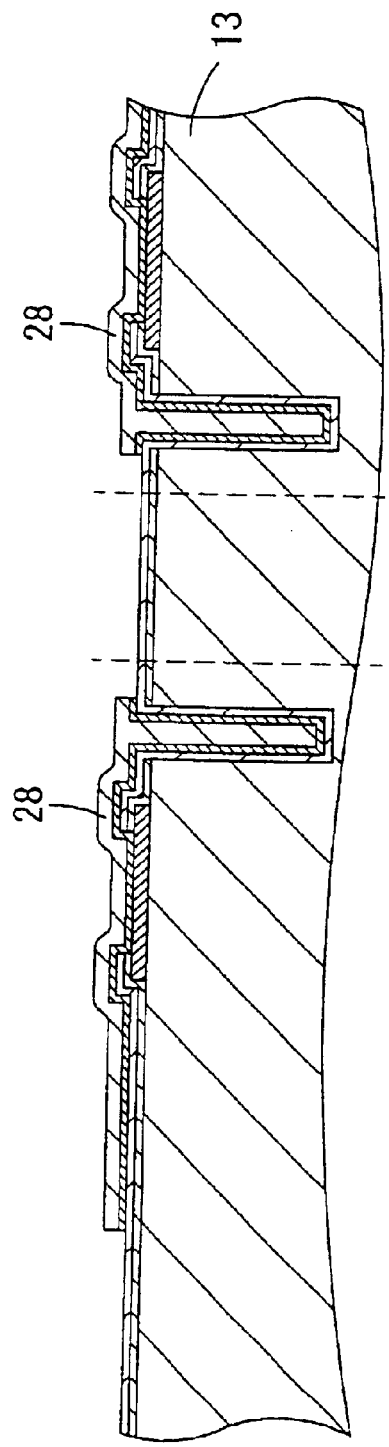

FIG. 16
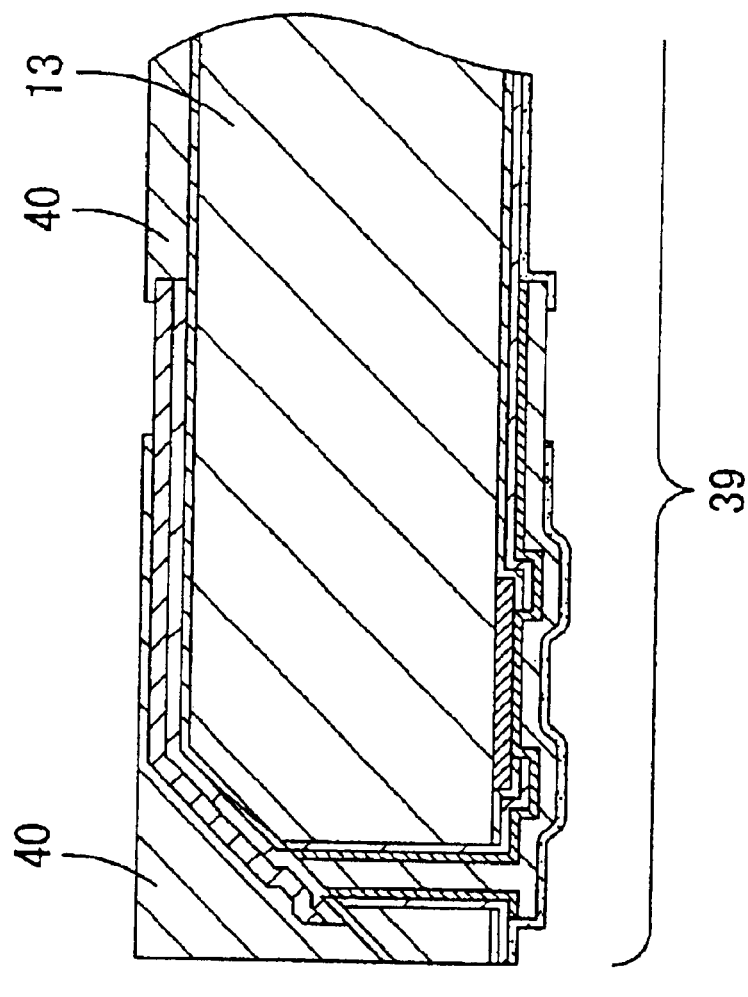
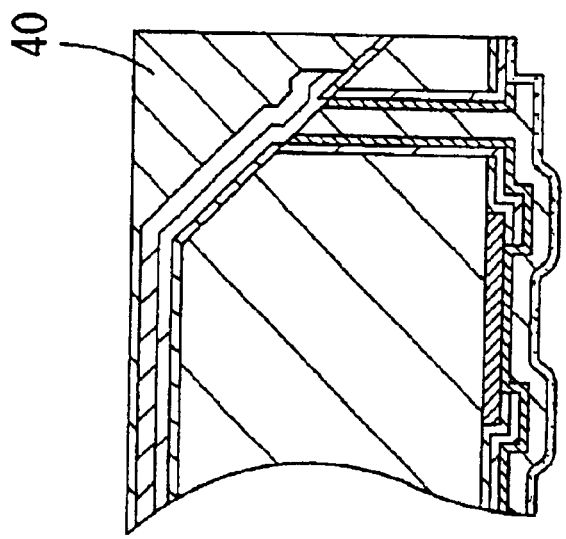

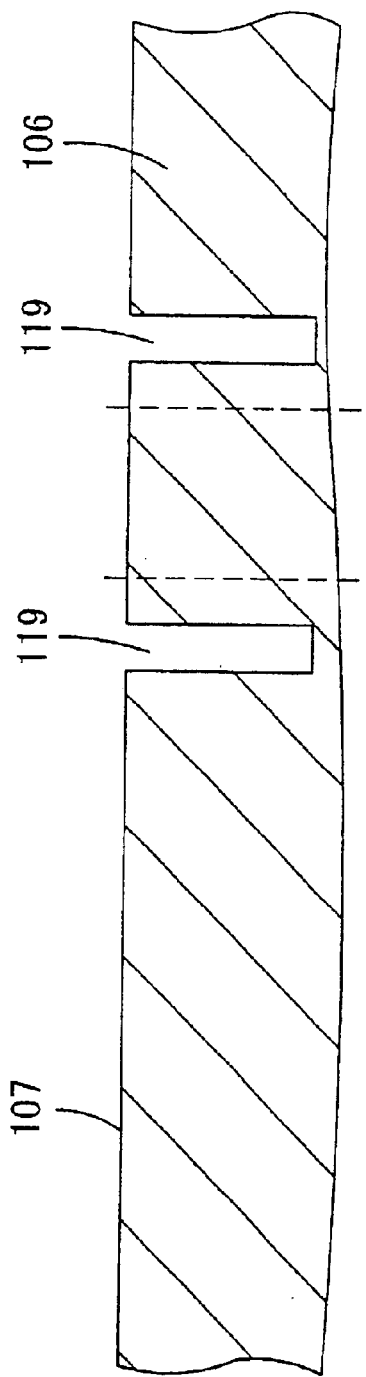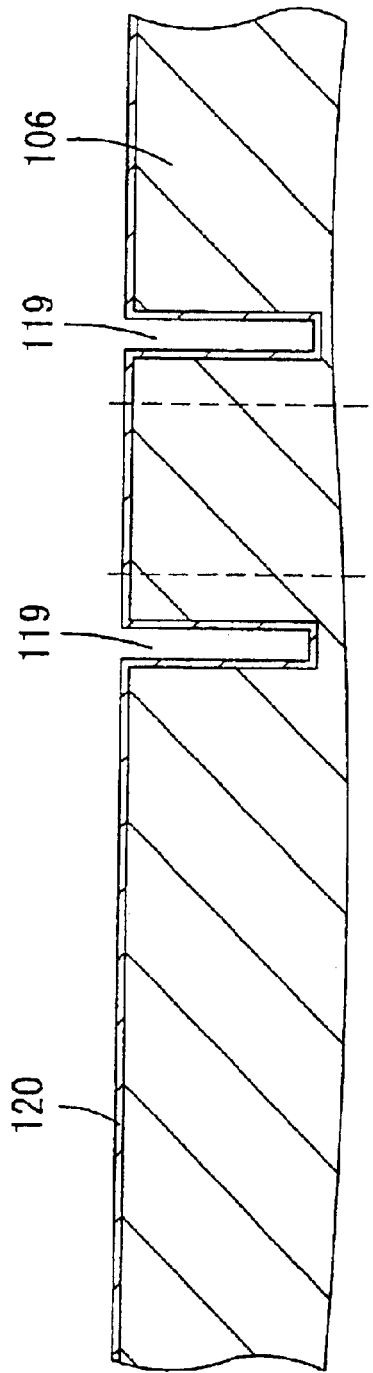

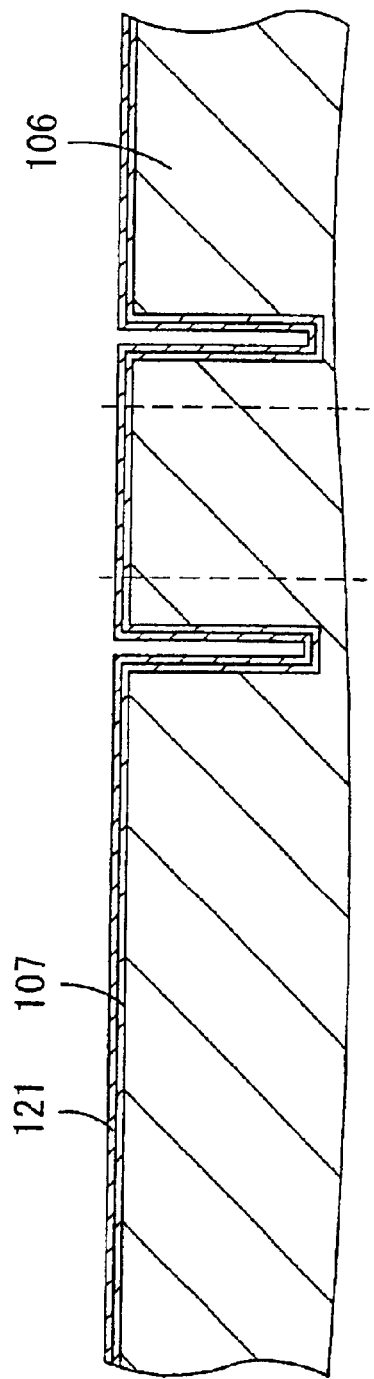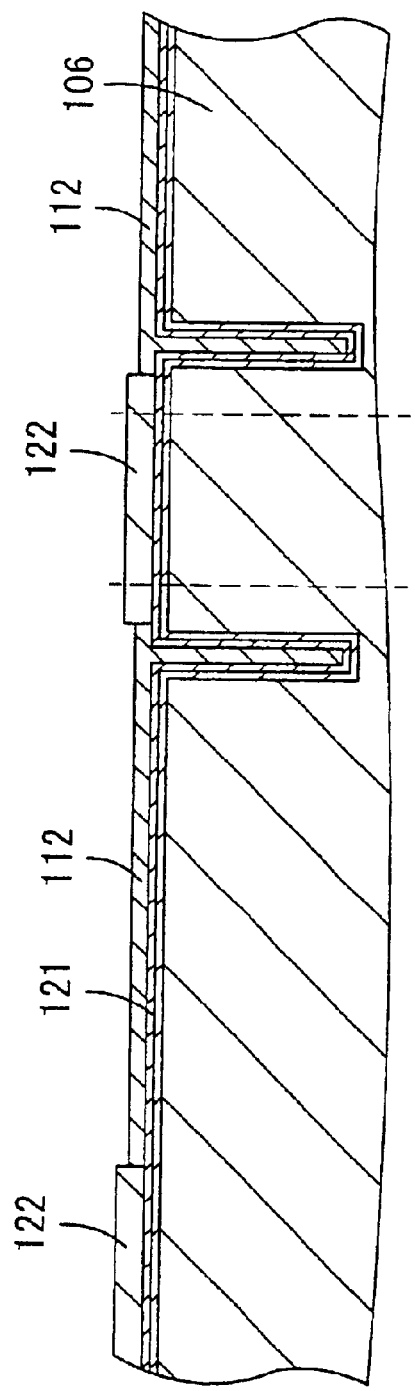

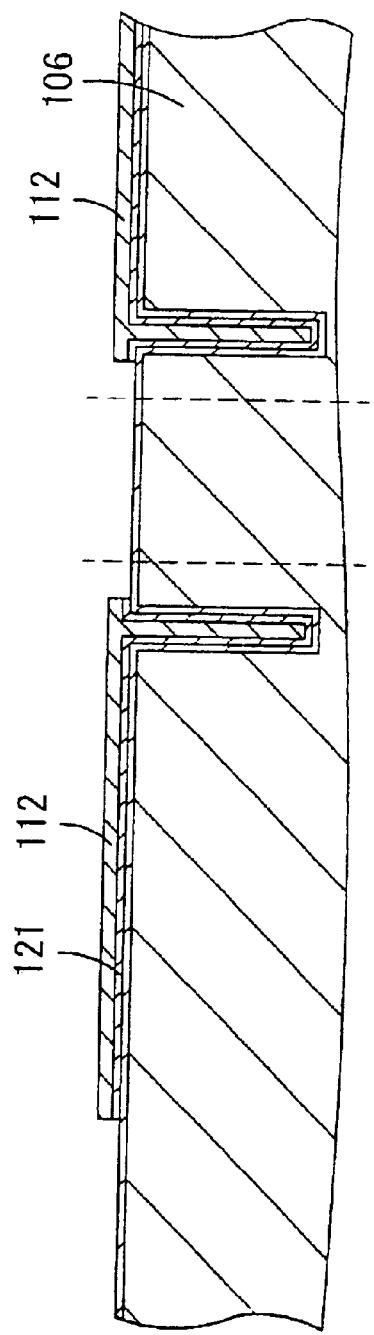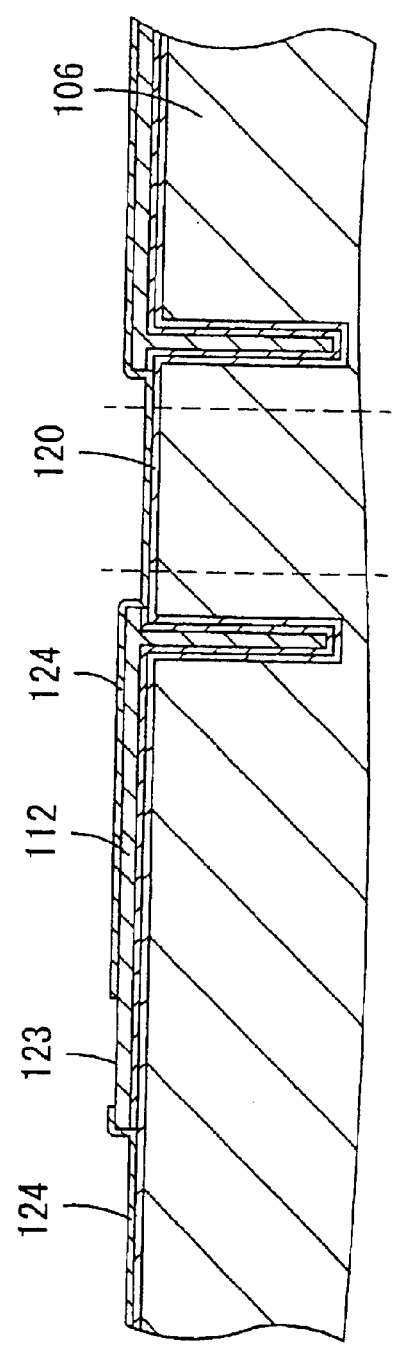

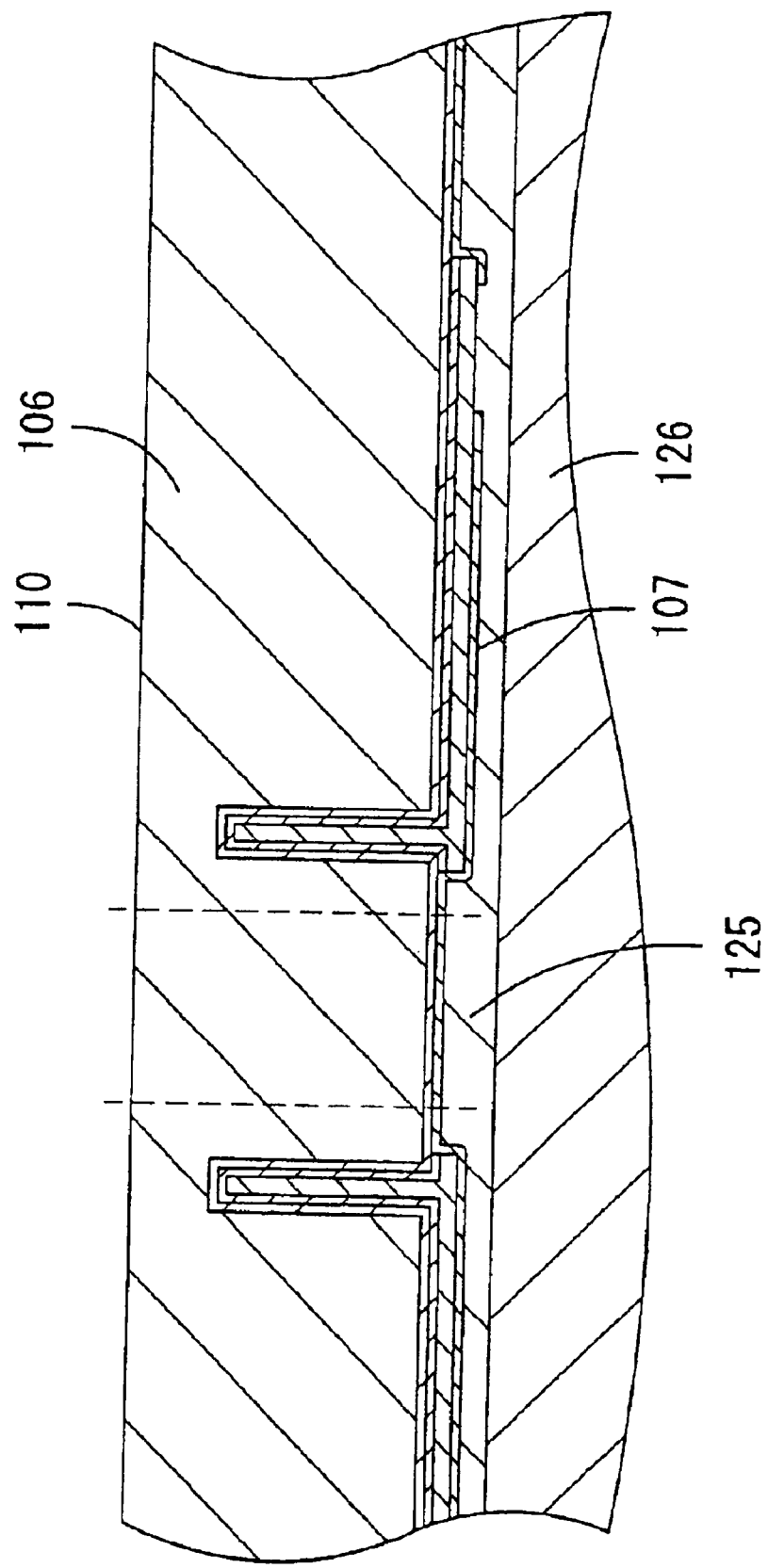

FIG. 38
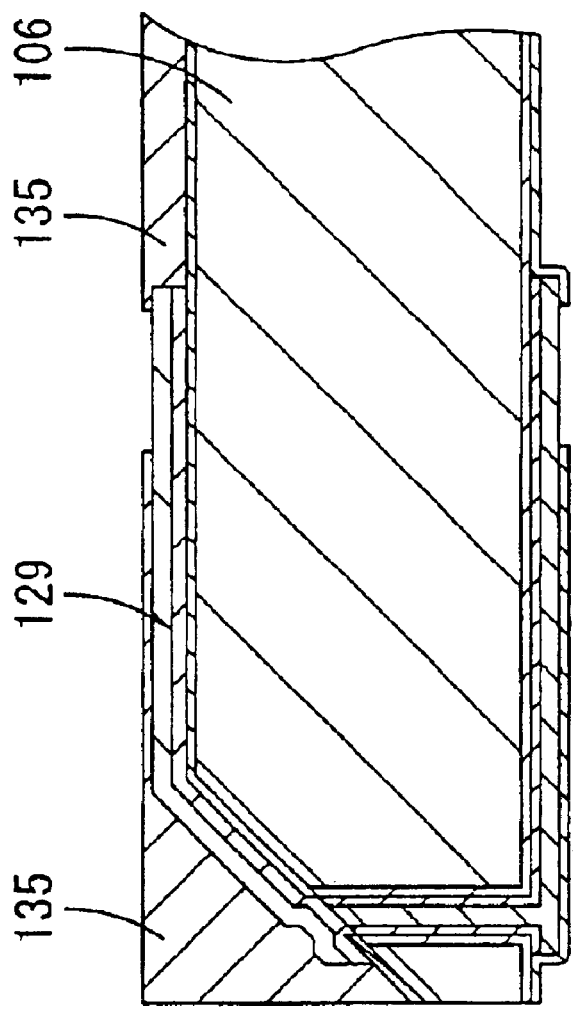
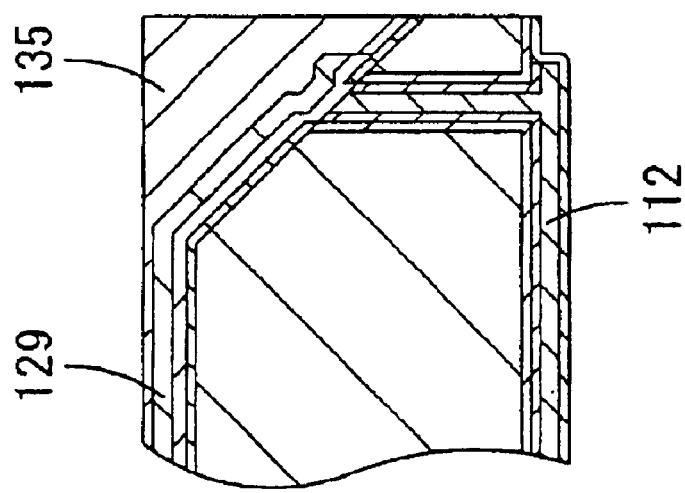

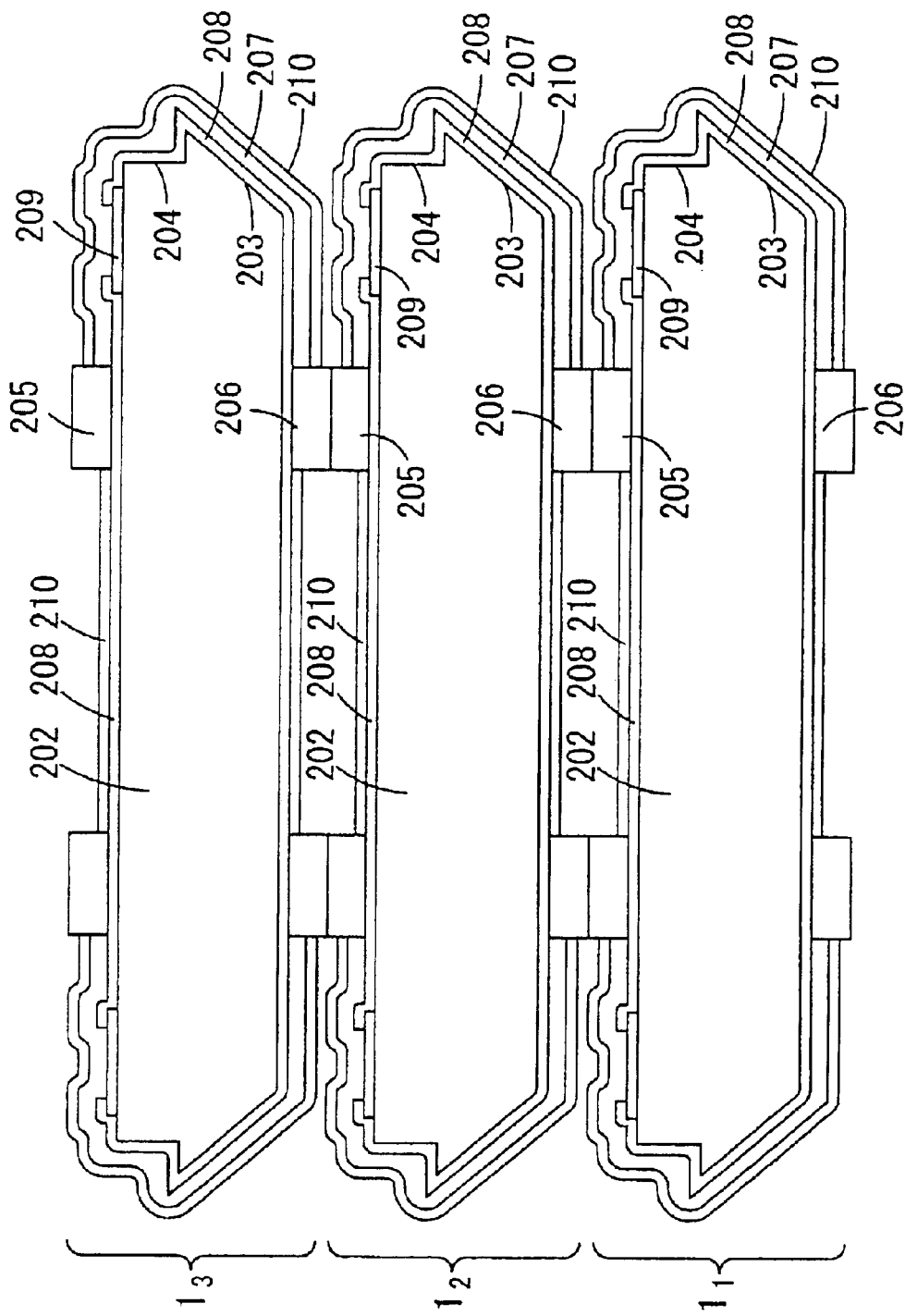

F I G. 46C
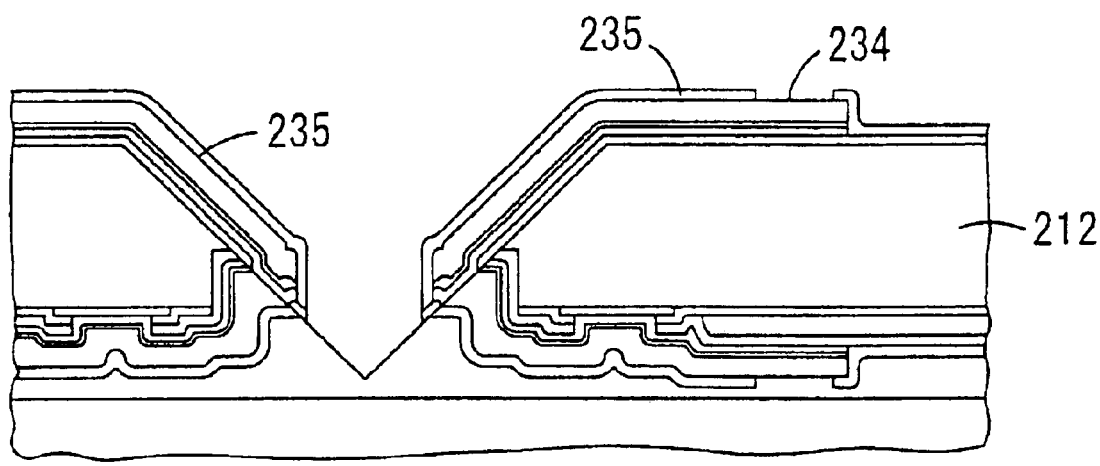
F I G. 46D
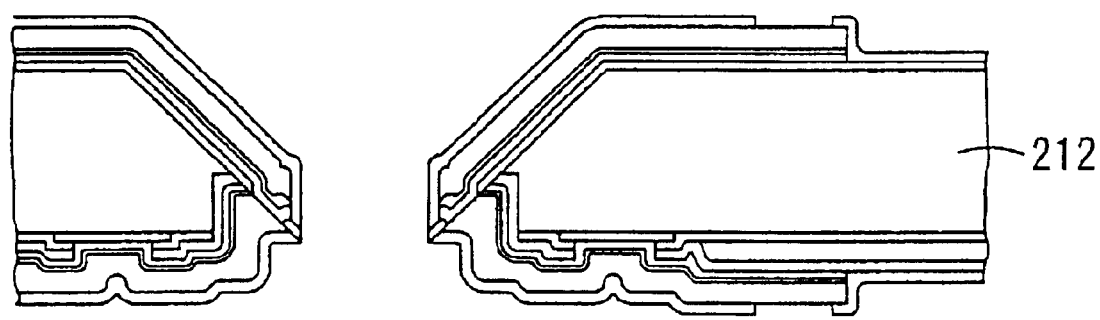

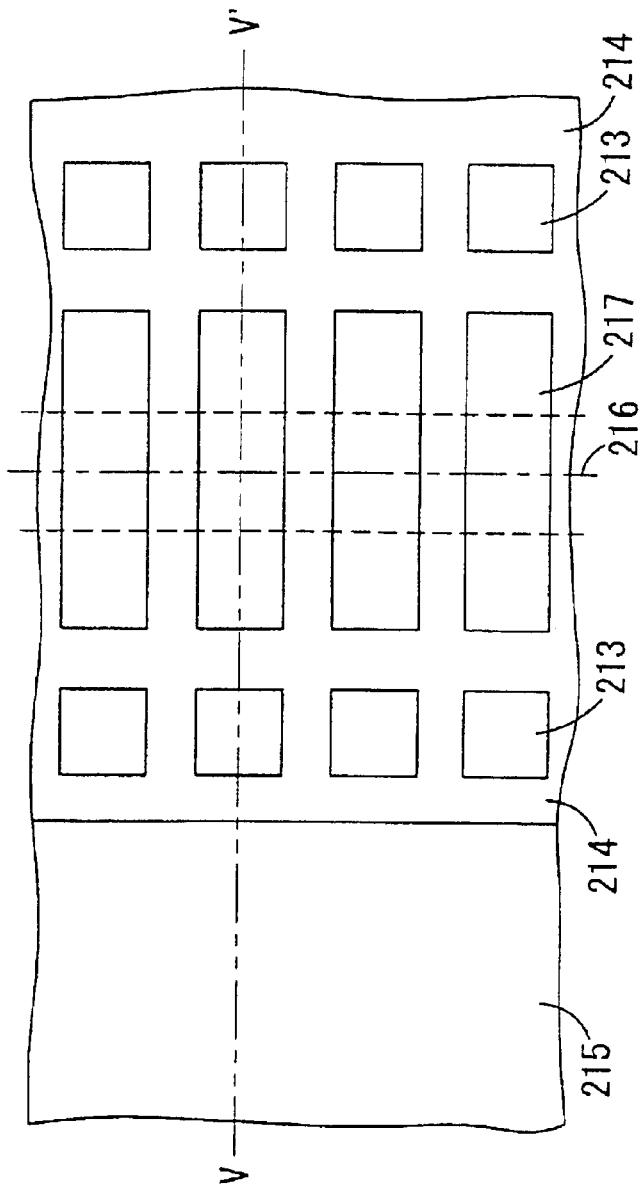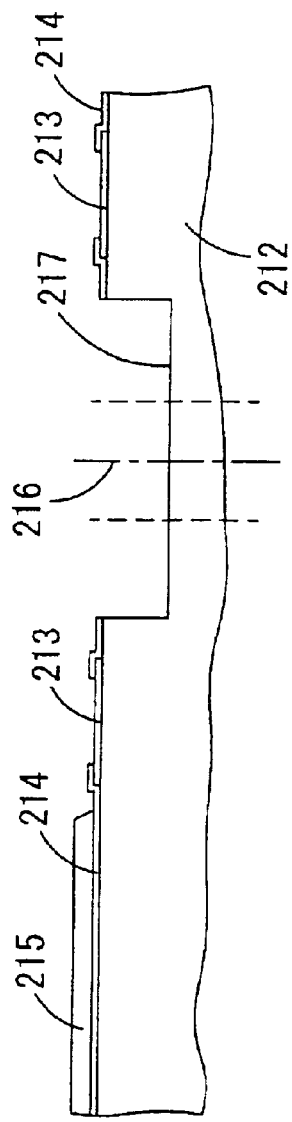

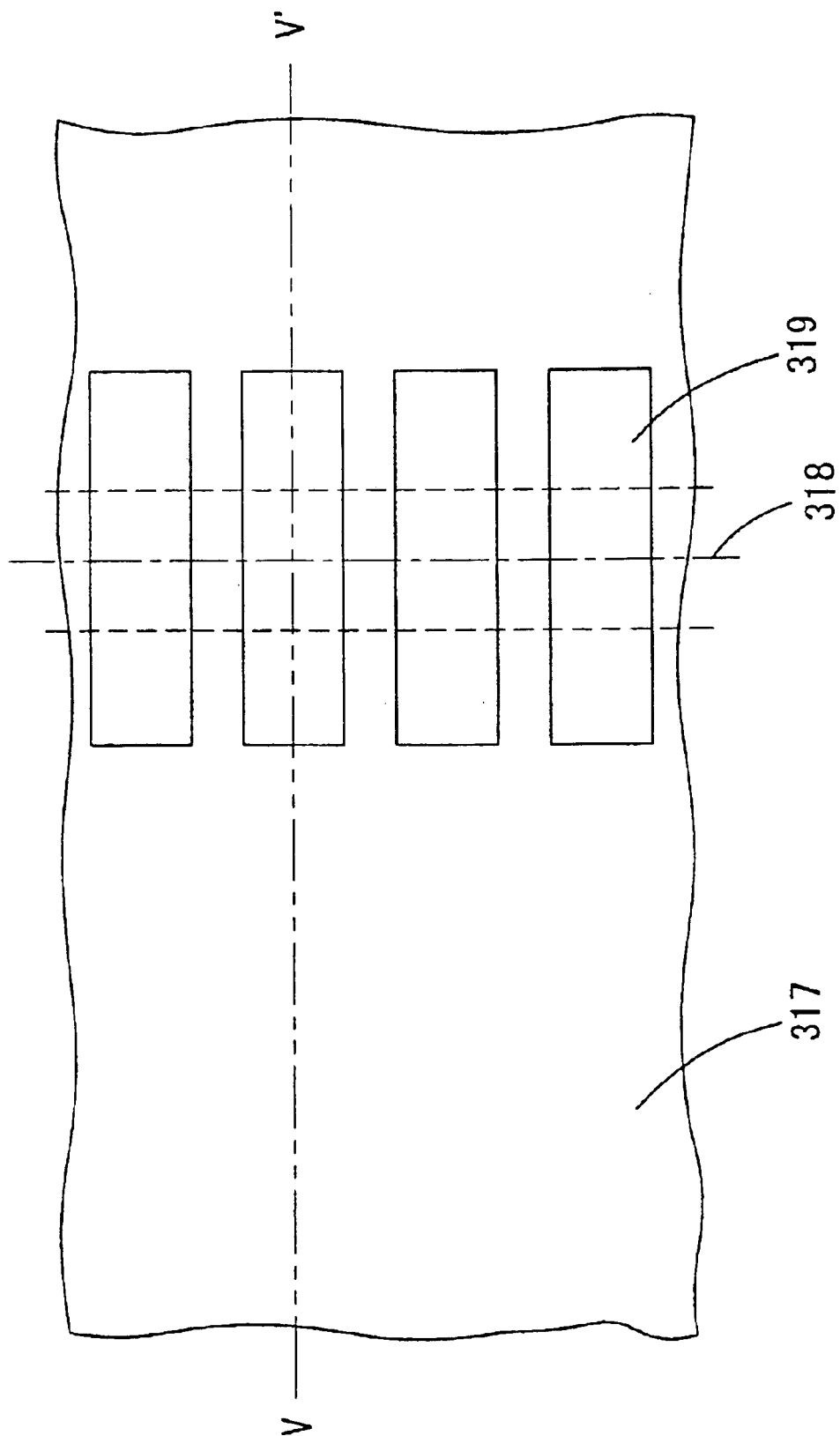

SEMICONDUCTOR CHIP, WIRING BOARD AND MANUFACTURING PROCESS THEREOF AS WELL AS SEMICONDUCTOR DEVICE

This is a divisional of application Ser. No. 09/972,884 filed Oct. 10, 2001 now U.S. Pat. No. 6,693,358.

BACKGROUND OF THE INVENTION

1. Field of the Invention

The present invention relates to a semiconductor chip and a wiring board wherein external electrodes on both sides of a semiconductor substrate are electrically connected by means of conductive patterns formed so as to follow the sides of the semiconductor substrate and the manufacturing process thereof as well as a semiconductor device that uses the semiconductor chip thereof.

2. Description of Prior Art

In recent years together with the miniaturization and the increased performance of electronics, as represented by computers and communication apparatuses, miniaturization, increased density and increased speed have become required for semiconductor devices. Therefore, a multi-chip type semiconductor device has been proposed wherein a plurality of semiconductor chips are mounted on a wiring board so as to form a module and miniaturization and higher density have been achieved.

In the following, several different modes of conventional semiconductor devices are described.

FIGS. 60 to 64 are cross section views showing conventional semiconductor devices.

First, as shown in FIG. 60, a plurality of semiconductor chips 2 are mounted on a wiring board 1 according to a flip chip system so that electrodes of the semiconductor chip 2 and connection electrodes of the wiring board 1 are electrically connected through metal bumps 3 and a plurality of semiconductor chips are mounted on one wiring board by being arranged in a plane.

Next, as shown in FIG. 61, a plurality of semiconductor chips 5 are layered on a wiring board 4 wherein electrodes of respective semiconductor chips 5 and connection electrodes of the wiring board 4 are electrically connected through metal wires 6 so that the mounting area of semiconductor chips relative to the wiring board becomes smaller in comparison with the mode where semiconductor chips are arranged in a plane.

In addition, as shown in FIG. 62, the surfaces of two semiconductor chips 7 where electrodes are formed are made to face each other and electrodes of respective semiconductor chips 7 are electrically connected through metal bumps 8 so as to have a layered boardless structure.

In addition, as shown in FIG. 63, a plurality of semiconductor devices wherein semiconductor chips 9 are mounted on wiring boards 11 via metal bumps 10 in a flip chip system are layered so that wires of the respective wiring boards 11 are electrically connected through metal bumps 12.

Several different modes of conventional semiconductor devices are described in the above and all of these conventional semiconductor devices implement semiconductor devices formed of a plurality of a semiconductor chips which have a mode wherein a plurality of semiconductor chips are mounted on a wiring board in a plane, a mode wherein a plurality of semiconductor chips are layered on a wiring board, a mode wherein surfaces of semiconductor chips where circuits are formed are made to face each other so as to be electrically connected through metal bumps and a mode wherein mounting bodies formed of semiconductor chips mounted on wiring boards are layered.

In addition, since electrodes are formed only on one side of a semiconductor chip which forms each semiconductor device, semiconductor chips are electrically connected to each other by using metal wires or boards in the case that semiconductor chips are layered.

FIG. 64 is a cross section view of a semiconductor device using a conventional resin wiring board.

As shown in FIG. 64, one, or a plurality, of semiconductor chips 2 are mounted in a plane according to a flip chip system on a resin wiring board 1 formed of a complex material, including an epoxy resin, wherein surface electrodes of the semiconductor chip(s) 2 and connection electrodes on the surface of the resin wiring board 1 are electrically connected through metal bumps 3. Furthermore, connection electrodes on the rear side of the resin wiring board 1 are electrically connected to wires of a mother board 405 by means of solder balls 404. Here, connection electrodes on both sides of the resin wiring board 1 are electrically connected through conductive patterns formed on the inner walls of through holes (not shown) which pass through the inside of the resin wiring board 1.

In this manner, the semiconductor chip(s) 2 is (are) not directly mounted on the mother board 405 but, rather, the resin wiring board 1 is inserted between the semiconductor chip(s) 2 and the mother board 405 in the structure.

However, the respective modes of the conventional semiconductor devices where a plurality of semiconductor chips are layered have the problems as follows.

First, as shown in FIG. 60, since a plurality of semiconductor chips 2 are arranged on the wiring board 1 in a plane, the area of the wiring board 1 needs to be, at least, larger than the sum of the areas of the plurality of semiconductor chips 2 and the larger is the number of mounted semiconductor chips 2, the larger must be the area of the wiring board 1.

In addition, in the semiconductor device shown in FIG. 61, it is necessary to expose electrodes for connecting the metal wires 6 which make an electrical connection with the wires of the wiring board 4 on the upper surface of a semiconductor chip 5 every time that the semiconductor chip 5 is layered and, therefore, the semiconductor chip which is far away from the board becomes small. Accordingly, it is impossible to layer semiconductor chips of the same size and the total length of the metal wires 6 becomes longer when the number of layered semiconductor substrate 5 increases and, therefore, there is a problem that the wire length becomes long.

In addition, in the semiconductor device shown in FIG. 62, it is impossible to layer three or more semiconductor chips 7 and, therefore, there is a limit in the function as a semiconductor device.

In addition, in the semiconductor device shown in FIG. 63, since it is necessary to provide wiring boards 11 between a plurality of semiconductor chips 9, there is problem that the thickness of the semiconductor device becomes large after the layering of the semiconductor chips.

As described above, in the conventional semiconductor devices, the mounting area becomes great in the case that a plurality of semiconductor chips are arranged in a plane, it is impossible to layer semiconductor chips of the same size because of the necessity of providing electrodes for the connection with metal wires, the number of layered semiconductor chips is limited, the functions as a semiconductor device are limited and the thickness of the semiconductor device becomes large due to the structure wherein boards are provided between the layered semiconductor chips and, therefore, it is difficult to achieve miniaturization, improved performance and increased speed.

In addition, the changes in characteristics due to temperature and humidity of a resin wiring board using a complex material, including an epoxy resin, are greater than the changes in the characteristics of a semiconductor chip and, in particular, there is a significant difference in the coefficient of thermal expansion between silicon which is the basic material of a semiconductor chip and an epoxy resin-based complex material and, therefore, a large amount of stress occurs in the connection part between a semiconductor chip and a resin wiring board and, therefore, there is a risk that the connection part will be broken.

Furthermore, since the flatness of a resin wiring board is not of a sufficient degree in comparison with a semiconductor chip, in a flip chip system wherein a semiconductor chip is directly connected to a resin wiring board there is a problem that the electrical connection is not stable between metal bumps formed on the electrodes of a semiconductor chip and connection electrodes of a resin wiring board.

In addition, since the dimension precision of the wires formed on a resin wiring board is not sufficient in comparison with the dimension precision of a semiconductor chip, positional shift occurs in connection parts between the surface electrodes of a semiconductor chip and connection electrodes of the resin wiring board so as to cause a defective connection.

Furthermore, since semiconductor chips are mounted on the resin wiring board in a plane in the structure, it is impossible to make the area of the resin wiring board smaller than the total area of the mounted semiconductor chips and, therefore, there is a problem that the larger the number of mounted semiconductor chips is, the larger the area of the resin wiring board is.

The present invention provides, in order to solve the above described conventional problems, a semiconductor chip of which the main purpose is to prevent the increase in the thickness of the semiconductor device wherein semiconductor chips are layered and in the increase of the board area as well as in the increase of the wire length between semiconductor chips even when a plurality of semiconductor chips are layered on a wiring board and provides a manufacturing process thereof as well as a semiconductor device using this semiconductor chip.

The present invention provides a wiring board using silicon as a material of the wiring board and a manufacturing process thereof in order to solve the above described conventional problems.

SUMMARY OF THE INVENTION

A semiconductor chip of this invention is a semiconductor chip characterized by having a semiconductor substrate, a first external electrode formed on a first surface of the semiconductor substrate, a second external electrode formed on a second surface of the semiconductor substrate and a through hole created in the semiconductor substrate, wherein the through hole is provided in an inclined plane formed so that the internal angle relative to the second surface is an obtuse angle and wherein the first external electrode and the second electrode are electrically connected through a conductive pattern formed so as to pass through the inner wall of the through hole and the inclined plane.

According to the semiconductor chip of this invention, implementation of a semiconductor chip becomes possible wherein electrodes on both sides are connected via the conductive pattern formed in the through hole and on the inclined plane and, therefore, the miniaturization, higher density and increased speed of a semiconductor device wherein semiconductor chips are layered become possible.

A semiconductor chip of this invention is a semiconductor chip having a semiconductor substrate, a surface electrode formed on a first surface of the semiconductor substrate and a through hole created in the semiconductor substrate, wherein the through hole is provided in the inclined plane formed so that the internal angle relative to a second surface is an obtuse angle and is characterized by comprising a first insulating layer formed on the first surface except for the surface electrode, on the inner wall of the through hole, on the inclined plane and on the second surface, a conductive pattern filled in within the through hole and formed on the first insulating layer and on the surface electrode and a second insulating layer formed so as to have an opening in a part of the surface of the conductive pattern on the first surface as a first external electrode and to have an opening in a part of the surface of the conductive pattern on the second surface as a second external electrode.

According to the semiconductor chip of this invention, by forming such a conductive pattern, an electrode between the semiconductor substrate and the conductive pattern and electrodes on both sides of the semiconductor substrate exposed through the insulating layer can be electrically connected and, since the electrode and the conductive pattern are covered with an insulating layer, electrical defects such as short circuits can be prevented and the semiconductor chip can be protected from external shock and, in addition, miniaturization, higher density and increased speed become possible.

A semiconductor chip of this invention is a semiconductor chip comprising a semiconductor substrate having a surface on which elements are integrally formed, a rear side in opposition parallel to the above surface, an inclined plane formed so as to make an acute angle relative to the above surface and a recess continuing to the inclined plane created around the periphery of said surface and provided with a first electrode formed on the above surface, a second electrode formed on the rear side and a conductive pattern for connecting the first electrode and the second electrode formed within the recess and on the inclined plane.

According to the semiconductor chip of this invention, a chip for a multi-chip semiconductor device can be gained which comprises a semiconductor substrate on which elements are integrally formed and has a surface electrode and a rear side electrode connected through a conductive pattern within a recess around the surface and on the side. Accordingly, the multi-chip semiconductor device which uses such a chip for a multi-chip semiconductor device can implement a multi-chip semiconductor device that achieves miniaturization, higher density and increased speed. In addition, a conductive pattern in the recess and a conductive pattern on the inclined plane are formed so as to be connected and, thereby, processing becomes easier and the connection area between the conductive patterns can be made broad.

A semiconductor chip of this invention is a semiconductor chip comprising a semiconductor substrate which has a surface on which elements are integrally formed, a rear surface in opposition parallel to the surface, inclined planes formed so that inclined planes and the surface make up acute angles and a recess formed around the periphery of the surface which continues to the inclined planes and which has surface electrodes connected to the elements, and is characterized by comprising a first insulating layer formed on the surface, other than on the inside walls of the recess, and on the surface electrodes, first conductive patterns formed so as to fill in the recess on which the first insulating layer is formed and formed on the surface on which the first insulating layer is formed so as to be in desired forms of wires and electrodes connected to the surface electrodes, a second insulating layer formed on the surface with openings for electrode parts of the first conductive patterns, inclined planes from which the first conductive patterns in the recess are exposed in a continuous manner around the rear surface, a third insulating layer formed on the rear surface and the inclined planes with openings of parts of inclined planes from which the first conductive patterns are exposed, second conductive patterns formed on the inclined planes and on the rear surface of the semiconductor chip where the third insulating layer is formed in desired forms of wires and electrodes connected to the first conductive patterns and a fourth insulating layer formed on the rear surface and on the inclined planes of the semiconductor chip with openings for the electrode parts of the second conductive patterns.

According to the semiconductor chip of this invention, a chip for a multi-chip semiconductor device is gained wherein the first electrodes, the second electrodes, wires for connecting the first electrodes and second electrodes by going through within the recess and on the sides are formed as conductive patterns and these conductive patterns are electrically connected to the surface electrodes and an insulating layer is formed on the surface of the conductive patterns, except for on the first electrodes and on the second electrodes, and an insulating layer is formed between the conductive patterns and the semiconductor substrate. Accordingly, the multi-chip semiconductor device using such a chip for a multi-chip semiconductor device can implement a multi-chip semiconductor device which achieves miniaturization, higher density and a higher operational speed in the same manner as in claims 1 and 2.

In addition, in the above described structure, a layered metal film is formed between the first insulating layer and the conductive patterns and between the surface electrodes and the conductive patterns.

In such a structure, by forming a layered metal film, it becomes possible to form conductive patterns by using an electrolytic plating method due to a barrier layer and a seed layer forming the layered metal film so that the diffusion of the component elements of the conductive patterns can be prevented.

In the above structure, the conductive patterns, except for at least one, are formed on the surface electrodes.

In such a structure, by using a semiconductor chip which has at least one conductive pattern that is not connected to the integrated circuit, at the time when a plurality of semiconductor chips are layered, it becomes possible to electrically connect semiconductor chips mutually, other than particular semiconductor chip without an electrical connection to the integrated circuit of the particular semiconductor chip.

In the above structure, vertical side surfaces are formed of an insulating resin supplied to the inclined planes.

In such a structure, a comparatively thick insulating layer is formed on the second conductive patterns formed on the inclined planes and, therefore, the sides of the semiconductor chip are reinforced and the conductive patterns on the inclined planes can be securely protected.

In the above structure, the layered metal film is made up of the barrier layer and the seed layer.

In such a structure, the component elements of the conductive patterns can be prevented from diffusing by means of the barrier layer and prevention of the characteristic deterioration of the semiconductor chip can be achieved while plating of the conductive patterns becomes possible through an electrolytic plating method by providing the seed layer.

A wiring board of this invention is a wiring board of which the base material is made of silicon wherein a plurality of through holes are created in the wiring board, the first conductive patterns are formed on the surface of the wiring board, through holes are created in the inclined planes formed so that the inner angles made up of the inclined planes and the rear surface of the wiring board are obtuse angles, the second conductive patterns are formed on the rear surface and on the inclined planes and the wiring board is characterized in that the first conductive patterns and the second conductive patterns are electrically connected through the third conductive patterns formed in the plurality of through holes.

According to the wiring board of this invention, because of the formation of the inclined planes, it becomes unnecessary to create deep holes so that processing time can be shortened and the cost reduction can be achieved. In addition, it becomes unnecessary to polish the silicon substrate so as to make the thickness thereof smaller, and therefore, a stable conveyance is secured.

The wiring board of this invention is a wiring board for a multi chip semiconductor device, wherein electronic parts are mounted on a wiring board which is mounted on a mother board, wherein the first conductive patterns made up of at least one layer for mounting and wiring electronic parts are provided on the surface of this silicon substrate and the second conductive patterns made up of at least one layer having electrodes for being mounted on the mother board are provided on the rear surface of the silicon substrate and wherein the wiring board is characterized in that the first conductive patterns and the second conductive patterns are electrically connected through the third conductive patterns formed on the sides of the silicon substrate.

According to the wiring board of this invention, a wiring board made of silicon can be gained which has the first conductive patterns for mounting and wiring electronic parts on the top surface and the second conductive patterns for providing electrodes on the rear surface which are used to mount the wiring board on a mother board and wherein these first conductive patterns and second conductive patterns are electrically connected through the third conductive patterns formed on the sides.

This silicon wiring board does not have a formation change due to humidity and since it is formed of silicon which is the same as the semiconductor chips and the formation changes such as expansion or shrinkage due to temperature change are the same as of the semiconductor chips, the flatness is high because of the formation by polishing, dimension precisions of the electrode positions are high and it is possible to narrow the pitch of the connection electrodes at the same level as the semiconductor chips and to increase the density of the wiring.

Accordingly, the multi chip semiconductor device using such a silicon wiring board has a high reliability by reducing stress on the connection parts of metal bumps, improves the stability of the connections because of the flatness and dimension precision of the wiring board and makes the increase of the wiring density possible at the level that a resin wiring board cannot achieve so that miniaturization, a higher density and a higher operational speed can be implemented.

The wiring board of this invention is a wiring board for a multi chip semiconductor device wherein electronic parts are mounted on a wiring board which is mounted on a mother board and the wiring board has a silicon substrate made of silicon wherein sides are formed so that the sides and the surface of the wiring board form acute angles and a recess is formed around the top surface and the wiring board is characterized by comprising the first conductive patterns made up of at least one layer being formed on the top surface and within the recess of the above silicon substrate and having electrodes and the second conductive patterns made up of at least one layer being formed on the rear surface and on the sides of the silicon substrate, being connected to the first conductive patterns and having electrodes.

According to a wiring substrate of this invention, a wiring board made of silicon is gained which has the first conductive patterns on the top surface and the second conductive patterns on the rear surface wherein the first conductive patterns and the second conductive patterns are electrically connected directly to each other.

Accordingly, the multi chip semiconductor device using such a silicon wiring board reduces stress in connection parts of the metal bumps so as to improve the reliability, improves stability of the connection because of the flatness and dimension precision of the wiring board and makes the increase of wiring density possible at the level a resin wiring board cannot achieve so that miniaturization, a higher density and a higher operational speed can be implemented.

In the above described structure, an insulating layer is formed on the sides so that the sides and the top surface of the substrate form right angles.

In such a structure, the sides of the wiring board can be reinforced and the protection of the conductive patterns on the sides can be improved.

In the above described structure, a resin layer with low stress is provided either or both between the first conductive patterns and the substrate or/and between the second conductive patterns and substrate.

In such a structure, a stress which occurs between the semiconductor chip and the wiring board due to the temperature changes can be relieved so that the reliability of the mounted semiconductor chip can be enhanced.

The process for a semiconductor chip of this invention is characterized by having the step of preparing a semiconductor substrate, the step of forming holes around a peripheral parts of the semiconductor chip units of the semiconductor substrates, the step of forming the first external electrodes on the first plane of the semiconductor substrate and forming the first conductive pattern, in the holes and on the first planes, for making an electrical connection with the first external electrodes, the step of forming inclined planes where the internal angles made up of the inclined planes and the second plane of the semiconductor substrate become obtuse angles and for making the holes penetrate, the step of forming the second external electrodes on the second plane and the step of forming the second conductive patterns for electrically connecting the second external electrodes on the inclined planes and on the second plane with the first conductive patterns.

According to the process for a semiconductor chip of this invention, the inclined planes of which the inner angle made up of the inclined planes and the second plane are obtuse angles and through holes are created between the inclined surfaces and the first surface and therefore, by forming conductive patterns in the through holes, it becomes possible to electrically connect the first plane with the second plane and in addition, it becomes unnecessary to create deep holes and to polish the semiconductor substrate starting from the rear surface so as to make it thinner so that the processing time can be shortened and thereby the cost can be reduced. In addition, the conveyance of the semiconductor substrate is easier in comparison with the thinly processed semiconductor substrates.

The process for a semiconductor chip of this invention is characterized by happening the step of preparing a semiconductor substrate, the step of creating holes around the peripheral parts of the semiconductor chip units in the semiconductor substrate, the step of forming the first insulating layer on the first plane except for on the surface electrodes of the semiconductor substrate and on the inner walls of the holes, the step of forming the first conductive patterns on the first insulating layer and of filling in the first conductive patterns in the holes, the step of forming the second insulating layer with openings for the first external electrodes in parts of the surface of the first conductive patterns, the step of polishing the second plane of the semiconductor substrate so as to be made to have a desired thickness, the step of forming inclined planes, where the inner angles made up of the inclined planes and the second plane are obtuse angles, in border parts between semiconductor chip units in the second plane and of making the holes penetrate to the inclined planes, the step of forming the second conductive patterns electrically connected to the first conductive patterns on the third insulating layer and the step of forming the fourth insulating layer with openings for the second external electrodes in parts of the surface of the second conductive patterns.

According to the process for a semiconductor ship of this invention, the conductive patterns such as electrodes and wires can be formed simultaneously on the semiconductor substrate and the first conductive patterns within the holes can be made to expose from the inclined planes at the same time when the inclined planes wherein the inclined planes and the rear plane form obtuse angles are formed and, therefore, the number of manufacturing steps of the semiconductor chip and the manufacturing cost can be reduced to a great extent.

The process for a semiconductor chip of this invention is a process for a plurality of semiconductor chips gained from a wafer that has the surface on which elements are integrally formed and the rear surface which is opposite to the surface in a parallel manner, including the step of forming a recess around semiconductor chips on the surface, the step of forming inclined planes, where the inclined planes and the surface form acute angles, in the semiconductor substrate, the step of forming the first external electrodes on the surface, the step of forming the second external electrodes on the rear surface, the step of forming the first conductive patterns connected to the first external electrodes within the recess and on the surface and the step of forming the second conductive patterns for connecting the second external electrode with the first conductive patterns on the inclined planes and on the rear surface.

According to the process for a semiconductor chip of this invention, since a recess around the surface and the side surfaces, where the side surfaces and the surface form acute angles, are formed, conductive patterns are formed on the surface and on the rear surface, for example, after forming the first conductive patterns on the top surface of the semiconductor substrate wherein a recess is formed around the top surface, the second conductive patterns are simply formed on the rear surface wherein inclined-planes, where the inclined planes and the surface form acute angles, are formed and thereby wires which penetrate from the top surface to the rear surface can be gained and electrodes penetrating from the top surface to the rear surface can be formed easily. Accordingly, chips for multi chip semiconductors can be easily implemented.

The process for a semiconductor chip of this invention is a process for a plurality of semiconductor chip gained from a wafer having the top surface on which elements are integrally formed and the rear surface which are opposite to the top surface in a parallel manner, including the step of forming a recess around a semiconductor chip along the scribe line on the surface of the wafer so as to cross the scribe line, the step of forming the first insulating layer on the inner walls of the recess and on the surface except for the surface electrodes of the semiconductor chip, the step of forming the first conductive patterns by filling in the recess on which the first insulating layer is formed and on the surface on which the first insulating layer is formed in desired forms of wires and electrodes, the step of forming the second insulating layer on the surface with openings for electrodes of the first conductive patterns, the step of polishing the wafer starting from the rear surface so as to be made to be a desired thickness, the step of forming inclined surfaces, where the inclined surfaces and the surface form acute angles, around the rear surface of the semiconductor chip in the rear surface along the scribe line and of making the first conductive patterns within the recess expose from the inclined planes, the step of forming the third insulating layer with openings for the parts of the first conductive patterns exposed from the rear surface and the inclined planes, the step of forming the second conductive patterns on the inclined planes on which the third insulating layer is formed and on the rear surface of the semiconductor chip in the desired forms of wires and electrodes which are connected to the first conductive patterns exposed from the inclined planes and the step of forming the fourth insulating layer formed on the rear surface and the inclined planes of the semiconductor chip with openings for electrode parts of the second conductive patterns.

According to the process for semiconductor chips of this invention, a recess and conductive patterns such as electrodes and wires can be formed at the same time on the wafer and formation of inclined planes in the rear surface so as to form side surfaces where the surfaces and the surface form acute angles, division of the semiconductor chip into pieces and appearance of the first conductive patterns from the rear surface can be carried out simultaneously. Accordingly,the number of manufacturing steps of the chip for a multi chip semiconductor device and the manufacturing cost can be reduced to a great extent.

In the above structure, the step of forming the first external electrodes and the step of forming the first conductive patterns are carried out simultaneously.

In such a structure, the first external electrodes and the first conductive patterns can be formed simultaneously and, thereby, the number of manufacturing steps can be reduced.

In the above structure, the step of forming the second external electrodes and the step of forming the second conductive patterns are carried out simultaneously.

In such a structure, the second external electrodes and the second conductive patterns can be formed simultaneously and, thereby, the number of manufacturing steps can further be reduced.

In the above structure, it is characterized that the step of forming the first layered metal film on the first insulating layer is provided between the step of forming the first insulating layer and the step of forming the first conductive patterns while the step of forming the second layered metal film on the third insulating layer is provided between the step of forming the third insulating layer and the step of forming the second conductive pattern.

In such a structure, electrolytic plating of the conductive pattern and prevention of diffusion of conductive patterns can be implemented by providing a layered metal film in this manner.

In the above structure, the fourth insulating layer is formed by applying a liquid resin which is cured and the substrate is divided into semiconductor chips through dicing. In such a structure, the fourth resin layer is formed by using a liquid resin and thereby the thickness of resin formed on the inclined plates can be secured sufficiently and the conductive pattern can be protected from shock from the outside. In addition, by dividing the resin applied parts through dicing, mechanical and thermal shock due to cutting resistance or the like at the time of dicing can be absorbed by resin, occurrence of inconvenience such as chipping can be prevented and the semiconductor substrate in the condition where a variety of films are formed on the entire surface can be processed at a high speed into semiconductor chip units in a stable condition.

In the above structure, the step of forming inclined planes where the inner angles made up of the inclined planes and the second surface are acute angles on the edge parts of the second plane and of making the holes penetrate to the inclined planes is characterized by being carried out through bevel cutting starting from the second plane.

In such a structure, inclined planes are easily formed in a short period of time and the first conductive patterns can be exposed.

The above structure is characterized in that the etching rate of the third insulating layer is larger than the etching rate of the first insulating layer and the second insulating layer.

In such a configuration, after forming the third insulating layer on the entire surface of the second plane and the inclined planes, the first conductive patterns are exposed and, therefore, the first insulating layer is hardly etched at the time when openings are created in the third insulating layer through etching and the third insulating layer can be selectively etched so that openings are created and, therefore, the first insulating layer, which insulates the first conductive patterns from the semiconductor substrate, is not partially removed.

In the above structure the recess is a trench formed through dicing.

In such a structure trenches can be formed simultaneously in a short period of time in a wafer condition so that the number of manufacturing steps and manufacturing cost can be reduced.

The process for a wiring board of this invention is characterized by comprising the step of forming holes in the surface of a silicon substrate, the step of forming first conductive patterns on the surface and in the holes, the step of forming inclined planes wherein the inclined planes and the rear surface of the silicon substrate form acute angles in the regions enclosing the border parts for the substrate piece units on the rear surface and of making holes penetrate through so as to expose the first conductive patterns and the step of forming the second conductive patterns electrically connected to the first conductive patterns on the rear surface and on the inclined planes.

According to the process for a wiring board of this invention, the holes are made to penetrate by forming inclined planes in the rear surface of the wiring board and, thereby, processing time for the holes can be shortened and the processing cost can be reduced.

The process of a wiring board of this invention includes the step of forming first conductive patterns made up of at least one layer for mounting and wiring electronic parts on the surface of a silicon wafer, the step of forming second conductive patterns made up of at least one layer having electrodes for being mounted on a mother board on the rear surface of the silicon wafer, the step of forming side surfaces by dividing the silicon wafer into pieces of silicon substrate and the step of forming the third conductive patterns on the side surfaces for electrically connecting the first conductive patterns and the second conductive patterns and is characterized in that the step of forming side surfaces by dividing the silicon wafer into pieces of silicon substrate is carried out after the step of forming the first conductive patterns and, after that, the step of forming the second conductive patterns and the step of forming the third conductive patterns are carried out simultaneously.

According to the process for a wiring board of the present invention, a wiring board made of silicon can be gained which has first conductive patterns on the top surface for mounting and wiring electronic parts and the second conductive patterns on the rear surface comprising electrodes for being mounted on a motherboard so that these first conductive patterns and second conductive patterns are electrically connected through the third conductive patterns formed on the side surfaces. In addition, a multi-chip semiconductor wiring board which has surface electrodes and rear surface electrodes electrically connected via the conductive patterns following the side surfaces can be easily implemented. Furthermore, after the step of forming the first conductive patterns, the step of forming side surfaces by dividing the silicon wafer in pieces of silicon substrate and, after that, the step of forming the second conductive patterns and the step of forming the third conductive patterns are carried out simultaneously and, therefore, the number of manufacturing steps can be reduced.

A process for a wiring board of this invention includes the step of forming a recess around the surface of a silicon substrate in a wafer condition, the step of forming the first conductive patterns comprising at least one layer that has electrodes on the surface and within the recess, the step of forming inclined planes wherein the inclined planes and the surface form acute angles on the silicon substrate, the step of forming the second conductive patterns comprising at least one layer that is electrically connected to the first conductive patterns and has electrodes on the rear surface and on the inclined planes of the silicon substrate.

According to the process for a wiring board of this invention, a wiring board which has the first conductive patterns on the top surface and the second conductive patterns on the rear surface and wherein the first conductive patterns and the second conductive patterns are directly electrically connected can be gained. In addition, since a recess and side surfaces wherein the side surfaces and the top surface form acute angles are formed in the wiring board, wires penetrating from the top to the rear can be formed simply by forming conductive patterns on the top surface and on the rear surface. In addition, a wiring board for multi-chip semiconductors which has surface electrodes and rear surface electrodes which are electrically connected via conductive patterns following the side surfaces can be easily implemented from a silicon substrate in a wafer condition.

The above described structure includes the step of forming an insulating layer on the inclined planes so that the insulating layer and the surface of the silicon substrate form right angles and is characterized in that the insulating layer is formed by applying a liquid resin which is cured and divided into pieces through dicing.

In such a structure, a liquid resin is supplied to the inclined planes and the cured resin part is divided into substrate pieces through dicing and, thereby, the resin absorbs mechanical interference and distortion due to heat created by friction occurring because of cutting resistance at the time of dicing so that disadvantages such as chipping can be prevented.

The above described structure is characterized by providing the step of forming a resin layer of low stress between the substrate and the first conductive patterns or between the substrate and the second conductive patterns.

In such a structure, stress due to temperature change occurring between the semiconductor chips and the wiring board can be relieved so as to enhance the reliability of the mounting of semiconductor chips.

A semiconductor device of this invention has a semiconductor substrate, the first external electrodes formed on the first plane of the semiconductor substrate, the second external electrodes formed on the second plane of the semiconductor substrate and through holes formed in the semiconductor substrate and is characterized in that the through holes are provided on inclined planes formed so that the inner angles made up of the inclined planes and the second plane are obtuse angles and as for the first external electrodes and the second external electrodes a plurality of semiconductor chips which are electrically connected through conductive patterns formed so as to follow the inner walls of the through holes and on the inclined planes are layered on each other with the respective first external electrodes and second external electrodes being electrically connected.

According to the semiconductor device of this invention semiconductor chips which have first external electrodes and second external electrodes connected via conductive patterns formed on the inner walls of the through holes and on the inclined planes are layered on each other and a semiconductor device can be gained wherein respective semiconductor chips are electrically connected via the electrodes on both sides of the semiconductor chips so that the semiconductor chips are not arranged in a plane on the wiring board and, therefore, the mounting area can be made small. In addition, since it is not necessary to provide electrodes for connecting metal wires, it is possible to layer two or more semiconductor chips of the same size or of different sizes in a desired order and it becomes possible to make the wire length between respective semiconductor chips short and to make the thickness of the layers small so that a semiconductor device which can achieve miniaturization, high density and a higher operational speed can be implemented.

A semiconductor device of this invention has a semiconductor substrate, first external electrodes formed on the first plane of the semiconductor substrate, second external electrodes formed on the second plane of the semiconductor substrate and through holes created in the semiconductor substrate and is characterized in that the through holes are provided in the inclined planes formed so that the inner angles made up of the inclined planes and the second plane form obtuse angles and as for the first external electrodes and the second external electrodes, between the two first semiconductor chips electrically connected through the first conductive patterns formed so as to follow the inner walls of the through holes and the inclined planes, a second semiconductor chip is provided wherein third external electrodes formed on the parts other than element formation regions on the third plane and the fourth external electrodes formed on the parts other than the element formation regions on the fourth plane are electrically connected through the second conductive patterns so that the first semiconductor chips and the second semiconductor chip are electrically connected directly or via connection members. According to the semiconductor device of this invention, a multi-chip type semiconductor device can be implemented which has a small mounting area, a short wiring length between respective semiconductor chips, a low height of layers and achieves miniaturization, high density and a higher operational speed.

The semiconductor device of this invention is a multi-chip type semiconductor device wherein a plurality of semiconductor chips made of semiconductor substrates wherein elements are integrally formed on the surfaces are layered and the layered semiconductor chips are made of semiconductor substrates which have top surfaces, rear surfaces opposite to the top surfaces in a parallel manner, inclined planes formed so that the inclined planes and the top surfaces form acute angles and recesses formed around the top surfaces and have first external electrodes formed on the top surfaces, second external electrodes formed on the rear surfaces and conductive patterns for connecting the first external electrodes and the second external electrodes formed in the recesses and on the side surfaces and are characterized in that the semiconductor chips are electrically connected to others semiconductor chips via the first external electrodes and the second external electrodes.

According to the semiconductor device of this invention, semiconductor chips which have first external electrodes and second external electrodes connected via conductive patterns are layered and respective semiconductor chips are electrically connected via the first external electrodes and the second external electrodes and, therefore, the plurality of semiconductor chips are not arranged in a plane on a wiring board so that the mounting area becomes small and it is possible to layer semiconductor chips of the same size and, in addition, it is possible to layer semiconductor chips of different sizes in a desired order and a multi-chip semiconductor device can be implemented which has a short wire length between respective semiconductor chips, a low height of the layers, two or more semiconductor chips layered and which can achieve miniaturization, higher density and higher operational speed. In addition, since the semiconductor substrates have inclined planes formed so that the inclined planes and the top surfaces form acute angles and recesses created around the peripheries of the top surfaces, the manufacturing of the semiconductor chips can be carried out easily.

In the above described structure, a semiconductor chip is electrically connected directly or via connection members to a semiconductor chip directly above or to a semiconductor chip directly below through the connection of the mutual electrodes of the semiconductor chips.

In such a structure, a multi-chip semiconductor device can be gained wherein semiconductor chips are connected to each other so as to make the wire length short and make the height of the layers low within the area of a semiconductor chip. Accordingly, a multi-chip semiconductor device can be realized which has a small mounting area, a short wiring length between respective semiconductor chips and a low height of the layers and which achieves miniaturization, higher density and higher operational speed.

BRIEF DESCRIPTION OF THE DRAWINGS

FIG. 2 is a cross section view showing a manufacturing process of the semiconductor chip according to the first embodiment of the present invention;

FIG. 3 is a cross section view showing a manufacturing process of the semiconductor chip according to the first embodiment of the present invention;

FIG. 4 is a cross section view showing a manufacturing process of the semiconductor chip according to the first embodiment of the present invention;

FIG. 16 is a cross section view showing a manufacturing process of the semiconductor chip according to the first embodiment of the present invention;

FIG. 25 is a cross section view of one step of the manufacturing process of a wiring board according to the present invention;

FIG. 26 is a cross section view of one step of the manufacturing process of a wiring board according to the present invention;

FIG. 27 is a cross section view of one step of the manufacturing process of a wiring board according to the present invention;

FIG. 28 is a cross section view of one step of the manufacturing process of a wiring board according to the present invention;

FIG. 38 is a cross section view of one step of the manufacturing process of a wiring board according to the present invention;

FIG. 43 is a cross section view of a multi-chip semiconductor device according to the twelfth embodiment of the present invention;

FIG. 47A is a plan view showing a recess formation method of a chip for a multi-chip semiconductor device according to the thirteenth embodiment of the present invention;

FIG. 47B is cross section view along line V–V' of FIG. 47A;

FIG. 58 is a plan view showing a recess formation method of a chip for a multi-chip semiconductor device according to the nineteenth embodiment of the present invention;

DETAILED DESCRIPTION OF PREFERRED EMBODIMENTS

In the following, embodiments of semiconductor chips and manufacturing processes thereof as well as semiconductor devices using the semiconductor chips are described in reference to the drawings.

First, the semiconductor chips of the present invention are described. Initially, the first embodiment of the present invention is described.

Figure 1:
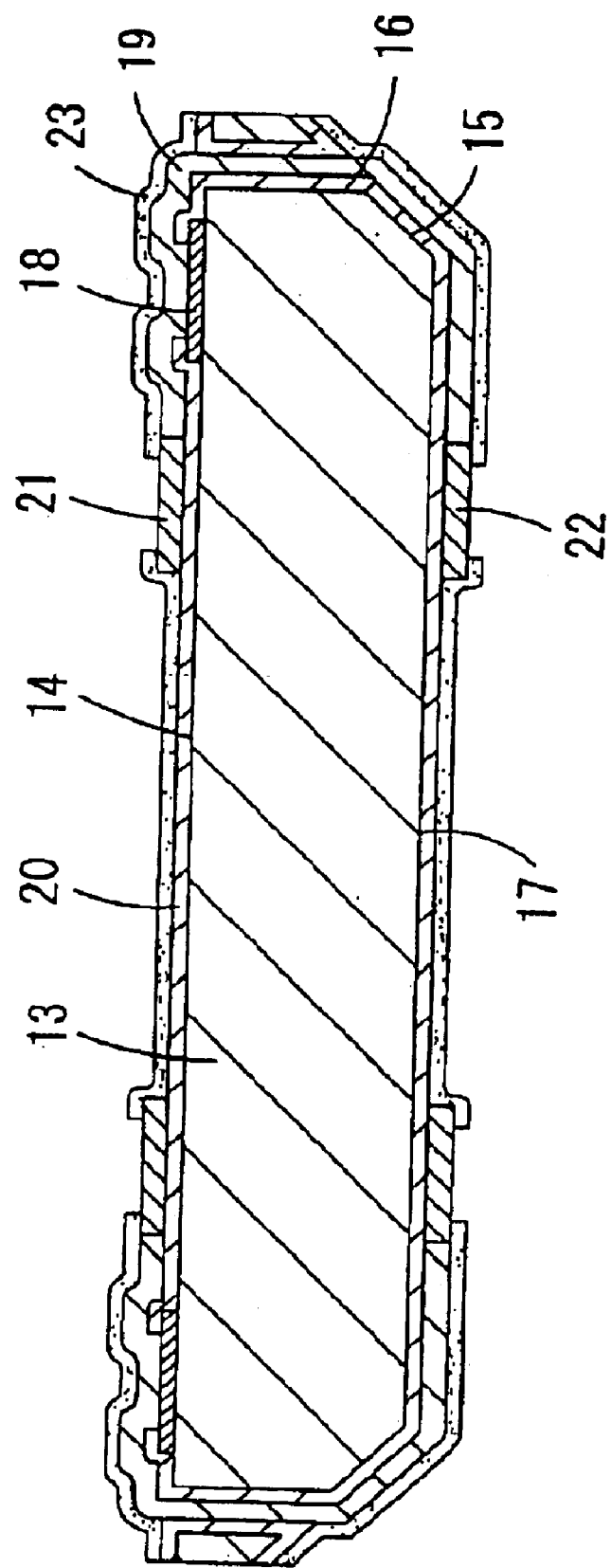
FIG. 1 is a cross section view showing a semiconductor chip according to the first embodiment of the present invention.

FIG. 1 is a cross section view of a semiconductor chip according to the present embodiment. As shown in FIG. 1 elements (not shown) and multi-layer conductive patterns (not shown) are formed on a first plane 14 which is a surface of a semiconductor substrate 13, processed through holes 16 are created from the first plane 14 to an inclined plane 15, and the inclined plane 15, that is formed so that the internal angle made up of a second plane 17, which is the rear surface, and the inclined plane becomes an obtuse angle, becomes a part of the external form of the semiconductor substrate 13. In the present embodiment the internal angle formed by the inclined plane and the second plane is 135 degrees and the inclined plane is formed up to the position 50 μm away from the second plane. Thereby, a certain amount of resin supplied onto the inclined plane easily adheres so that the conductive patterns can be protected against shock from the outside and the distance of the conductive pattern which electrically connects the electrodes formed on the surface of the semiconductor substrate becomes short so that the increased speed can be coped with.

In addition, a surface electrode 18 formed on the first plane 14 is electrically connected to a conductive pattern 19 which is formed on the surface of the inner wall of the through hole 16 and the inclined plane 15. The conductive pattern 19 may be filled in within the through hole 16 while the thickness of the conductive pattern 19 is preferably 5 μm to 15 μm, which is 10 μm in the present embodiment. Then, the material of the surface electrode 18 is made of aluminum (Al) or copper (Cu) and the surface electrode 18 is 0.3 μm to 1.0 μm, which differs depending on the manufacturing process of the semiconductor chip and, for example, in the manufacturing process where wires made of copper (Cu) with a wire width of 0.13 μm are formed, the thickness of the wires is 0.45 μm.

Next, insulating layers formed for the formed surface electrodes and conductive patterns are described. A first insulating layer 20 is formed on the first plane 14 of the semiconductor substrate 13, except for the surface electrode 18, on the second plane 17 and on the inner walls of the inclined planes 15 and through holes 16 where the thickness of the first insulating layer 20 is preferably 0.5 μm to 10 μm, which is 1 μm in the present embodiment. Then, parts of the conductive pattern 19 are opened as the first external electrode 21 and the second external electrode 22 while a second insulating layer 23 is formed on the conductive pattern 19, except for the above electrodes, and on the first insulating layer 20, on which the conductive pattern 19 is formed, as well as on the first insulating layer 20 of the second plane 17.

Here, the thickness of the second insulating layer 23 is 1 μm to 30 μm and is 1 μm in the case of silicon dioxide (SiO₂), silicon nitride (SiN) and oxide nitride film (SiON) and is 7 μm in the case of polyimide in the present embodiment. Here, the second insulating layer 23 may have a maim material of solder resist and the thickness in this case is 30 μm in the present embodiment. In addition, the first external electrode 21 and the second external electrode 22 are formed as parts of the conductive pattern 19 and, therefore, the thickness of the first external electrode 21 and the second external electrode 22 is the same as the thickness of the conductive pattern 19.

As described above, in the semiconductor chip of the present embodiment, the surface electrodes of the semiconductor substrate and the external electrodes formed on both sides of the semiconductor substrate are electrically connected and, therefore, an electrical connection between semiconductor chips becomes possible in the condition that a plurality of semiconductor chips are layered so as to face each other.

Next, a manufacturing process for the semiconductor chip of the present embodiment is described.

FIGS. 2 to 16 are cross section views of respective steps of the manufacturing process of the semiconductor chip of the present embodiment.

First, as shown in FIG. 2A, a semiconductor substrate 13 which is made of a plurality of semiconductor chip units and is in a wafer condition of a thickness of 600 μm to 1000 μm is prepared and elements (not shown), multi-layer conductive patterns (not shown) and surface electrodes 18 are formed on the first plane 14 which is the surface of the semiconductor substrate 13. Here, though the positions where the surface electrodes 18 are formed are not particularly restricted, they are formed around the periphery of each semiconductor chip unit in the present embodiment. In addition, though a surface insulating layer 25, of which the main material is silicon nitride (SiN), is formed in the entire region of the surface of the semiconductor substrate, except for on the surface electrodes 18, in the present embodiment the surface insulating layer may be formed of a material other than SiN and is not particularly restricted as long as the material functions as a protective film. In addition, the thickness of the surface insulating layer 25 is 0.5 μm to 10 μm, which is 1 μm in the present embodiment. Here, the purpose of the surface insulating layer 25 is to protect against shock from outside and it is not particularly necessary for the surface insulating layer 25 to be formed.

In addition, dotted lines show the positions where both sides, in the width direction, of the cutter blade pass through at the time of dicing for dividing the semiconductor substrate into semiconductor chip units where the middle part of the two dotted lines is a border part between semiconductor chip units.

Next, processing steps of holes are described.

FIG. 2B is a cross section view showing the condition where holes are created through processing in the first plane of the semiconductor substrate.

As shown in FIG. 2B, holes 26, of which the depth is 20 μm to 100 μm, are formed without passing through the thickness direction from the first plane 14 of the semiconductor substrate 13 by means of an RIE (reactive ion etching) method and, as for the positions of hole creation, the holes are created around the semiconductor chip units and in the present embodiment they are the positions closest to the corresponding holes on lines positioned 50 μm away from the border lines of the semiconductor chip units. In the present embodiment the depth of the holes is 70 μm and the length of the through holes which pass through by forming an inclined plane is approximately 50 μm. Here, the method of creation of holes 26 is not limited to the RIE method but, rather, it is possible to use optical etching, wet etching, supersonic processing and discharge processing and a variety of the above processing methods may be combined. As described above, the RIE method, which is a processing method of holes created in the semiconductor substrate, is a dry etching method utilizing a reactive gas plasma, which is a method used for microscopic processing of a semiconductor wafer and at the time when it is used a mask covering the parts other than the holes is formed above the insulating layer so that the parts other than the holes are not etched and the mask is removed after etching.

Next, as shown in FIG. 3A, after forming the first insulating layer 20 on the internal walls of the holes 26 and on the surface insulating layer 25, except for the openings of the surface electrodes 18, a mask which has openings in parts of the surface electrodes 18 is formed on the first insulating layer 20 and the insulating layer formed on the surface electrodes 18 are etched away and, after that, the mask is removed. Here, the first insulating layer 20 is a film formed of materials such as silicon dioxide ($SiO_2$), silicon nitride (SiN), oxide nitride film (SiON) and polyimide by means of a method such as a CVD method, a spattering method, an optical CVD method and an application.

Next, as shown in FIG. 3B, a first layered metal film 27 is formed on the first insulating layer 20, wherein the first layered metal film 27 has a two layer structure where a seed layer is layered onto a barrier layer. Here, the barrier layer and the seed layer are formed by means of a spattering method, a CVD method or an electron beam deposition method. Any of the materials from among titanium (Ti), titanium tungsten (Ti/W), chromium (Cr), nickel (Ni), and the like, is used for the barrier layer and copper (Cu), gold (Au), silver (Ag), nickel (Ni), or the like, is used for the seed layer.

Next, as shown in FIG. 4A, first conductive patterns 28 are formed within the inside walls of the holes 26 by means of an electrolytic plating method with the first layered metal film 27 as an electrode so as to be formed on the first layered metal film 27 in the desired forms of wires and electrodes. At this time, in order to achieve the desired forms of wires and electrodes, a plating resist 29 is formed on the first layered metal film 27 and, then, the plating resist 29 is removed after electrolytic plating. Here, the first conductive patterns 28 may be formed by filling in the holes 26. In addition, as for the material of the first conductive patterns 28, copper (Cu), gold (Au), tungsten (W), molybdenum (Mo), nickel (Ni), titanium (Ti), aluminum (Al), or the like, is used.

Next, as shown in FIG. 4B, the first layered metal film 27 in the parts other than the regions wherein the first conductive patterns 28 are formed is removed through etching by using the first conductive patterns 28 as a mask.

Figure 5:
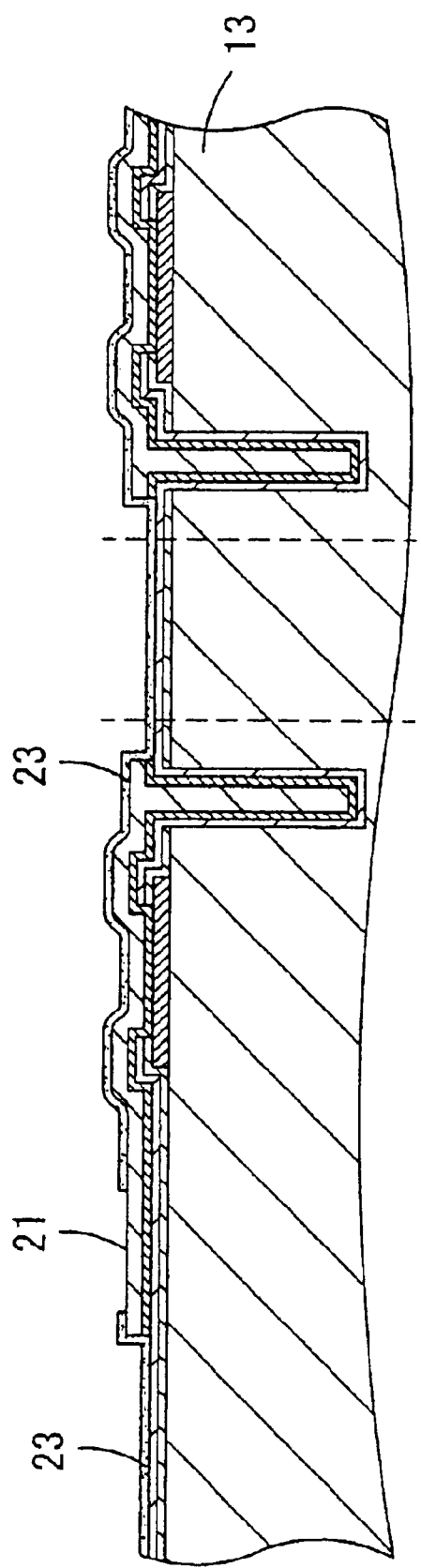
FIG. 5 is a cross section view showing a manufacturing process of the semiconductor chip according to the first embodiment of the present invention.

Next, as shown in FIG. 5, a second insulating layer 23 is formed with openings for portions of the first conductive patterns 28 so as to form first external electrodes 21 and, at this time, after forming the second insulating layer 23 on the first conductive patterns 28 and on the first insulating layer 20, except for on the first external electrodes 21, a mask with openings for portions of the first external electrodes 21 is formed and the second insulating layer 23 on the portions of the openings for the first external electrodes 21 is etched away and, after that, the mask is removed. Here, the second insulating layer 23 is a film formed of silicon dioxide ($SiO_2$), silicon nitride (SiN), oxide nitride film (SiON), polyimide, or the like, by means of a CVD method, a spattering method, an optical CVD method, an application method, or the like.

In the above, only the first external electrodes 21, electrically connected to the surface electrodes 18, are formed in the condition of being exposed from the second insulating layer 23 as conductive substances on the surface of the semiconductor substrate.

Figure 6:
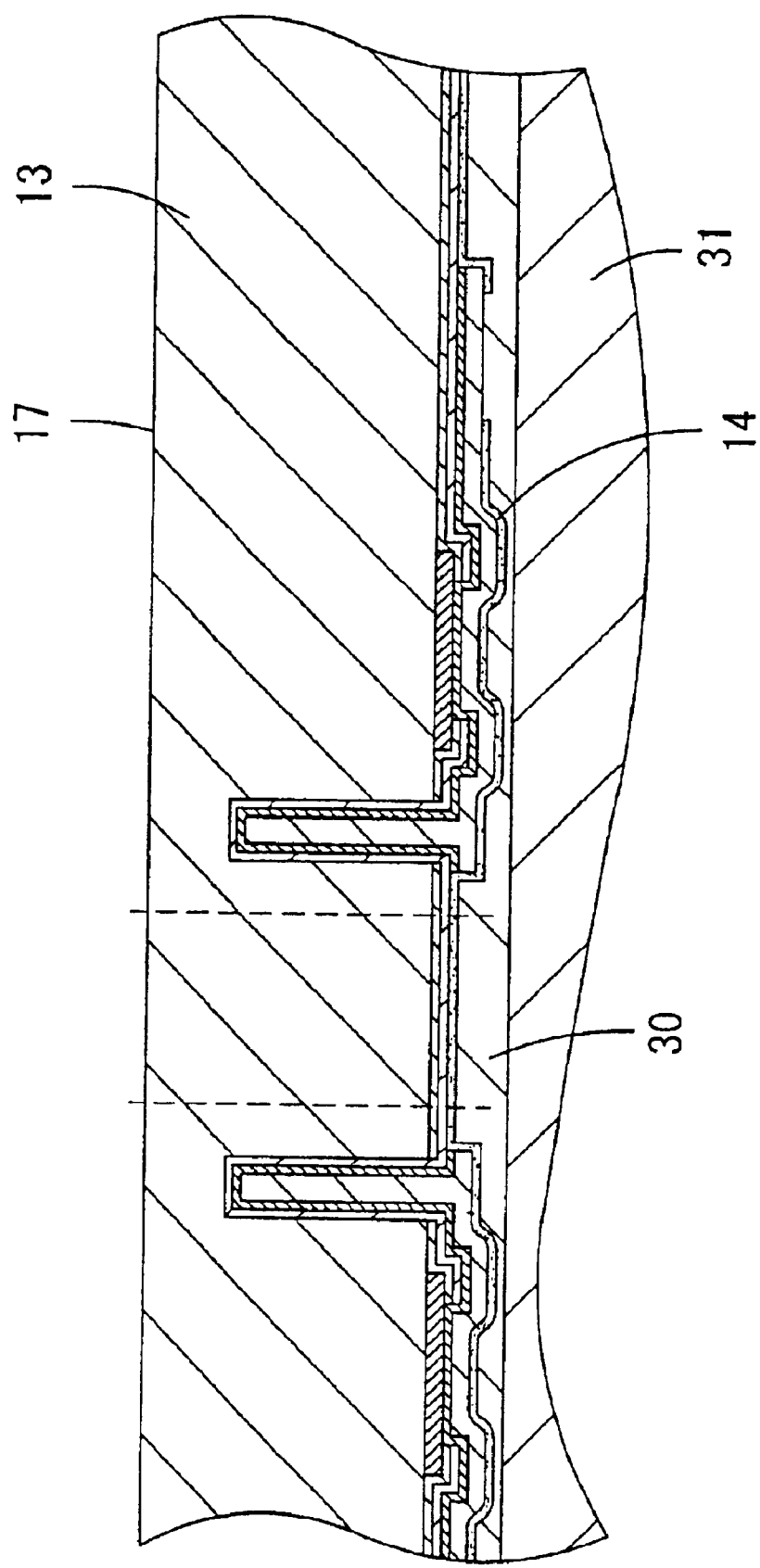
FIG. 6 is a cross section view showing a manufacturing process of the semiconductor chip according to the first embodiment of the present invention.

Next, as shown in FIG. 6, the first plane 14 of the semiconductor substrate is adhered to a support body 31 with adhesive 30 and the semiconductor substrate 13 is processed to the thickness of 50 μm to 200 μm by polishing the semiconductor substrate from the second plane 17 by means of mechanical polishing or CMP (chemical mechanical polishing) method. Here, in the present embodiment, the thickness of the semiconductor substrate after polishing is 100 μm.

Figure 7:
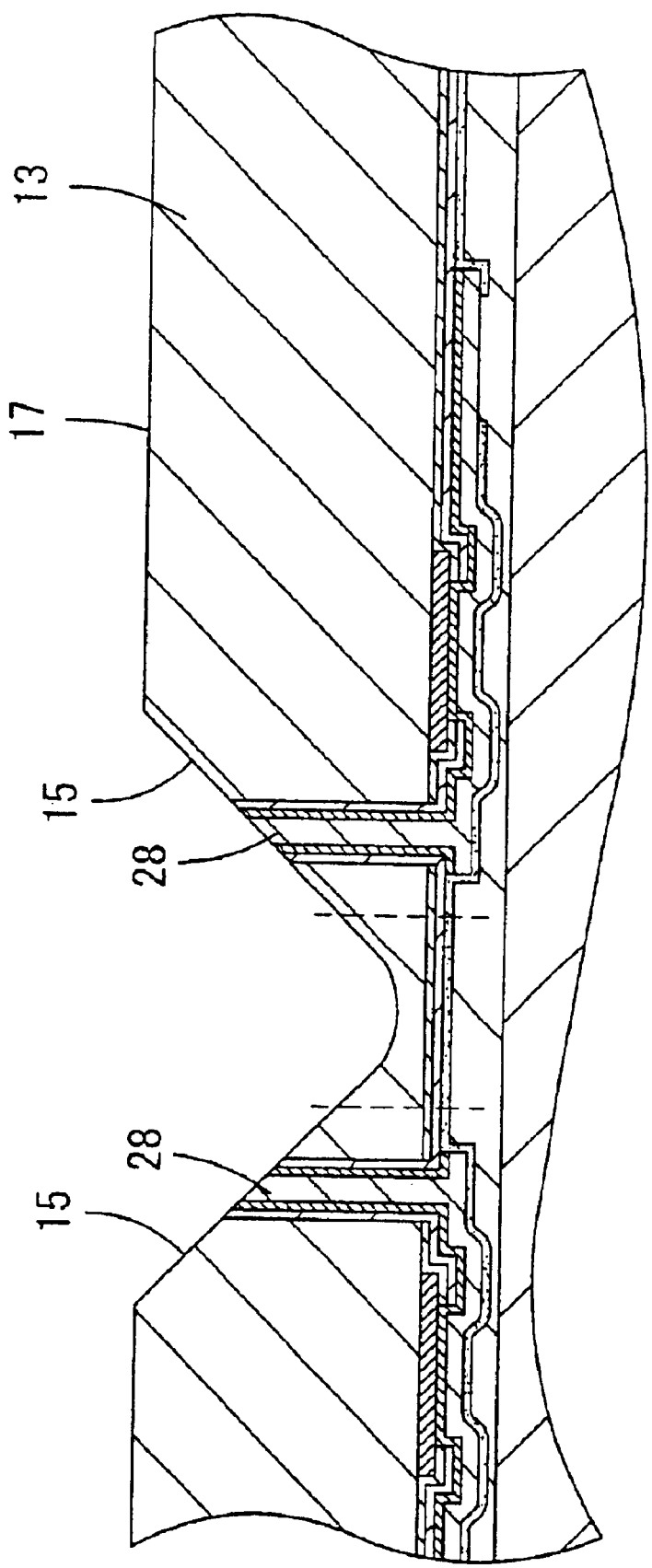
FIG. 7 is a cross section view showing a manufacturing process of the semiconductor chip according to the first embodiment of the present invention.

Next, as shown in FIG. 7, in the second plane 17 of the semiconductor substrate 13, the central part between two dotted lines enclosing a border part between semiconductor chip units is cut by bevel cutting so as to form inclined planes 15 so that an obtuse angle is formed between each of the inclined planes and the second plane 17 of the semiconductor substrate 13 and, at the same time, the first conductive patterns 28 are exposed from the inclined planes 15. Accordingly, as shown in FIG. 2B, it is not necessary for holes 26 created in the semiconductor substrate 13 to pass through the semiconductor substrate 13 so that the amount of time necessary for processing the holes 26 can be shortened. Here, the depth of the processed holes 26 shown in FIG. 2B is determined by the cutting depth and the form of the tip of the cutter blade in bevel cutting.

Here, bevel cutting means a cutting method for forming inclined planes in the semiconductor substrate so that the inner angle formed by the second plane and an inclined plane becomes an acute angle by using a cutting blade of which the thickness is comparatively large and of which the edge part is formed of inclined planes. Here, the thickness of the cutting blade used for the bevel cut is preferably larger than the distance between the adjoining through holes by approximately 100 μm or more. In the present embodiment, the distance between the adjoining through holes is 100 μm while the thickness of the cutting blade used for bevel cutting is 200 μm. Here, though, in the present embodiment, a process method by means of bevel cutting is shown, the substrate may be processed through etching.

Figure 8:
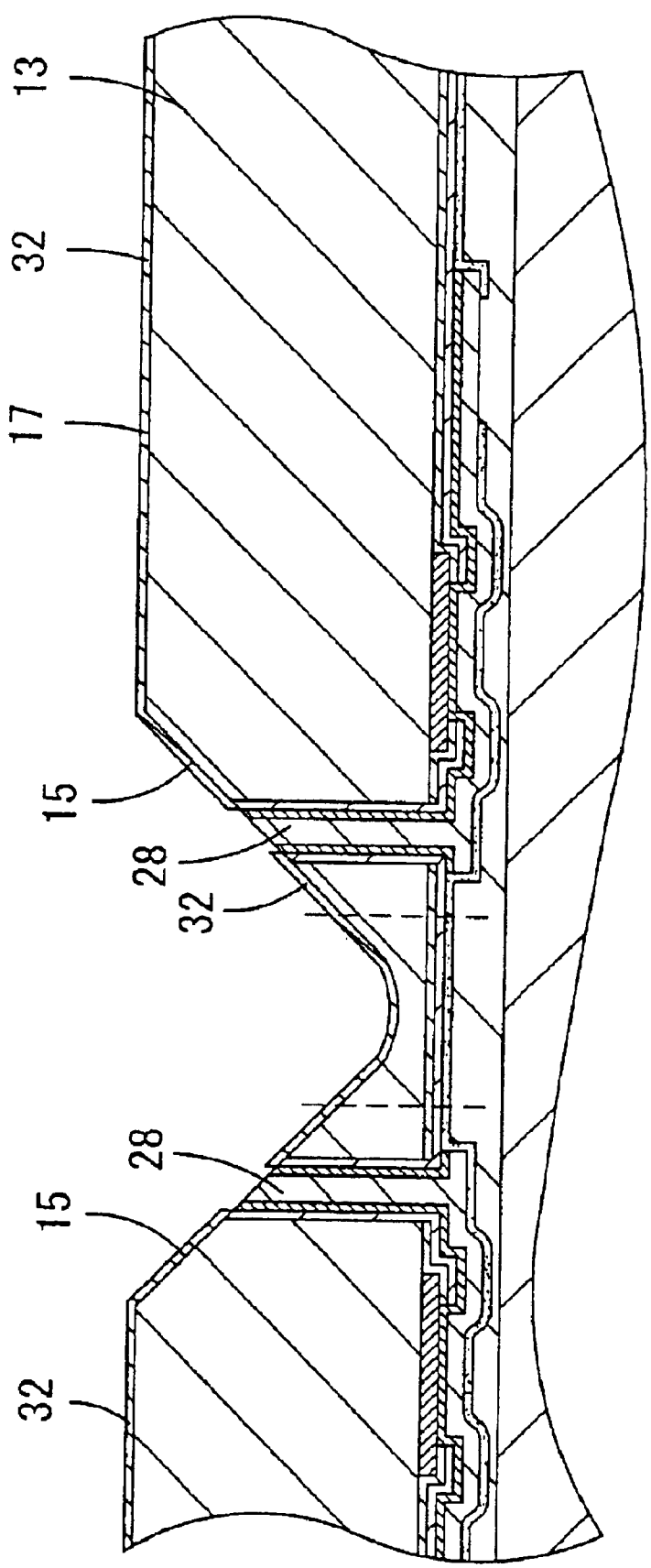
FIG. 8 is a cross section view showing a manufacturing process of the semiconductor chip according to the first embodiment of the present invention.

Next, as shown in FIG. 8, a third insulating layer 32 is formed on the entire surface of the inclined plane 15 and the second plane 17 except for on the parts of the first conductive patterns 28 which are exposed from the inclined surfaces 15 and at this time, after the third insulating layer 32 is formed on the entire surface of the inclined planes 15 and the second plane 17, a mask with openings in the parts where the first conductive patterns 28 are exposed is formed on the third insulating layer 32 and the third insulating layer 32 on the opening parts for the first conductive patterns 28 is etched and, after that, the mask is removed. Here, the third insulating layer 32 is a film formed of silicon dioxide ($SiO_2$), silicon nitride (SiN), oxide nitride film (SiON), polyimide, or the like, by means of a CVD method, a spattering method, an optical CVD method, application, or the like.

In addition, it is preferable to form the third insulating layer 32 of a material of which the etching rate is larger than that of the first insulating layer 20. That is to say, at the time of etching the third insulating layer 32 for creating openings, the first insulating layer 20 is hardly etched even in the case that a mask shift occurs so that the third insulating film 32 can be selectively etched for openings without partially removing the first insulating layer 20.

Figure 9:
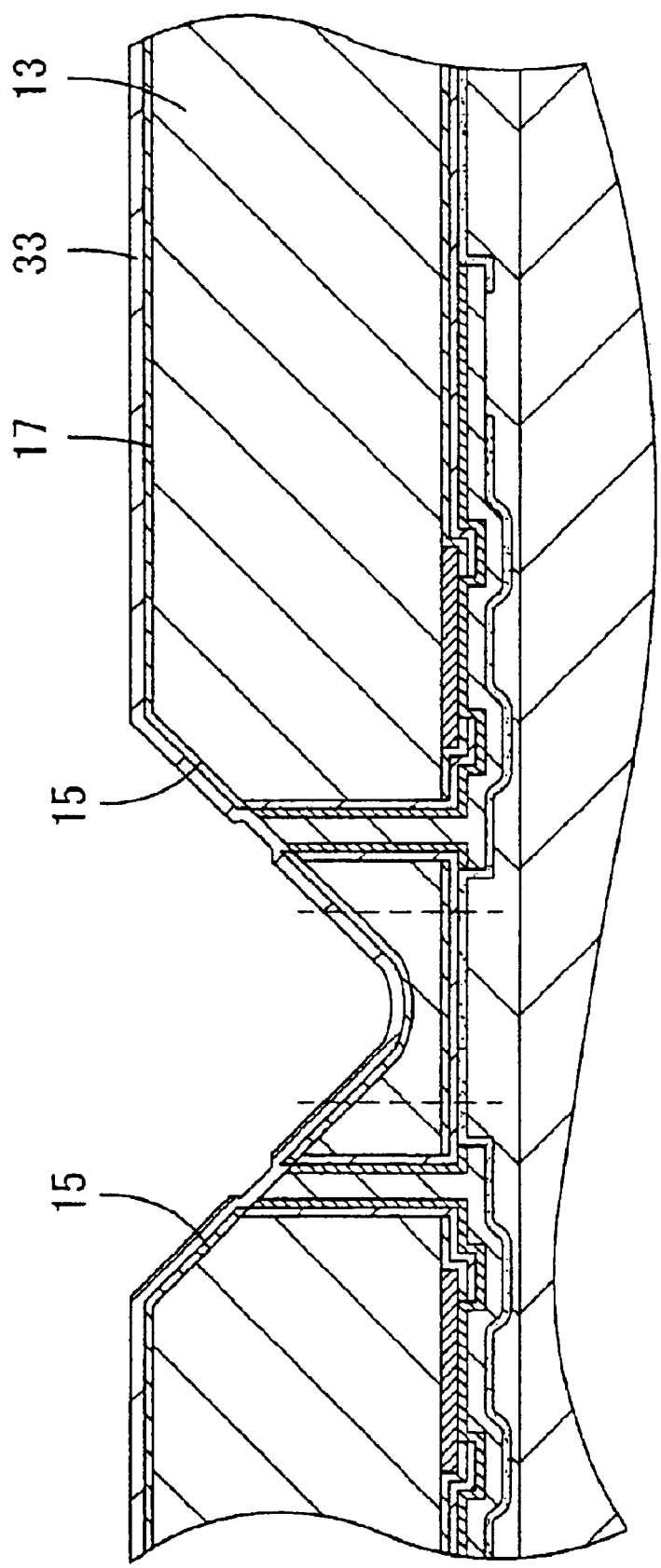
FIG. 9 is a cross section view showing a manufacturing process of the semiconductor chip according to the first embodiment of the present invention.

Next, as shown in FIG. 9, a second layered metal film 33 is formed on the entire surface of the inclined planes 15 and the second plan 17. The second layered metal film 33 has a two layer structure wherein a seed layer is layered on a barrier layer. The barrier layer and the seed layer are formed by means of a spattering method, a CVD method, an electron beam deposition method, or the like. Titanium (Ti), titanium tungsten (Ti/W), chromium (Cr), nickel (Ni), or the like, is used for the barrier layer while copper (Cu), gold (Au), silver (Ag), nickel (Ni), or the like, is used for the seed layer.

Figure 10:
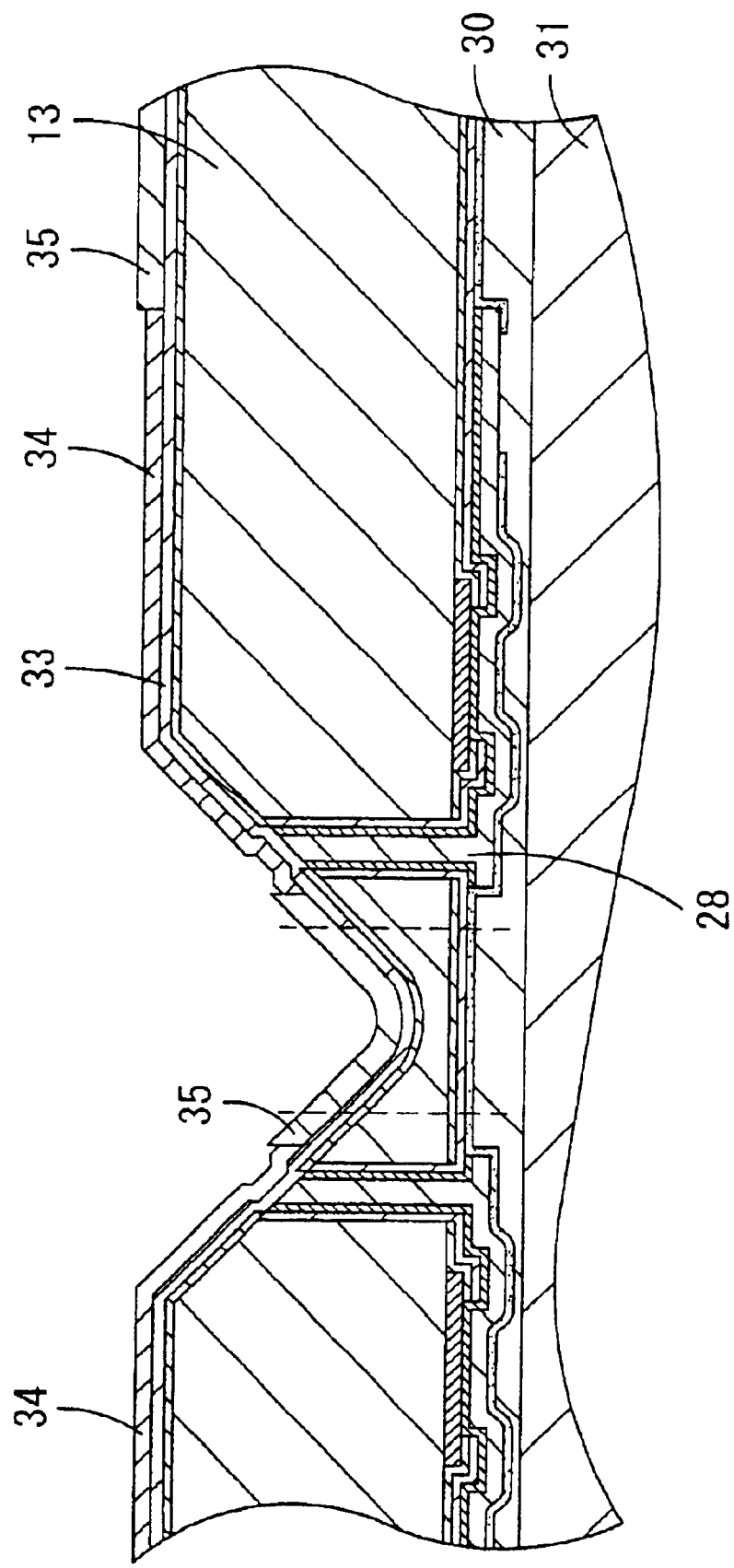
FIG. 10 is a cross section view showing a manufacturing process of the semiconductor chip according to the first embodiment of the present invention.

Next, as shown in FIG. 10, the second conductive patterns 34 in the form of desired wires and electrodes is formed on the inclined planes 15 and the second plane 17 by means of an electrolytic plating method by using the second layered metal film 33 as an electrode and, thereby, the second conductive patterns 34 is electrically connected to the first conductive patterns 28 exposed from the inclined planes 15 via the second layered metal film 33. At this time, in order to form the wires and electrodes of the desired form, a plating resist 35 is formed on the second layered metal film 33 in the parts where it is not necessary to form the second conductive patterns 34 and after the electrolytic plating the plating resist 35 is removed. In addition, as for the material for the second conductive patterns 34, copper (Cu), gold (Au), tungsten (W), molybdenum (Mo), nickel (Ni), titanium (Ti), aluminum (Al), or the like, is used.

Figure 11:
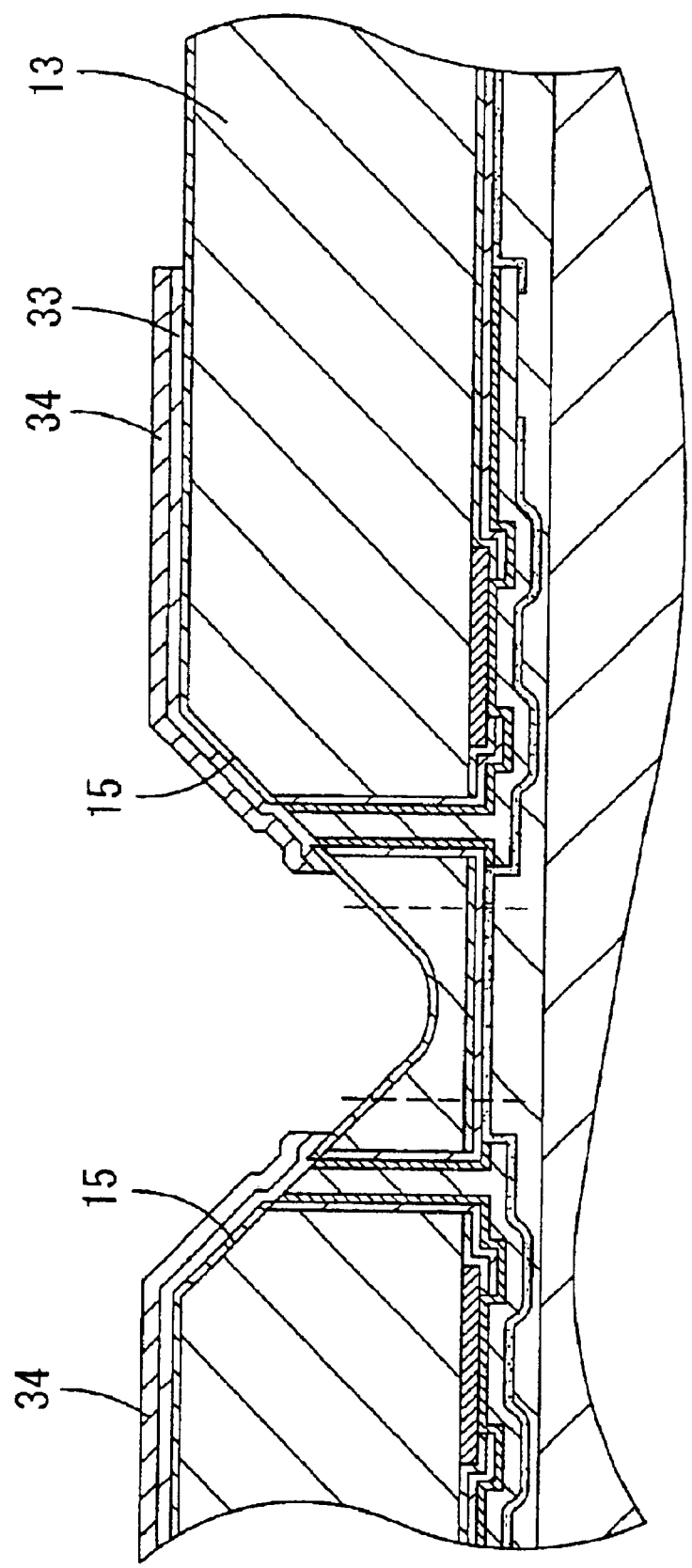
FIG. 11 is a cross section view showing a manufacturing process of the semiconductor chip according to the first embodiment of the present invention.

Next, as shown in FIG. 11, the second layered metal film 33 in the region other than the region where the second conductive patterns 34 is formed is removed through etching by using the second conductive patterns 34 as a mask.

Figure 12:
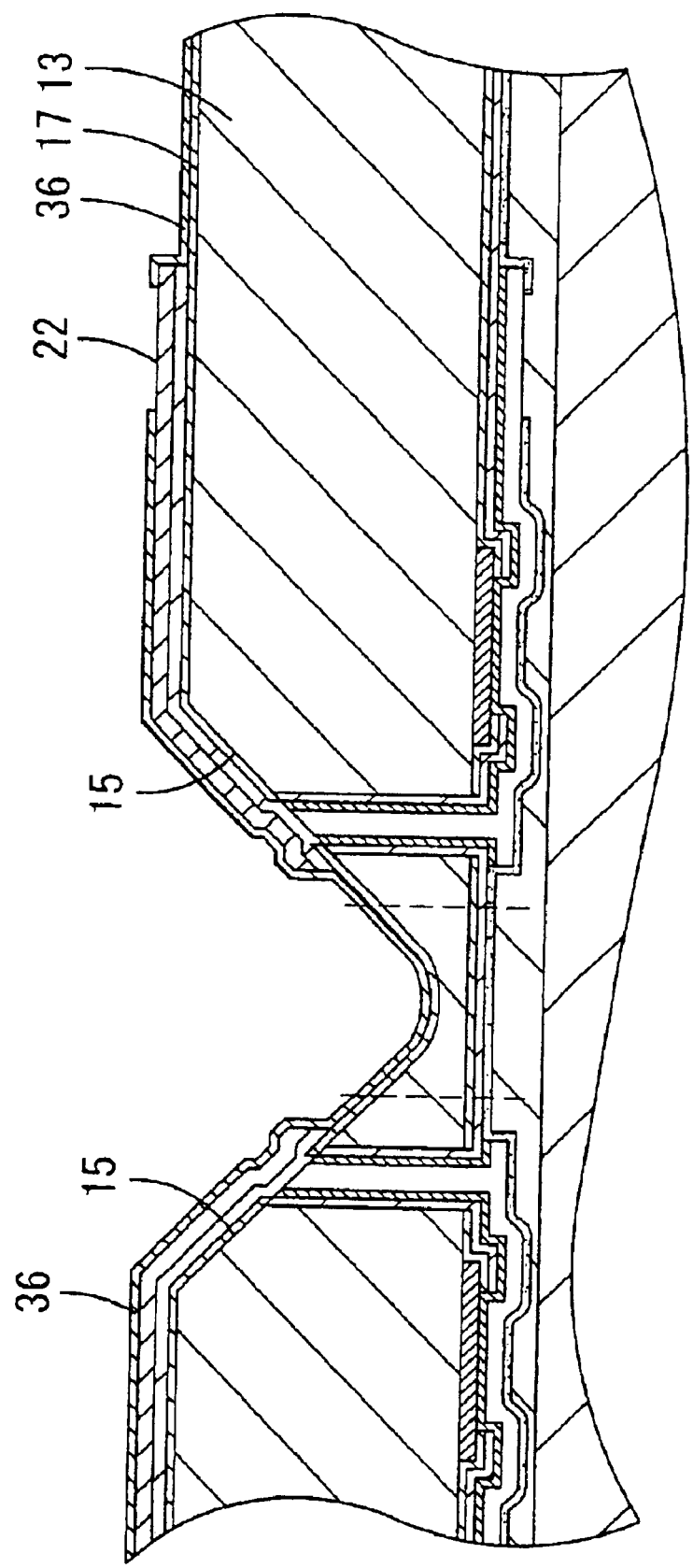
FIG. 12 is a cross section view showing a manufacturing process of the semiconductor chip according to the first embodiment of the present invention.

Next, as shown in FIG. 12, a fourth insulating layer 36 is formed on the entirety of the second plane 17, except for on the opening parts for the second external electrodes 22, and on the inclined planes 15. At this time, after forming the fourth insulating layer 36 on the entire surface of the inclined planes 15 and of the second plane 17, a mask with openings for the second external electrodes 22 parts is formed and the fourth insulating layer 36 is etched away in the opening parts for the second external electrodes 22 and, after that, the mask is removed. Here, the fourth insulating layer 36 is a film formed of silicon dioxide ($SiO_2$), silicon nitride (SiN), oxide nitride film (SiON), polyimide, or the like, by means of a CVD method, a spattering method, an optical CVD method, an application method, or the like.

Figure 13:
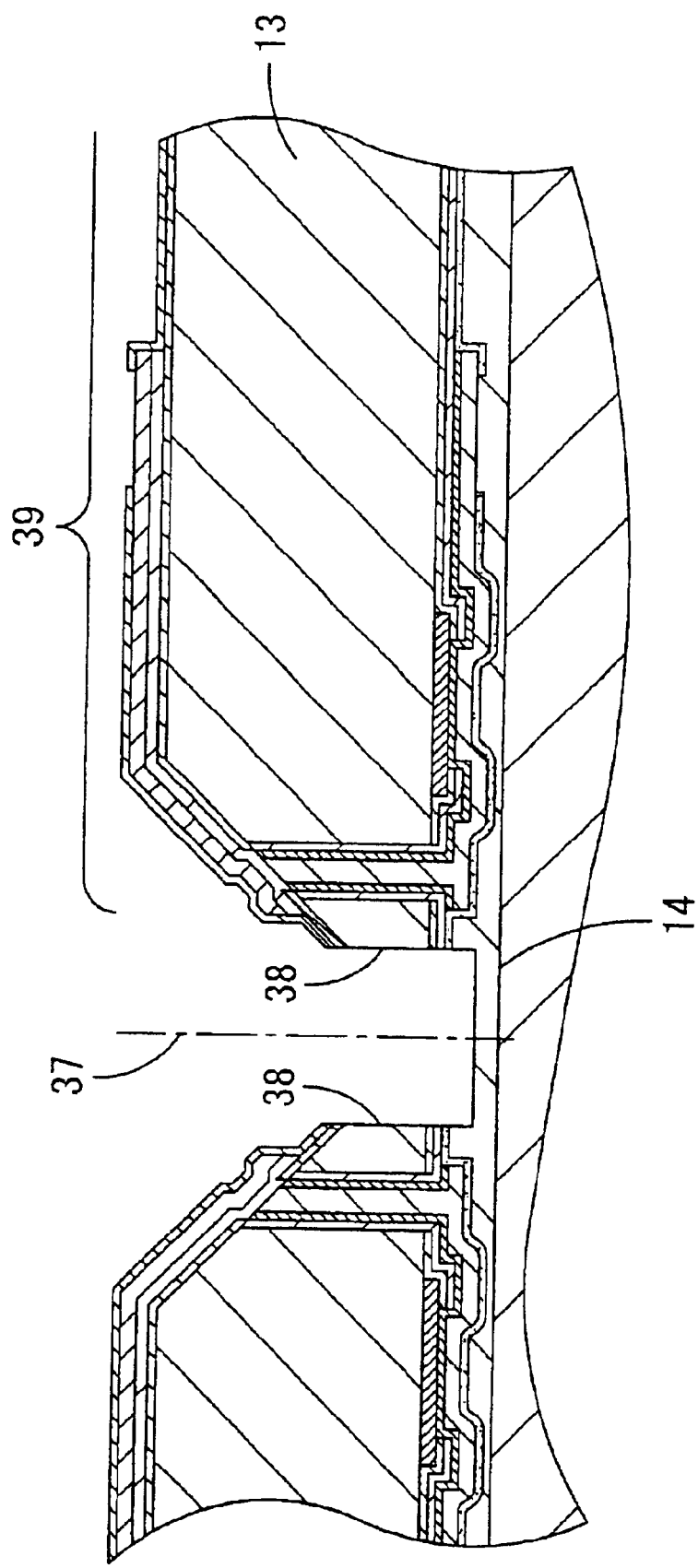
FIG. 13 is a cross section view showing a manufacturing process of the semiconductor chip according to the first embodiment of the present invention.

Next, as shown in FIG. 13, dicing is carried out along the scribe line which is a border line between semiconductor chip units so as to form side surfaces 38 wherein the inner angle formed by the first plane 14 and a side surface 38 is a right angle. After that, the adhesive 30 and the support body 31 are removed and the semiconductor chip 39 is divided into pieces.

By undergoing such a manufacturing process sequence for a semiconductor chip, the first external electrodes are formed on the first plane of the semiconductor chip in the exposed condition from the second insulating layer and the second external electrodes are formed on the second plane in the exposed condition from the fourth insulating layer, wherein the surface electrodes, the first external electrodes and the second external electrodes are electrically connected to each other.

Here, the formation positions of the first external electrodes and second external electrodes are not particularly limited but, rather, may be positions where the external electrodes of adjoining semiconductor chips, respectively, correspond to each other in the case that a plurality of semiconductor chips are layered.

Figure 14:
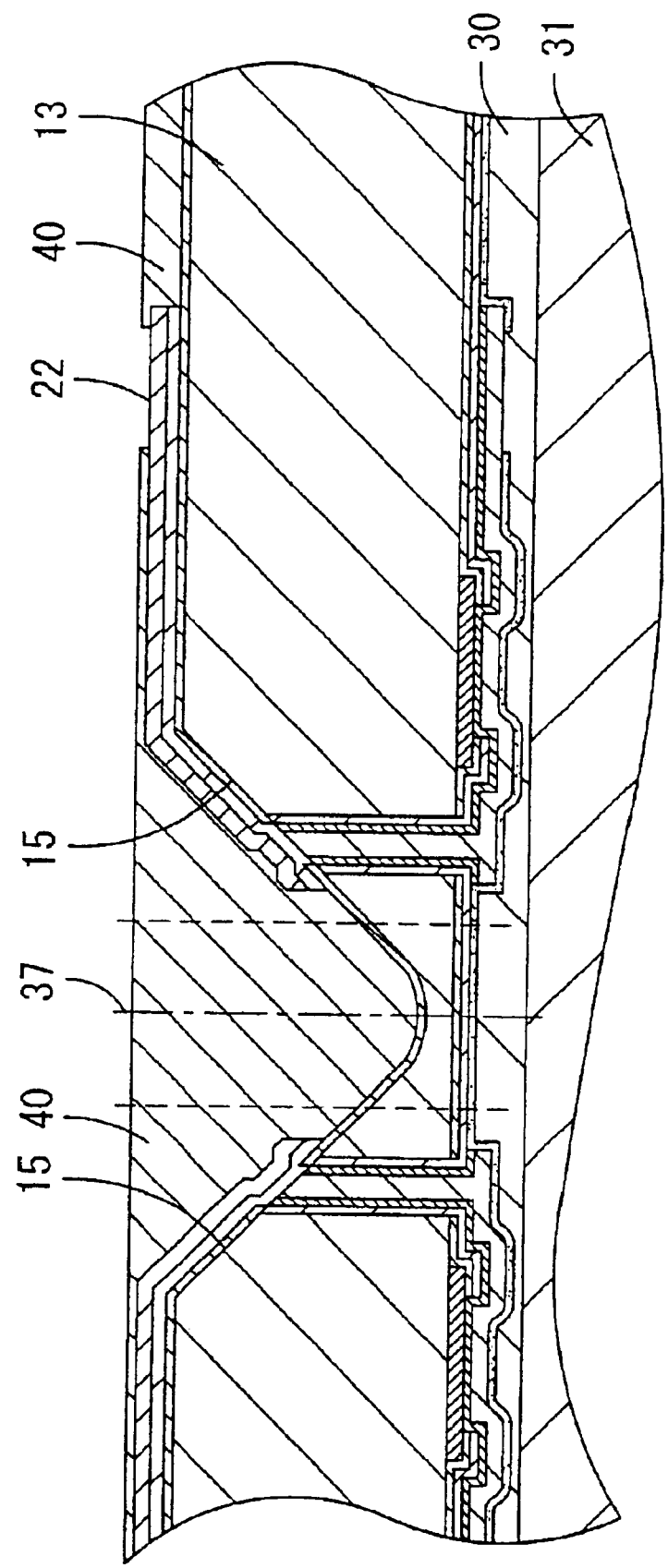
FIG. 14 is a cross section view showing a manufacturing process of the semiconductor chip according to the first embodiment of the present invention.
Figure 15:
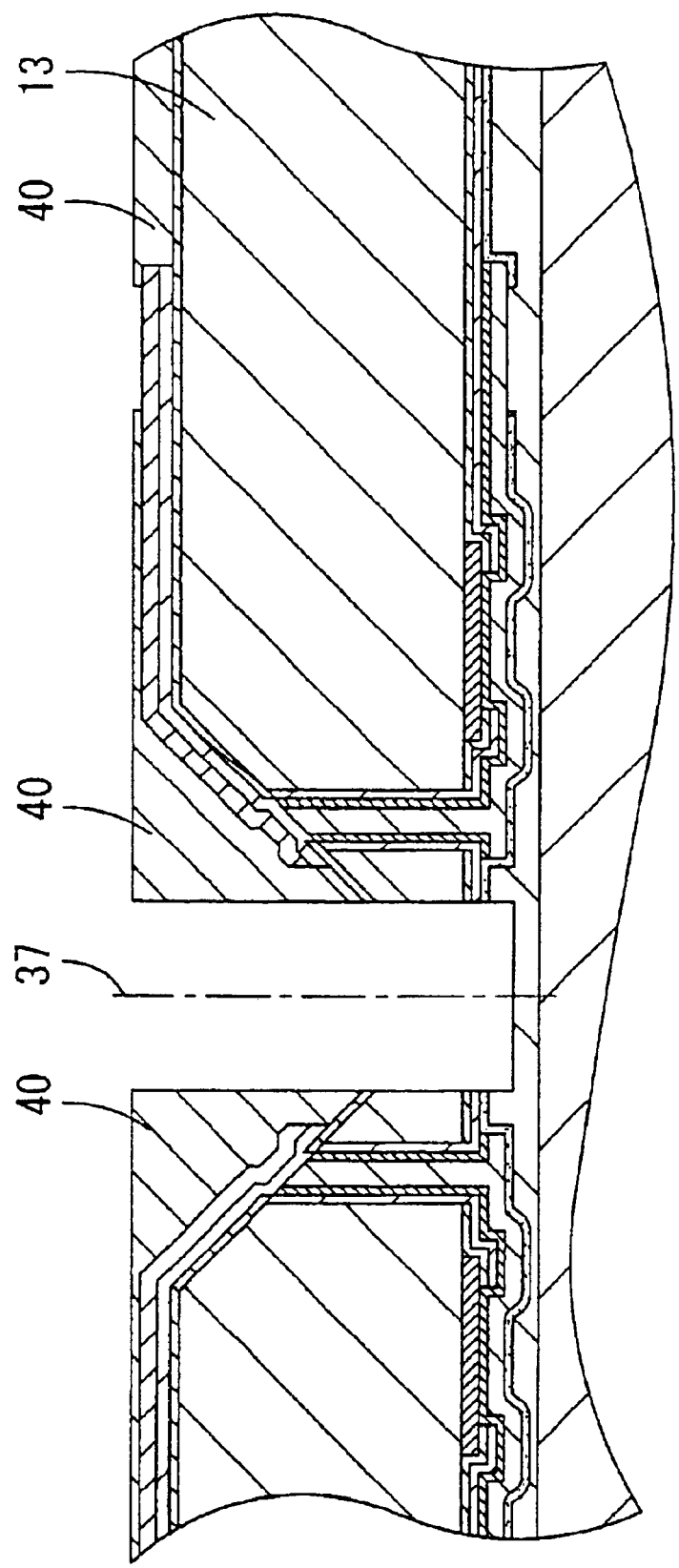
FIG. 15 is a cross section view showing a manufacturing process of the semiconductor chip according to the first embodiment of the present invention.

FIGS. 14 to 16 are cross section views of the steps for supplying a resin to the inclined plates which are cured after the steps shown in FIGS. 2 to 11. The purpose of the steps shown in FIGS. 14 to 16 is to reinforce the inclined planes.

As shown in FIG. 14, after the steps shown in FIG. 11 or FIG. 12, a liquid resin is applied to the part which is removed through bevel cutting until the top surface reaches the level of the second plane and, thereby, an insulating resin layer 40 is formed on the entire second plane and on the inclined planes 15, except for on the parts with openings for the second external electrodes 22.

Here, the liquid resin is preferably polyimide, or the like, which can alleviate stress.

Next, as shown in FIG. 15, dicing is carried out in the part of the scribe line 37 from the side of the second plane so as to form side surfaces perpendicular to the second plane.

Next, as shown in FIG. 16, the adhesive 30 and the support body 31 are removed and the semiconductor chip 39 is divided into pieces.

Here, the form of the through holes or the holes may be circular or quadrangular and, in the case where they are circular, the diameter is 10 μm to 20 μm and, in the case where they are quadrangular, the length of one side is 10 μm to 20 μm, which is 20 μm in the present embodiment. Here, in the case that the form of the holes is quadrangular, corners of the quadrangle do not form right angles but, rather, they are in a rounded form. In addition, due to the technological innovation of the RIE method, it is possible to process through holes or holes of which the diameter or the length of one is smaller than 10 μm.

In addition, the thickness of the first insulating layer, the second insulating layer, the third insulating layer and the fourth insulating layer is 1 μm to 30 μm and, in the present embodiment it is 1 μm in the case of silicon dioxide ($SiO_2$), silicon nitride (SiN) and oxide nitride film (SiON), while it is 7 μm in the case of polyimide. In addition, the second insulating layer and the fourth insulating layer may have main material of solder resist and the thickness in this case is 30 μm in the present embodiment.

In addition, the thickness of the first conductive patterns 28 and the second conductive patterns 34 is preferably 5 μm to 15 μm, which is 10 μm in the present embodiment.

In the present embodiment, after applying a liquid resin to the inclined planes, a part of the cured liquid resin is diced so as to prevent the occurrence of undesirable chipping at the time of cutting and corner parts of the semiconductor substrate, formed of an insulating resin layer which is perpendicular to the second plane and of which the thickness is comparatively large, are formed and can be divided into pieces of semiconductor chip units and, therefore, the sides of the semiconductor chip are reinforced and the second conductive patterns on the inclined planes can be protected.

As described above, in the present embodiment, in addition to the formation steps of a variety of insulating layers, the step of forming holes which start from the first plane of the semiconductor substrate and which do not pass completely through the substrate, the step of forming inclined planes from the second plane and making the holes pass through the substrate and the step of forming a conductive pattern in the holes and on the inclined surfaces are provided so that the structure where electrodes formed on both sides of the semiconductor substrate are electrically connected to each other can be implemented.

Furthermore, after forming the first conductive patterns in the holes created in the semiconductor substrate, inclined planes which reach the holes are formed so that the inner angle formed by the inclined planes and the second plane is an obtuse angle and, thereby, the first conductive patterns are exposed from the second plane and, therefore, it is not necessary to deeply form the holes or to polish the semiconductor substrate in order to make it thinner so that shortening of the processing time and reduction of processing cost can be achieved. In addition, freedom of choice of the thickness of the semiconductor chip becomes wide and, since the thickness of the semiconductor substrate is comparatively great, conveyance of the semiconductor substrate becomes easier. In addition, because of the formation of the inclined planes wherein the inner angle formed by the inclined planes and the second plane is made to be an obtuse angle by means of bevel cutting, the first conductive patterns are exposed from the second plane and, thereby, the number of manufacturing steps and the manufacturing cost can be reduced to a great extent in comparison with the processing method wherein holes are made to first pass through the substrate.

Here, in order to reduce the number of manufacturing steps, the formation of the first external electrodes and the formation of the above first conductive patterns or the formation of the second external electrodes and the formation of the above second conductive patterns may be carried out simultaneously.

In addition, by forming a layered metal film made of a barrier layer and a seed layer beneath the first conductive patterns and second conductive patterns, component elements of the first conductive patterns and second conductive patterns can be prevented from diffusing into the first external electrodes and the semiconductor substrate by the barrier layer and the characteristics of the semiconductor chip can be prevented from deteriorating and the first conductive patterns and the second conductive patterns can be formed by electrolytic plating of the seed layer.

As described above, according to a manufacturing process for a semiconductor chip of the present embodiment, surface electrodes are formed on the first plane of the semiconductor substrate, conductive patterns are formed on the inner walls of the through holes so as to fill in the through holes created in the semiconductor substrate and the first external electrodes formed on the first plane and the second external electrodes and surface electrodes formed on the second plane are electrically connected through the conductive pattern and, in addition, a semiconductor chip can be manufactured wherein through holes are created in the inclined planes wherein the inner angle formed by the inclined planes and the second plane is an obtuse angle.

Electrodes on both sides of a semiconductor chip manufactured by means of a manufacturing process for a semiconductor chip of the present invention are electrically connected through the conductive pattern which goes through the side of the semiconductor substrate and, therefore, it becomes possible to electrically connect a plurality of semiconductor chips by layering them on each other and the wire length can be shortened through the formation of the inclined planes and a resin can be supplied to the inclined planes and, thereby, prevention of shock from the outside to the conductive pattern can be achieved and the semiconductor device wherein semiconductor chips are layered can be made thinner and smaller and the operational speed thereof can be increased.

Next, the second embodiment of the present invention is described.

Figure 17:
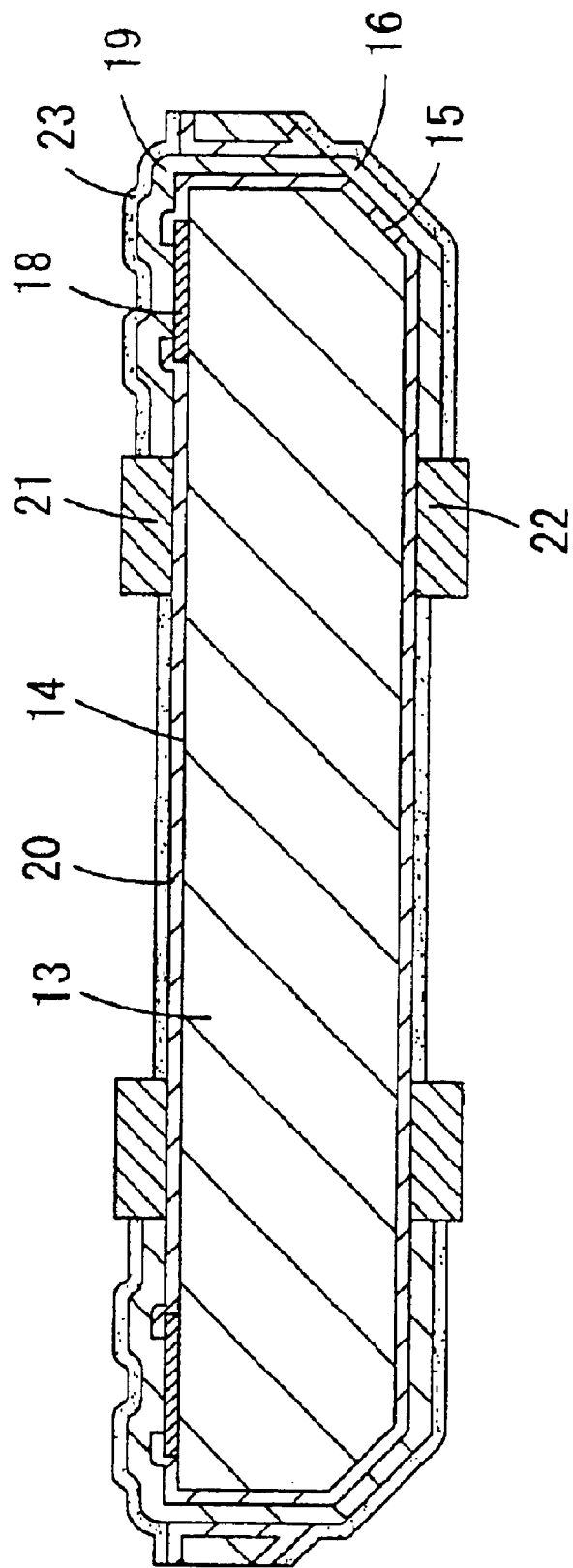
FIG. 17 is a cross section view showing a semiconductor chip according to the second embodiment of the present invention.

FIG. 17 is a cross section view showing a semiconductor chip of the present embodiment.

Here, the same symbols are attached to the same component elements as in the first embodiment and descriptions are omitted for contents in common.

As shown in FIG. 17, the point in which a semiconductor chip of the present embodiment differs from a semiconductor chip of the first embodiment is wherein the thickness of the first external electrodes and the thickness of the second external electrodes.

That is to say, in a semiconductor chip of the present embodiment, the surfaces of the first external electrodes and the surfaces of the second external electrodes protrude from the surface of the second insulating layer formed on the surface of the semiconductor substrate. Concretely, by securing the height of the electrodes themselves by means of plating, or the like, the surfaces of the first external electrodes and the surfaces of the second external electrodes are made to protrude from the surface of the second insulating layer.

Therefore, in the case that a plurality of semiconductor chips of the present embodiment are layered on each other, electrical connections of mutual semiconductor chips can be secured without the intervention of connection members.

Next, a process for a semiconductor chip of the present embodiment is described.

A process for a semiconductor chip of the present invention is to add the steps of the formation of respective external electrodes after the completion of a semiconductor chip of the first embodiment. That is to say, after the steps shown in FIGS. 10 to 12, or FIGS. 14 and 15 shown in the first embodiment, the steps for securing the height of the external electrodes are added.

That is to say, as shown in FIG. 17, by securing the height of the electrodes themselves by means of plating, or the like, the surfaces of the first external electrodes 21 and the surfaces of the second external electrodes 22 are made to protrude from the surface of the second insulating layer 23. Thereby, in the case that a plurality of semiconductor chips are layered so as to face each other, electrical connections of mutual semiconductor chips can be secured without using connection members and, therefore, it becomes possible to achieve a thinner semiconductor device and a semiconductor device with a higher operational speed.

Next, the third embodiment of the present invention is described.

Figure 18:
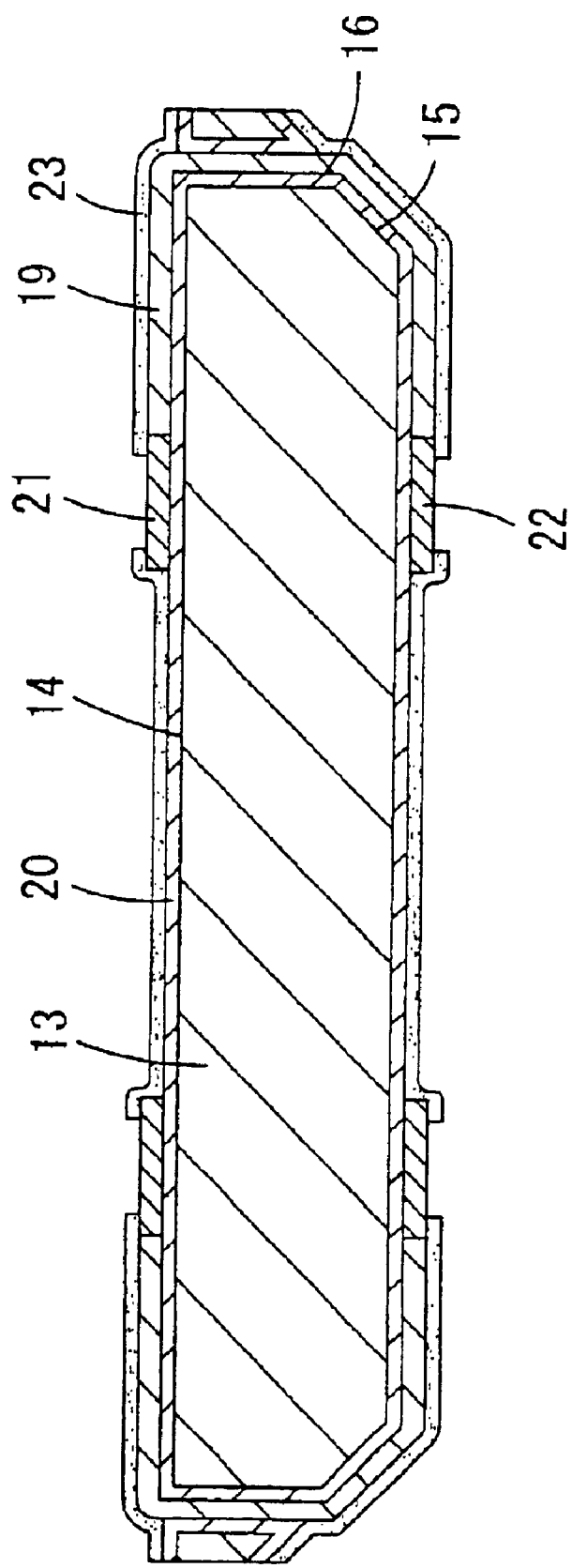
FIG. 18 is a cross section view showing a semiconductor chip according to the third embodiment of the present invention.

FIG. 18 is a cross section view of a semiconductor chip of the present embodiment.

Here, the same symbols are attached to the same component elements as in the first embodiment and second embodiment and descriptions are omitted for contents in common.

As shown in FIG. 18, a semiconductor chip of the present embodiment has at least one conductive pattern 19 which is not electrically connected to the surface electrodes formed on the surface of the semiconductor substrate and, therefore, the conductive pattern 19 electrically connects the first external electrodes 21 formed on the first plane 14 and the second external electrodes 22 formed on the second plane 17 in semiconductor chip H without connection to the integrated circuit of semiconductor chip H.

Accordingly, the semiconductor chip of the present embodiment has a structure wherein external electrodes formed on both sides are electrically connected and a structure wherein the conductive pattern is not electrically connected to the integrated circuit.

Next, a process for a semiconductor chip of the present embodiment is described.

A process for a semiconductor chip of the present embodiment is characterized in that a conductive pattern is not formed on, at least, one arbitrary surface electrode from among the surface electrodes formed on the semiconductor substrate in comparison with the process for a semiconductor chip of the first embodiment. That is to say, though in the process for a semiconductor chip of the first embodiment, the conductive patterns for electrically connecting the external electrodes on both sides of the semiconductor chip are electrically connected to the surface electrodes, in the present embodiment by forming a conductive pattern for electrically connecting the external electrodes on both sides of the semiconductor chip on a part where no surface electrodes exist, a conductive pattern is formed which is not electrically connected to the integrated circuit of the semiconductor chip. Accordingly, by layering a semiconductor chip wherein the electrical connection to the integrated circuit thereof is not necessary between two semiconductor chips wherein electrical connection is necessary, a semiconductor device wherein the electrical connection by passes the integrated circuit of the semiconductor chip between the two semiconductor chips can be implemented so that the freedom of the electrical connections between semiconductor chips is increased.

As described above, though any of the three embodiments of a semiconductor chip has a structure wherein electrodes are formed on both sides of the semiconductor substrate, they are different in the point that the structures of the electrodes and electrodes to which electrical connections are made are selected.

That is to say, there is a mode wherein surface electrodes formed on the surface of the semiconductor substrate and the external electrodes on both sides of the semiconductor substrate are electrically connected through conductive patterns, a mode wherein the surface of the above external electrodes protrude from the insulating layer by securing the height thereof by means of plating, or the like, and a mode wherein external electrodes are electrically connected to each other through a conductive pattern which is not electrically connected to a surface electrode on the semiconductor substrate, a mode wherein a conductive pattern which is not connected to at least one external electrode is formed so that in the case that a plurality of the above semiconductor chips are layered on each other, the external electrodes on the surfaces of the semiconductor chips facing each other can be electrically connected and it becomes possible to select the existence of an electrical connection to an arbitrary semiconductor chip.

Next, a semiconductor device of the present invention is described.

Respective embodiments of the semiconductor device described below are formed of the above respective embodiments of a semiconductor chip, which are described in the fourth to sixth embodiments.

The fourth embodiment of the present invention is described.

Figure 19:
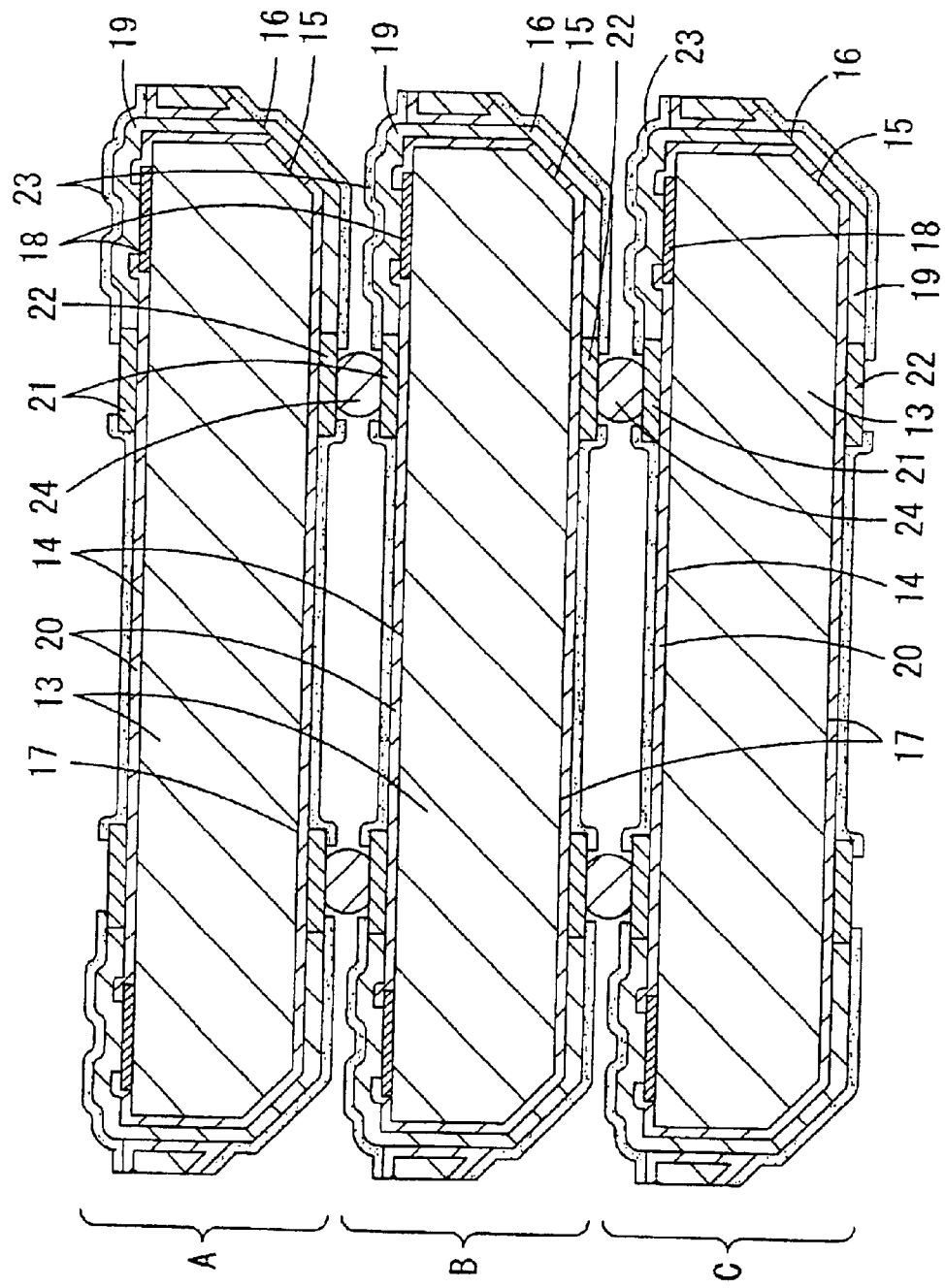
FIG. 19 is a cross section view showing a semiconductor device according to the fourth embodiment of the present invention.

FIG. 19 is a cross section view showing a semiconductor device of the present embodiment.

As shown in FIG. 19, semiconductor chip A, semiconductor chip B and semiconductor chip C, which are shown as the above described semiconductor chip of the first embodiment, are layered. In respective semiconductor chips, external electrodes formed on both sides are electrically connected via connection members.

That is to say, the surface electrodes 18 of semiconductor chip C are electrically connected to the second external electrodes 22 of semiconductor chip B via connection members 24 and the surface electrodes 18 of semiconductor chip B are electrically connected to the second external electrodes 22 of semiconductor chip A via connection members 24 and, therefore, semiconductor chip A, semiconductor chip B and semiconductor chip C are electrically connected to each other.

Because of such a structure, in the case that the respective semiconductor chips, semiconductor chip A, semiconductor chip B and semiconductor chip C, in the present embodiment are layered by electrically connecting the electrodes formed both sides of the respective semiconductor substrates by means of conductive patterns that go through the through holes of the respective semiconductor substrates, mutual surfaces of the semiconductor chips face each other in the structure, which differs from that of a conventional semiconductor device wherein a plurality of semiconductor chips are arranged in a plane and, thus, the problem wherein the mounting area of the semiconductor device increases as the number of layered semiconductor chips increase is solved.

In addition, the electrodes arranged on both sides of the respective semiconductor chips are electrically connected to each other by making them correspond and, thus, this is different from a conventional mode wherein metal wires make an electrical connection among respective semiconductor chips layered on each other, and it is not necessary to expose electrodes in the lower layer of the semiconductor chip which corresponds to the semiconductor chip in the upper layer located in a position away from the mounting board and it is possible to not only layer semiconductor chips of the same size but also to layer semiconductor chips of different sizes in a desired order so that no problem arises wherein the wire length among respective semiconductor chips becomes long.

Furthermore, in the conventional COC (chip on chip) structure wherein the surfaces of the respective semiconductor chips are connected by facing them towards each other, since the element formation surfaces where electrodes are formed on only one plane of the semiconductor chips and the number of layers of semiconductor chips is limited to two, in the structure according to the present embodiment electrodes can be formed on both sides of the semiconductor chips and it becomes possible to electrically connect electrodes on both sides of the respective chips so that it becomes possible to increase the number of layers of the semiconductor chips.

In addition, in the present embodiment, since the respective semiconductor chips are layered by making the electrodes of the respective semiconductor chips correspond to each other, the thickness of the semiconductor device wherein a plurality of semiconductor chips are layered can be made small without increasing the thickness of the entire semiconductor device as in a conventional semiconductor device wherein a wiring board is used for the layered structure and, as for the mounting area, it becomes the same size as the layered semiconductor chips.

As described above, it becomes possible to layer a plurality of semiconductor chips in the semiconductor device wherein the semiconductor chips are layered according to the present embodiment and the size and the arrangement of the layered semiconductor chips are not limited while the wire length among respective semiconductor chips does not become long so that the layered thickness becomes small and, therefore, it becomes possible to implement a semiconductor device for achieving miniaturization without increasing the mounting area, higher density and higher operational speed.

Here, though the case wherein the number of layers of the semiconductor chips is three is described in the present embodiment, it becomes possible to layer two or four, or more, semiconductor chips.

Next, the fifth embodiment of the present invention is described.

Figure 20:
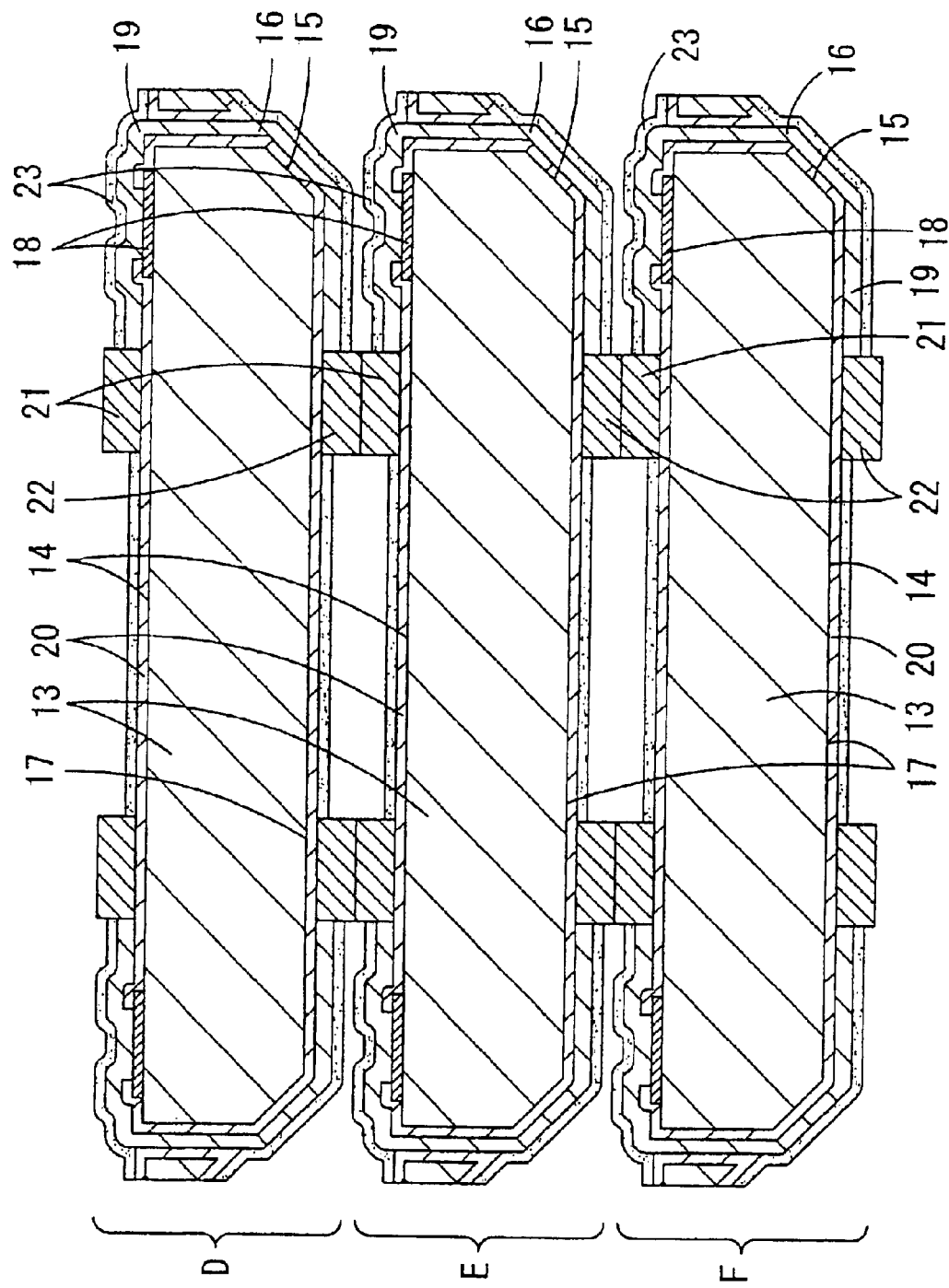
FIG. 20 is a cross section view showing a semiconductor device according to the fifth embodiment of the present invention.

FIG. 20 is a cross section view showing a semiconductor device wherein semiconductor chips are layered by directly connecting electrodes of the respective semiconductor chips without using connection members.

Here, the same symbols as in FIG. 1 are attached to the parts corresponding to the semiconductor device of FIG. 1 and the descriptions are omitted for contents in common in FIG. 19.

As shown in FIG. 20, the structures of electrodes, insulating layers and conductive patterns in the respective semiconductor chips are the same and the electrical connection method for mutual semiconductor chips is a point that differs from the fourth embodiment.

That is to say, the first external electrodes 21 of semiconductor chip F are directly connected to the second external electrodes 22 of semiconductor chip E while the first external electrodes 21 of semiconductor chip E are directly connected to the external electrodes 22 of semiconductor chip D and, therefore, the three semiconductor chips, semiconductor chip D, semiconductor chip E and semiconductor chip F are electrically connected to each other.

Here, it is necessary for the first external electrodes 21 and the second external electrodes 22 of the respective semiconductor chips to protrude from the second insulating layers 23 and, therefore, it is desirable to secure the height of the elements themselves by means of, for example, plating.

In this manner, by directly connecting the external electrodes of the semiconductor substrates without utilizing connection members in the present embodiment, the thickness of the semiconductor device after layering the semiconductor chips can be made smaller than the case of the fourth embodiment and, at the same time, the wire length can be made short and, therefore, the thickness of the semiconductor device formed by layering semiconductor chips can be made small and a semiconductor device that is miniaturized and has higher operational speed can be achieved.

Next, the sixth embodiment is described.

Figure 21:
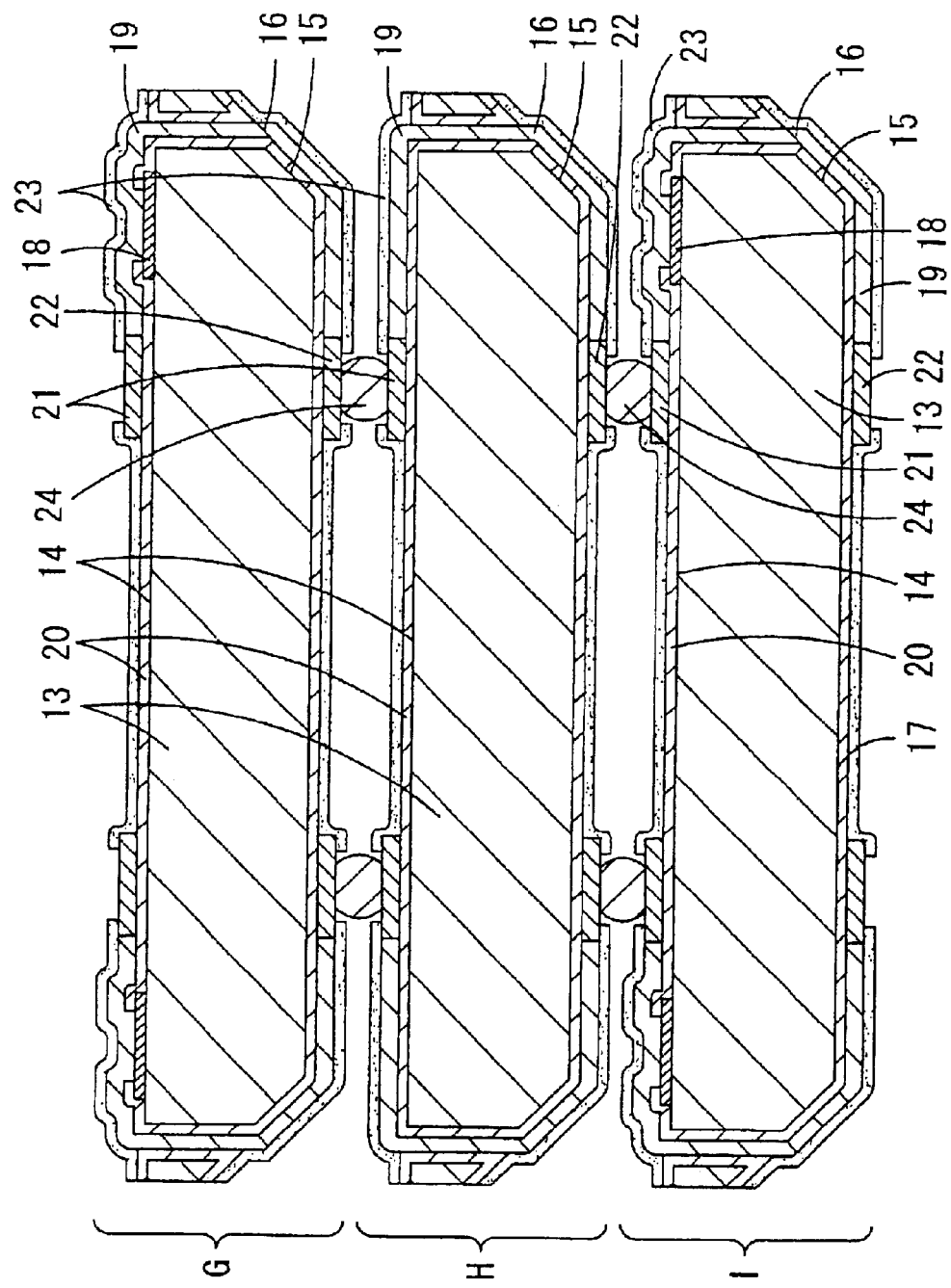
FIG. 21 is a cross section view showing a semiconductor device according to the sixth embodiment of the present invention.

FIG. 21 is a cross section view showing a semiconductor device of the present embodiment.

The same symbols as in FIG. 1 are attached to the parts corresponding those in FIG. 19 and descriptions are omitted for the contents in common.

As shown in FIG. 21, semiconductor chip H is different from semiconductor chip G and semiconductor chip I in structure wherein the first electrodes or the third electrodes connected to the conductive patterns are not formed so as to show the characteristic structure of the semiconductor chips of the present embodiment.

That is to say, in semiconductor chips G and I, the surface electrodes 18 and the first external electrodes 21 formed on the first plane as well as the second external electrodes 22 formed on the second plane are electrically connected to each other through the conductive patterns 19 and the first external electrodes 21 of semiconductor chip I electrically connected to the second external electrodes 22 of semiconductor chip H and the second external electrodes 22 of semiconductor chip G electrically connected to the first external electrodes 21 of semiconductor chip H are electrically connected but they are not connected to the integrated circuit of semiconductor chip H and, therefore, they can bypass the integrated circuit of semiconductor chip H. Thereby, the freedom of the electrical connections between semiconductor chips is increased through layering semiconductor chips by placing a semiconductor chip, where an electrical connection to the integrated circuit is not necessary, between two semiconductor chips which require an electrical connection.

Though in the above three embodiments of a semiconductor device are described, in all of the embodiments a semiconductor device is formed by layering semiconductor chips and in the semiconductor device a plurality of semiconductor chips which have external electrodes electrically connected to the surface electrodes formed on the semiconductor substrate via conductive patterns are layered so as to have a mode wherein external connection electrodes are electrically connected to each other via connection members, a mode wherein external electrodes of the above semiconductor chips are directly electrically connected and a mode wherein at least one semiconductor chip where external electrodes on both sides are electrically connected through a conductive pattern which is not connected to the surface electrodes of the semiconductor substrate is used.

Here, in the fourth to the sixth embodiments, a layered metal film may be formed between the conductive patterns and the first resin layer and between the conductive patterns and the surface electrodes as a base of the conductive patterns. The layered metal film is formed of a barrier layer and a seed layer wherein the barrier layer can achieve the prevention of the diffusion of component elements of the conductive patterns and the prevention of the deterioration of the characteristics of the semiconductor chips and wherein plating of the conductive patterns by means of an electrolytic plating method becomes possible by providing the seed layer. In addition, as for the respective thicknesses of the barrier layer and the seed layer forming the layered metal film, the thickness of the barrier layer is 0.05 $\mu$m to 0.35 $\mu$m and the thickness of the seed layer is 0.2 $\mu$m 0.8 $\mu$m and in the present embodiment the thickness of the barrier layer is 0.2 $\mu$m while the thickness of the seed layer is 0.5 $\mu$m.

In this manner, because of the semiconductor device wherein semiconductor chips where the external electrodes are formed on both sides thereof are layered, the mounting area of the semiconductor chips does not increase and miniaturization, higher density and higher operational speed of the semiconductor device wherein a wiring board and metal wires are not necessary become possible.

As described above, due to the semiconductor chips of the present invention, the electrodes formed on both sides of the semiconductor chips are electrically connected via conductive patterns and, therefore, it becomes possible to layer a plurality of semiconductor chips without using metal wires and through the formation of inclined planes wherein the inner angles formed by the inclined planes and the second plane becomes an obtuse angle, the wire length is made short and the protection of the semiconductor chip sides through the supply of a resin can be implemented.

In addition, in the semiconductor device wherein the semiconductor chips are layered according to the present invention, since a plurality of semiconductor chips are electrically connected on the surfaces facing each other it is possible to make the wire length short, to prevent the thickness and mounting area of the semiconductor device from getting larger.

In addition, according to a the process for a semiconductor chip, through the formation of inclined planes wherein the inner angle formed by the second plane and the inclined planes is an obtuse angle, the holes formed in the semiconductor substrates are made into through holes and, therefore, the processing time for the holes can be shortened before the formation of the inclined planes. In addition, in dividing the semiconductor chip into the semiconductor chip units, by cutting through the resin part provided on the inclined planes, disadvantages such as chipping at the time of cutting can be prevented. In the following, the seventh embodiment of a wiring board of the present invention and a process thereof is described.

Figure 22:
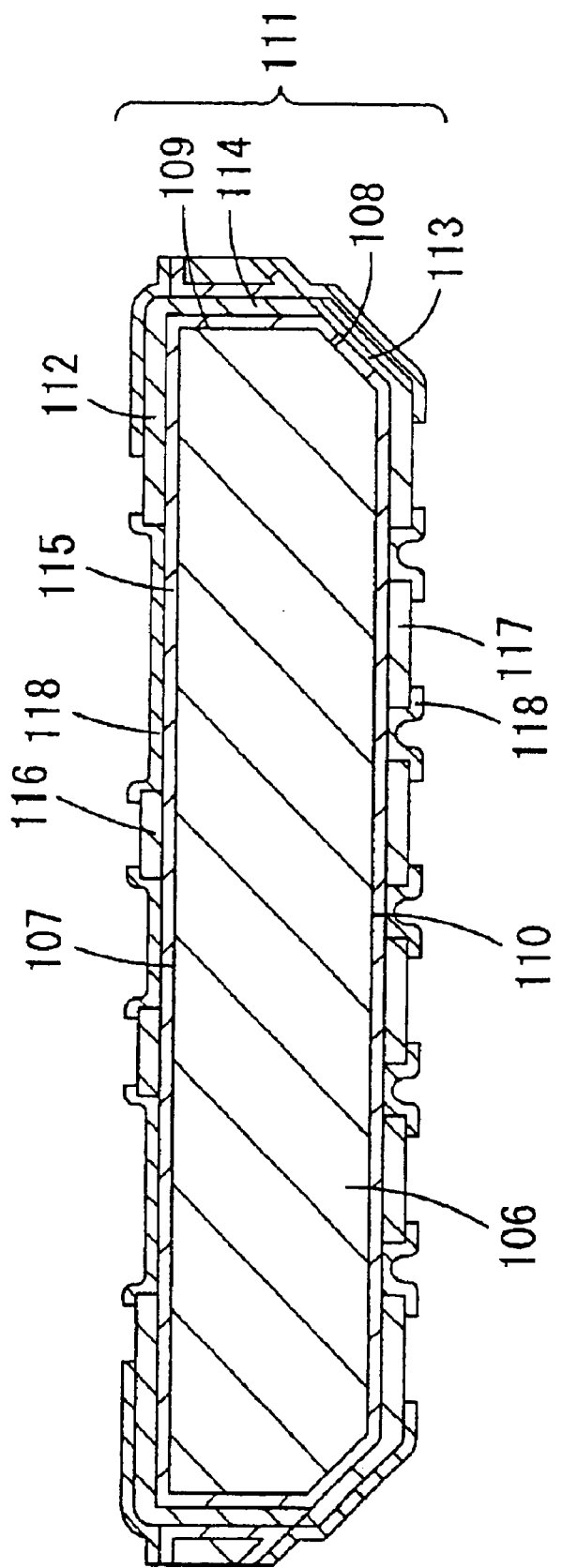
FIG. 22 is a cross section view showing a wiring board according to the seventh embodiment of the present invention.

First, the wiring board of the present embodiment is described. FIG. 22 is a cross section view of the wiring board of the present embodiment.

As shown in FIG. 22, through holes 109 are created in the surface 107 to the inclined plane 108 in the silicon substrate 106, of which the basic material is silicon with a thickness of 50 µm to 200 µm and inclined planes 108, formed so that the inner angles made up of the inclined planes and the rear plane 110 become an obtuse angles, become parts of the external form of the wiring board 111. In the present embodiment the through holes 109 are created in the vicinity of the border parts of the unit of the wiring board 111, for example, at positions 50 µm to 150 µm from the border parts. The form of the through holes 109 may be circular or quadrangular wherein, in the case that they are circular the diameter is 10 µm to 20 µm and, in the case that they are quadrangular the length of one side is 10 µm to 20 µm, and the corners of the quadrangle are not right angles but, rather, are of a rounded form. In addition, in the present embodiment the inner angles formed by the inclined planes 108 and the rear plane 110 are 135 degrees wherein the inclined planes 108 are created up to positions 10 µm to 50 µm from the rear plane. In the present embodiment the thickness of the substrate is 100 µm and the inclined planes 108 are created up to positions 20 µm from the rear plane 110. Then, the first conductive patterns 112 and the second conductive patterns 113 are, respectively, formed on the surface 107 and on the rear plane 110 of the silicon substrate 106. In addition, the third conductive patterns 114 are formed on the inside walls of the through holes and on the inclined planes so that the first conductive patterns 112 and the second conductive patterns 113 are electrically connected through the third conductive patterns 114. In this manner, by creating the inclined planes wherein the inner angles formed by the inclined planes and the rear plane of the silicon substrate form obtuse angles, the distance of the conductive patterns for electrically connecting the electrodes on both sides of the silicon substrate becomes short and wiring patterns for achieving a high speed operation can be secured. Here,the third conductive patterns 114 maybe formed along the inner walls of the through holes or may be filled in into the through holes. As for the material of each of the above conductive patterns, copper (Cu), gold (Au), tungsten (W), molybdenum (Mo), nickel (Ni), titanium (Ti), aluminum (Al), or the like, is used. The thicknesses of the respective conductive patterns are preferably 5 µm to 15 µm and in the present embodiment they are 10 µm and the material and the thickness of the respective external electrodes are the same as those of the respective conductive patterns.

As for the base for these conductive patterns, a layered metal film may be formed between the respective conductive patterns and the first insulating layer 115 wherein the layered metal film has a double layer structure wherein a seed layer is layered on the upper surface of a barrier layer and the barrier layer can prevent the diffusion of the component elements of the respective conductive patterns and can prevent the deterioration of the characteristics of the wiring board while it becomes possible to plate the conductive patterns by means of an electrolytic plating method by providing the seed layer. As for the material of the barrier layer, titanium (Ti), titanium tungsten (Ti/W), chromium (Cr), nickel (Ni), and the like, is used and the thickness thereof is 0.05 µm to 0.35 µm and it is 0.2 µm in the present embodiment. In addition, as for the material of the seed layer copper (Cu), gold (Au), silver (Ag), nickel (Ni), or the like, is used and the thickness thereof is 0.2 µm to 0.8 µm and it is 0.5 µm in the present embodiment.

In addition, the first insulating layer 115 is formed between the silicon substrate 106 and the first conductive patterns 112 and between the second conductive patterns 113 and the third conductive patterns 114 so that the silicon substrate 106 and respective conductive patterns are electrically insulated. Furthermore, the surface of the first conductive patterns 112, except for the electrode parts 116, and the rear surface of the second conductive patterns 113, except for the electrode part 117, are covered with the second insulating layer 118 and respective electrode parts are parts of respective conductive patterns and, therefore, respective electrode parts corresponding to respective conductive patterns are formed simultaneously. Here, for respective insulating layers, silicon dioxide (SiO$_2$), silicon nitride (SiN), oxide nitride film (SiON), polyimide film, or the like, with the thickness of 1 µm to 30 µm is used where in the case of silicon dioxide (SiO$_2$), silicon nitride (SiN) or oxide nitride film (SiON) the thickness is 1 µm, while in the case of polyimide film the thickness is 7 µm. In addition, the second insulating layer 118 may have solder resist as its main material and, in this case, the thickness thereof is 30 µm in the present embodiment.

Though in the present embodiment respective conductive patterns are formed in one layer, conductive patterns of two or more layers may be formed alternately with insulating layers and the number of layers in respective conductive patterns is not limited.

As described above, because of the wiring board wherein through holes are formed in the silicon substrate of which the base material is silicon and electrodes formed on both sides of the silicon substrate are electrically connected via conductive patterns formed on both sides and in the through holes of the silicon substrate, highly precise pattern formation and flatness of a high degree can be achieved of the same level as the semiconductor chips mounted on the wiring board so that it is possible to implement the increase in the connection reliability.

Next, a process for a wiring board of the present embodiment is described.

Here, the same symbols are attached to the same component elements as in FIG. 22.

FIGS. 23 to 38 are cross section views and a plan view of respective steps of a process for a wiring board according to the present embodiment.

Figure 23:
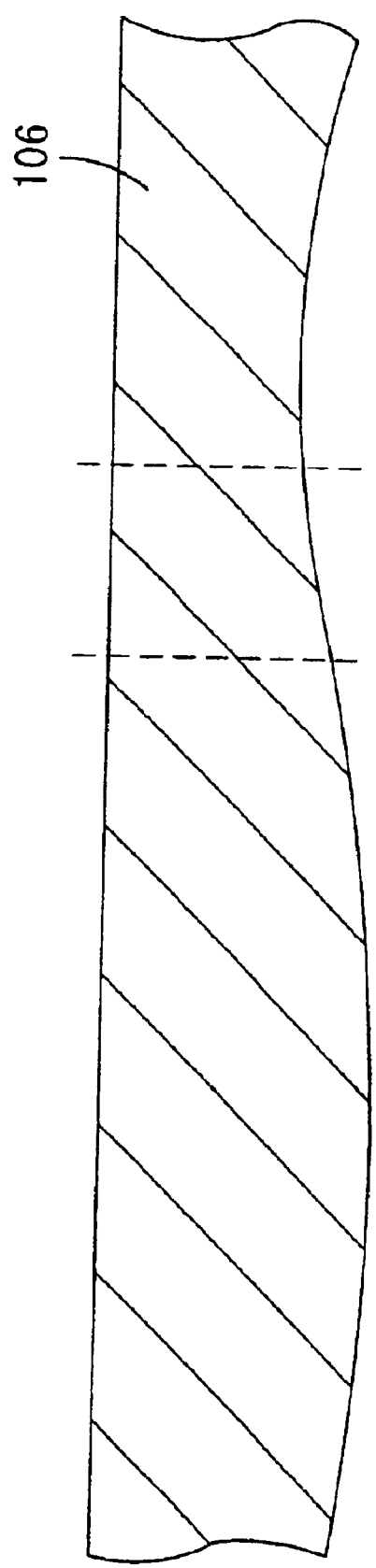
FIG. 23 is across section view of one step of a manufacturing process of a wiring board according to the present invention.

First, as shown in FIG. 23, a silicon substrate 106 in a wafer condition of the thickness of 600 µm to 1000 µm is prepared. Here, broken lines in the figures show the positions where both edge parts of the cutter blade in the width direction pass through at the time of dicing for dividing the silicon substrate into wiring board units and the center part of the two broken lines is the border part between units of the wiring boards.

Figure 24:
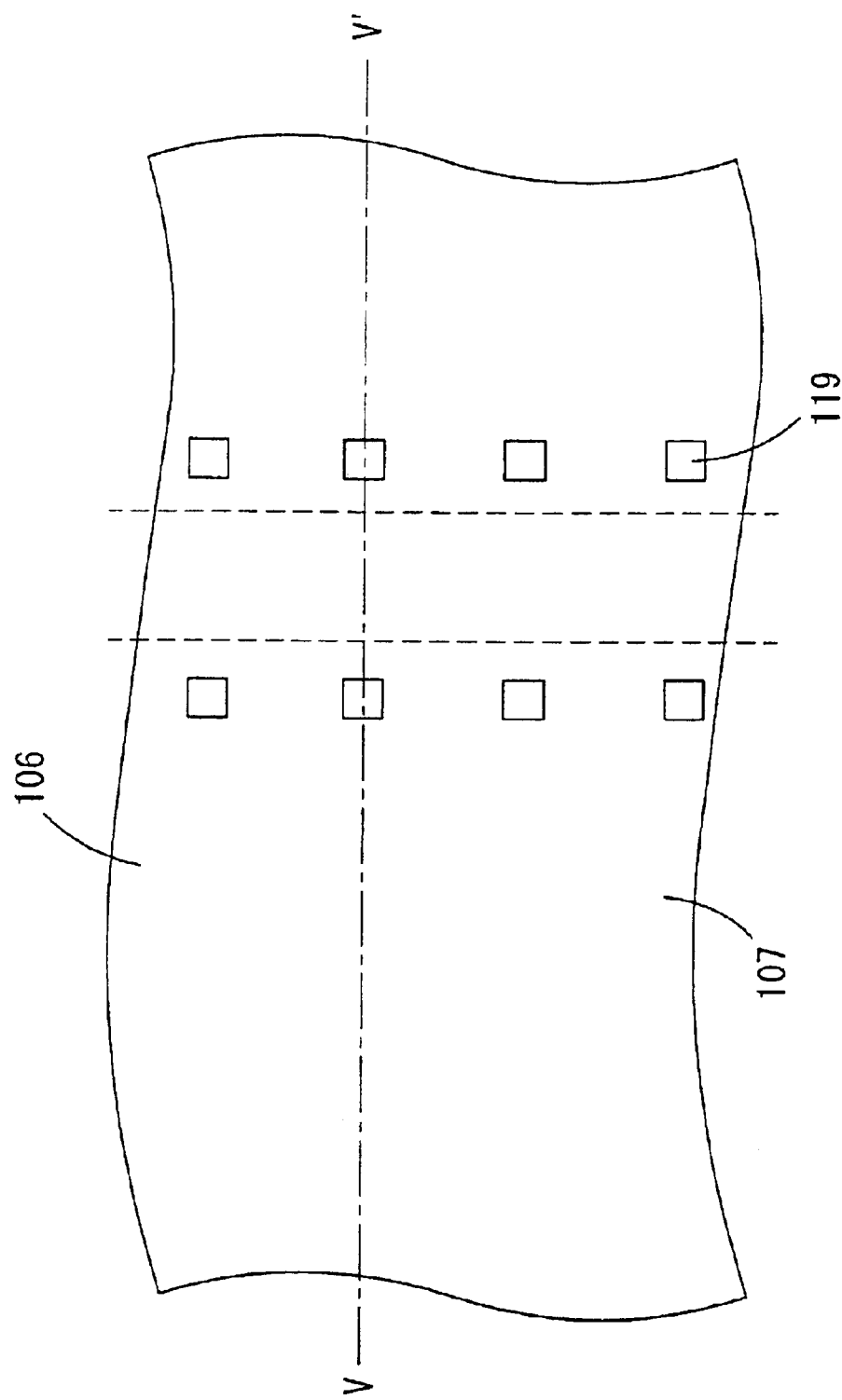
FIG. 24 is a plan view of one step of the manufacturing process of a wiring board according to the present invention.

FIG. 24 is a plan view showing the condition wherein holes are processed in the surface of the silicon substrate and FIG. 25A is a cross section view along line V–V' in FIG. 24.

As shown in FIGS. 24 and 25A, holes 119, of which the depths are 20 µm to 100 µm, are created in the surface 107 of the silicon substrate 106 in the direction of the thickness without complete penetration by means of an RIE (reactive ion etching) method and the positions where the holes 119 are created around the periphery of the wiring board units after division and, in the present embodiment, the holes are created in positions 50 μm from border lines of wiring board units after division.

In the present embodiment the thickness of the silicon substrate 106 is 100 μm, the depth of the holes 119 is 70 μm and the length of the through holes 109 after the holes 119 are made to penetrate by the formation of the inclined planes 108 in the subsequent steps is approximately 50 μm. Here, the method of creation of holes 119 is not limited to the RIE method but, rather, it is possible to use optical etching, wet etching, supersonic processing, discharge processing, or the like, or those varieties of processing methods may be combined.

As described above, the RIE method which is a processing method for the holes created in the silicon substrate is a dry etching method utilizing reactive gas plasma, which is a method used for microscopic processing of semiconductor wafers and, at this time, a mask which covers the parts other than the holes is formed over the insulating layer so that the parts other than the holes are not etched and the mask is removed after etching.

Next, as shown in FIG. 25B, the first insulating layer 120 is formed on the inner walls of the holes 119 and on the surface 107 of the silicon substrate. Here, the first insulating layer 120 is a film formed of a material such as silicon dioxide ($SiO_2$), silicon nitride (SiN), oxide nitride film (SiON) or polyimide by means of a CVD method, a spattering method, an optical CVD method, an application method, or the like.

As shown in FIG. 26A, the first layered metal film 121 is formed on the first insulating layer 120 and the first layered metal film 121 has a double layer structure wherein a seed layer is layered on a barrier layer. Here, the barrier layer and the seed layer are formed by means of a spattering method, a CVD method, an electron beam deposition method, or the like. Any of the materials from among titanium (Ti), titanium tungsten (Ti/W), chromium (Cr), nickel (Ni), and the like, is used for the barrier layer and copper (Cu), gold (Au), silver (Ag), nickel (Ni), or the like, is used for the seed layer.

Next, as shown in FIG. 26B, the first conductive patterns 112 are formed on the inner walls of the holes 119 and on the first layered metal film 121 by means of an electrolytic plating method utilizing the first layered metal film 121 as an electrode. At this time, in order to achieve the desired forms of wires and electrodes a plating resist 122 is formed on the first layered metal film 121 and, after the electrolytic plating, the plating resist 122 is removed. Here, the first conductive patterns 112 may be formed by filling in the holes 119. In addition, as for the material of the first conductive patterns 112 copper (Cu), gold (Au), tungsten (W), molybdenum (Mo), nickel (Ni), titanium (Ti), aluminum (Al), or the like, is used.

Next, as shown in FIG. 27A, the first layered metal film 121 of the parts other than the regions wherein the first conductive patterns 112 are formed is removed through etching by using the first conductive patterns 112 as a mask.

Next, as shown in FIG. 27B, the second insulating layer 124 is formed with the openings for the first external electrodes 123 in parts of the first conductive patterns 112 and, at that time, the second insulating layer 124 is formed on the first conductive patterns 112 and on the first insulating layer 120 but not on the first external electrodes 123 and, after that, a mask with openings for the parts of the first external electrodes 123 is formed and the second insulating layer 124 of the opening parts for the first external electrodes 123 is etched and, then, the mask is removed. Here, the second insulating layer 124 is a film formed of a material such as silicon dioxide ($SiO_2$), silicon nitride (SiN), oxide nitride film (SiON) or polyimide by means of a CVD method, a spattering method, an optical CVD method, an application method, or the like.

Next, as shown in FIG. 28, the surface 107 of the silicon substrate 106 is adhered to the support body 126 by means of adhesive 125 and the rear plane 110 of the silicon substrate 106 is polished by means of a mechanical polishing method or a CMP (chemical mechanical polishing) method so as to be processed to the thickness of 50 μm to 200 μm. Here, in the present embodiment, the thickness of the silicon substrate after polishing is 100 μm.

Figure 29:
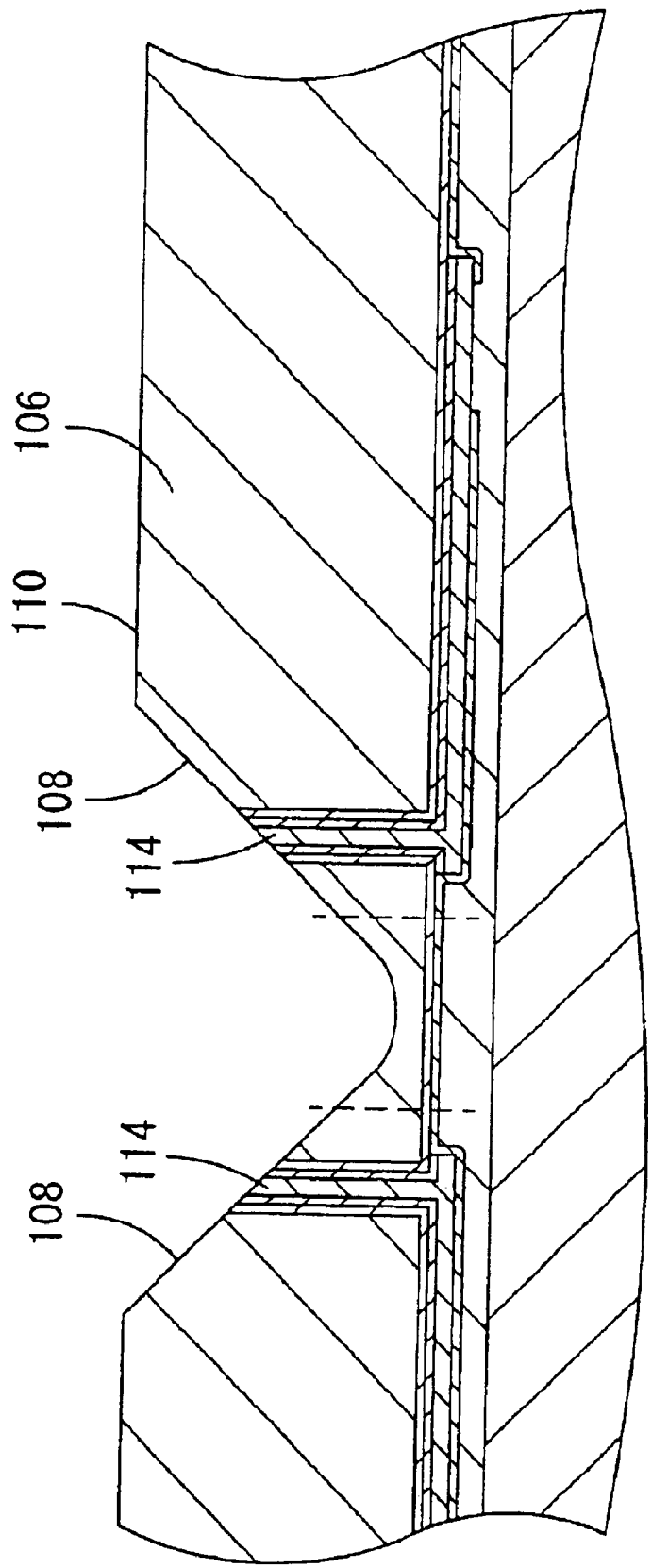
FIG. 29 is a cross section view of one step of the manufacturing process of a wiring board according to the present invention.

Next, as shown in FIG. 29, the middle part between two dotted lines enclosing the border parts between wiring board units after division is cut by means of bevel cutting in the rear plane 110 of the silicon substrate 106 and, thereby, inclined planes 108 wherein obtuse angles are formed between the inclined planes and the rear plane 110 of the silicon substrate 106 are created and the first conductive patterns 114 are exposed on the inclined planes 108. Accordingly, as shown in FIG. 25A, it is not necessary for the holes 119 created in the silicon substrate 106 to be made to penetrate through the silicon substrate 106 and the time necessary for processing the holes 119 can be shortened. Here, the processing depth of the holes 119 shown in FIG. 25A is determined by the cutting depth and by the tip form of the cutting blade for bevel cutting.

Figure 30:
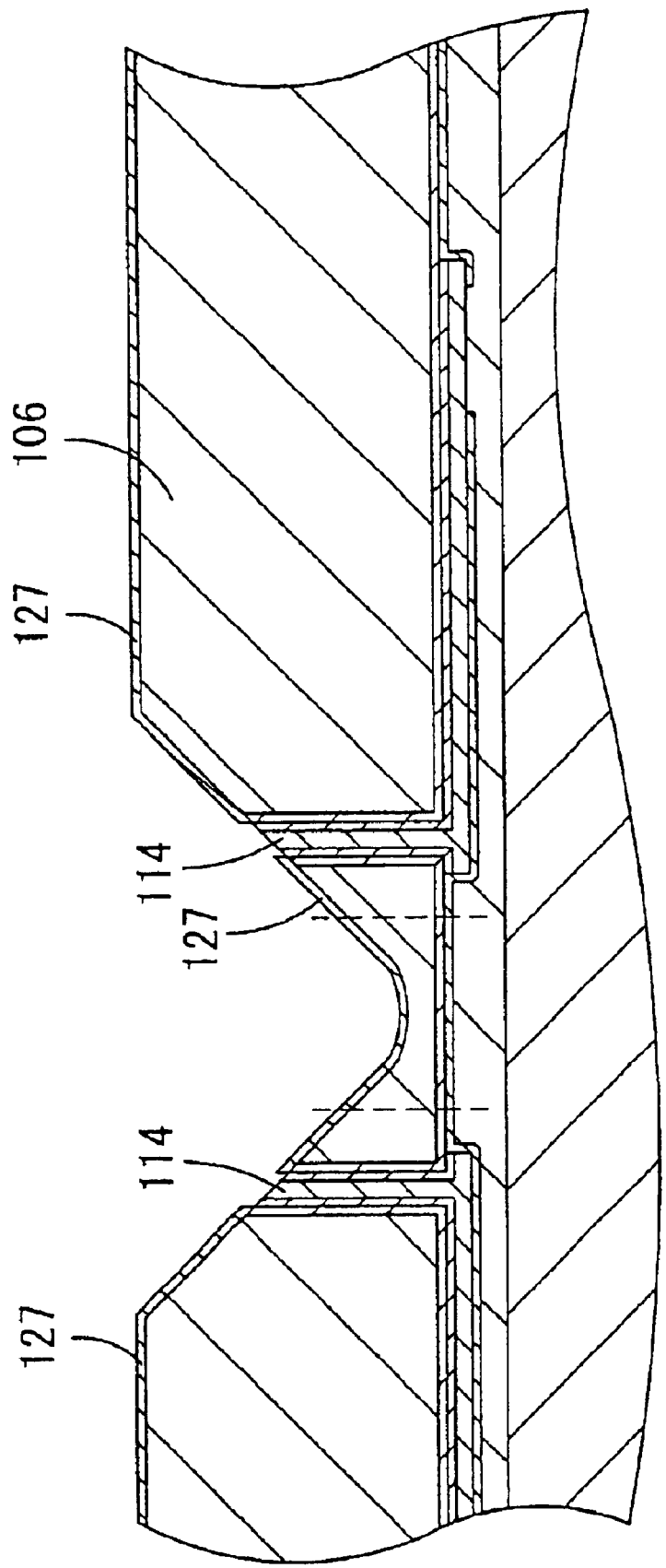
FIG. 30 is a cross section view of one step of the manufacturing process of a wiring board according to the present invention.

Next, as shown in FIG. 30, the third insulating layer 127 is formed on the entire surface of the inclined planes 108 and the rear plane 110, except for on the parts where the first conductive patterns 114 are exposed on the inclined planes 108, and, at that time, the third insulating layer 127 is formed on the entire surface of the inclined planes 108 and of the rear plane 110 and, after that, a mask with openings for the parts from where the first conductive patterns 114 are exposed is formed on the third insulating layer 127 and the third insulating layer 127 of the part of the opening for the first conductive patterns 114 is etched and, then, the mask is removed. Here, the third insulating layer 127 is a film formed of a material such as silicon dioxide ($SiO_2$), silicon nitride (SiN), oxide nitride film (SiON) or polyimide by means of a CVD method, a spattering method, an optical CVD method, an application method, or the like.

In addition, it is desirable to form the third insulating layer 127 of material of which the etching rate is greater than that of the first insulating layer 120. That is to say, at the time of the etching of the third insulating layer 127 in order to create openings, the shift of the mask hardly causes the first insulating layer 120 to be etched so that the third insulating layer 127 can be selectively etched in order to create openings and the first insulating layer 120 is not partially removed.

Figure 31:
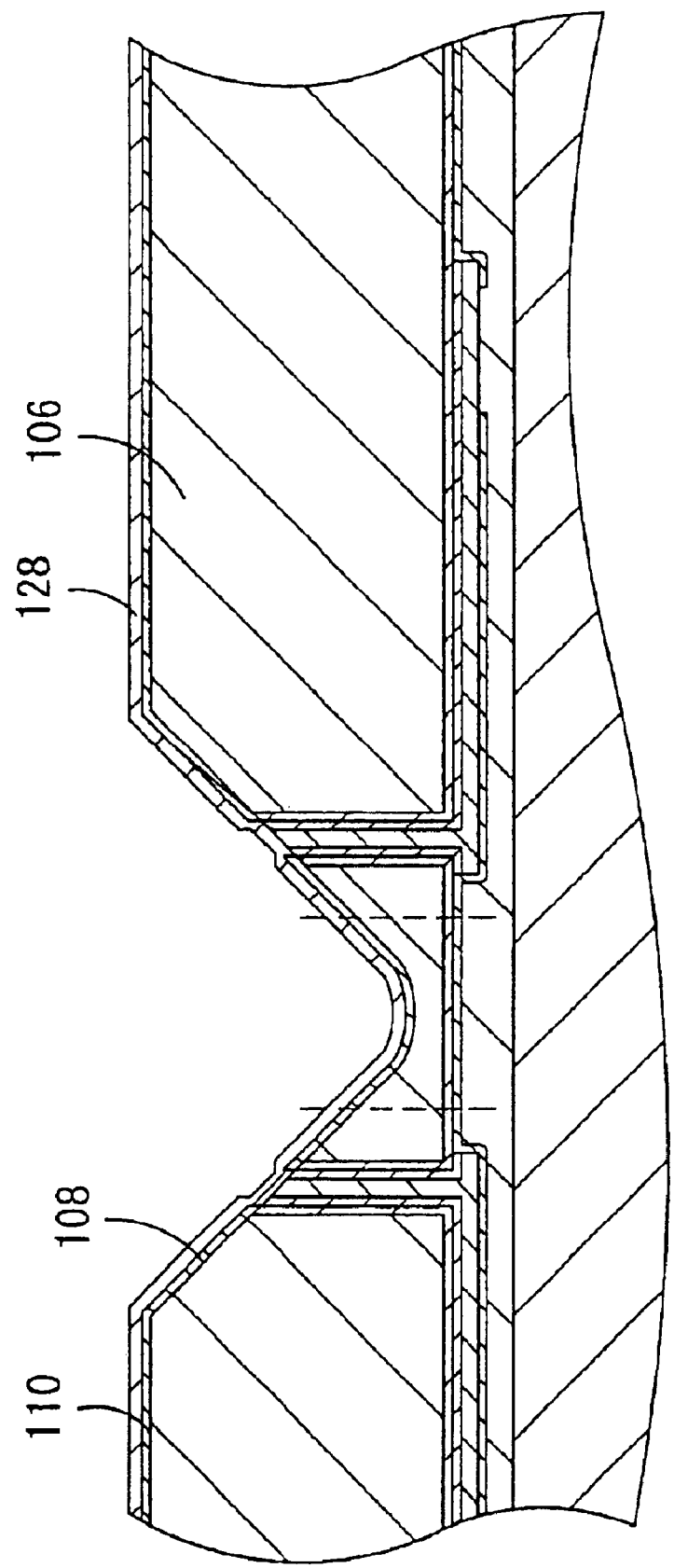
FIG. 31 is a cross section view of one step of the manufacturing process of a wiring board according to the present invention.

Next, as shown in FIG. 31, the second layered metal film 128 is formed on the entire surface of the inclined planes 108 and on the rear plane 110. The second layered metal film 128 has a double layer structure wherein a seed layer is layered on a barrier layer. The barrier layer and the seed layer are formed by means of a spattering method, a CVD method, an electron beam deposition method, or the like. Titanium (Ti), titanium tungsten (Ti/W), chromium (Cr), nickel (Ni), or the like, is used for the barrier layer and copper (Cu), gold (Au), silver (Ag), nickel (Ni), or the like, is used for the seed layer.

Figure 32:
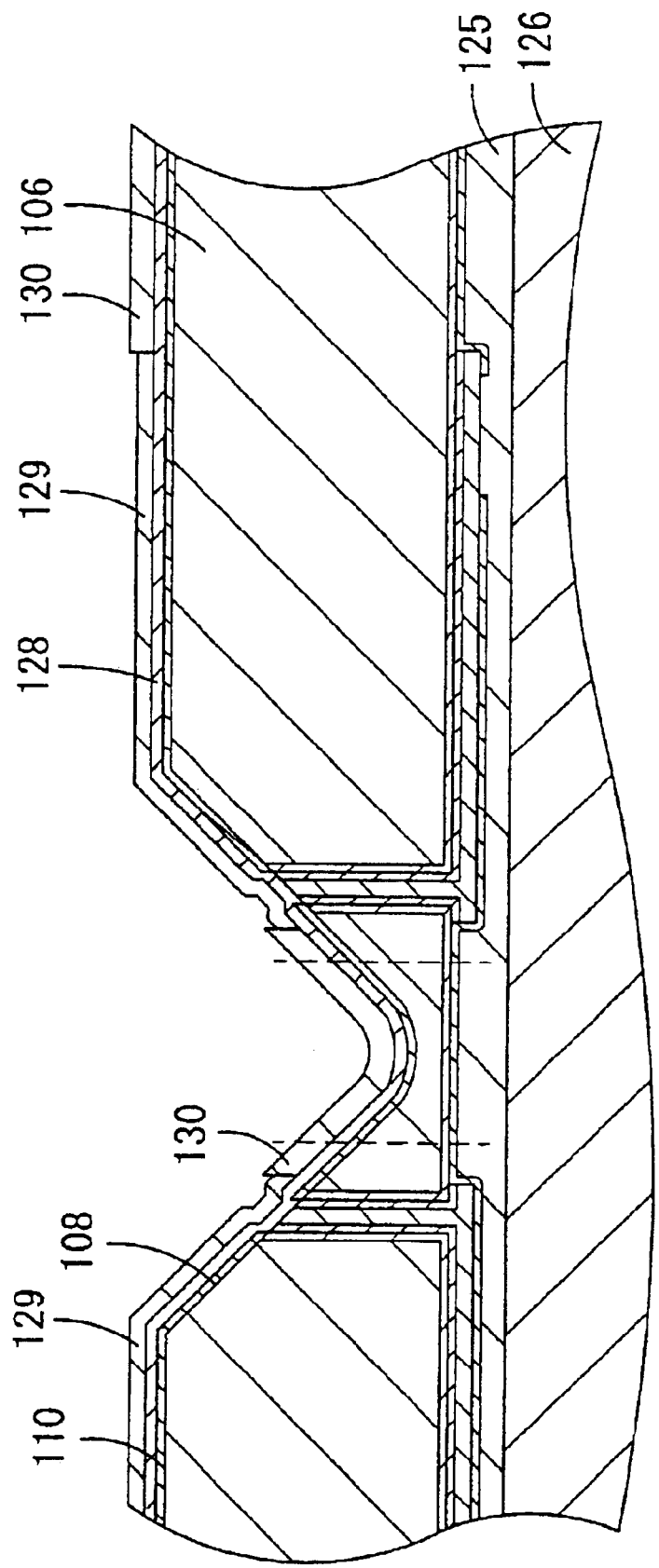
FIG. 32 is a cross section view of one step of the manufacturing process of a wiring board according to the present invention.

Next, as shown in FIG. 32, the second conductive patterns 129 in desired forms of wires and electrodes are formed on the inclined planes 108 and on the rear plane 110 by means of an electrolytic plating method utilizing the second layered metal film 128 as an electrode and, thereby, the second conductive patterns 129 are electrically connected to the first conductive patterns 114, which are exposed from the inclined planes 108, via the second layered metal film 128. At this time, in order to form desired shapes of wires and electrodes, a plating resist 130 is formed on the second layered metal film 128 of the parts wherein it is not necessary to form the second conductive patterns 129 and, after electrolytic plating, the plating resist 130 is removed. In addition, as for the material of the second conductive patterns 129, copper (Cu), gold (Au), tungsten (W), molybdenum (Mo), nickel (Ni), titanium (Ti), aluminum (Al), or the like, is used.

Figure 33:
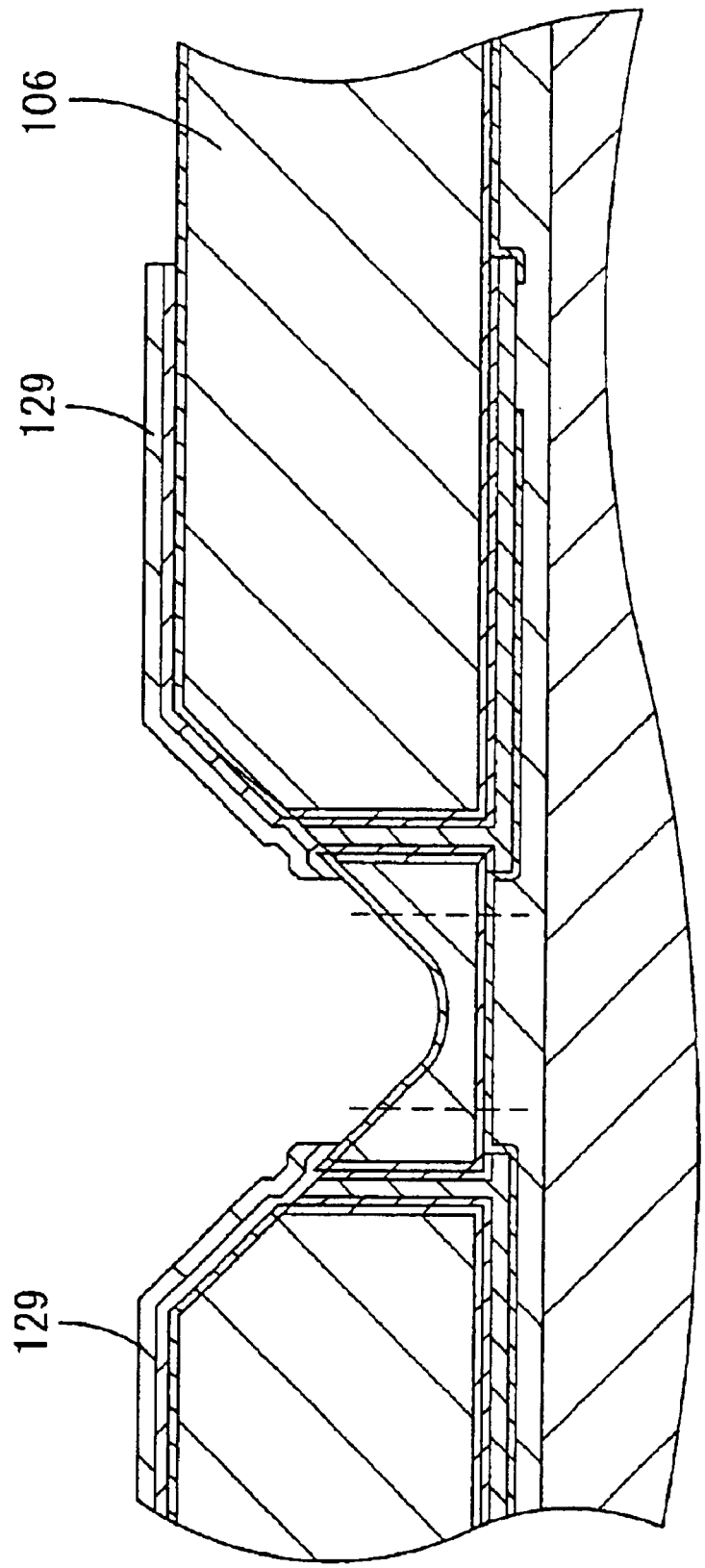
FIG. 33 is a cross section view of one step of the manufacturing process of a wiring board according to the present invention.

Next, as shown in FIG. 33, the second layered metal film 128 of the parts, other than the region wherein the second conductive patterns 129 are formed, is removed through etching by using the second conductive patterns 129 as a mask.

Figure 34:
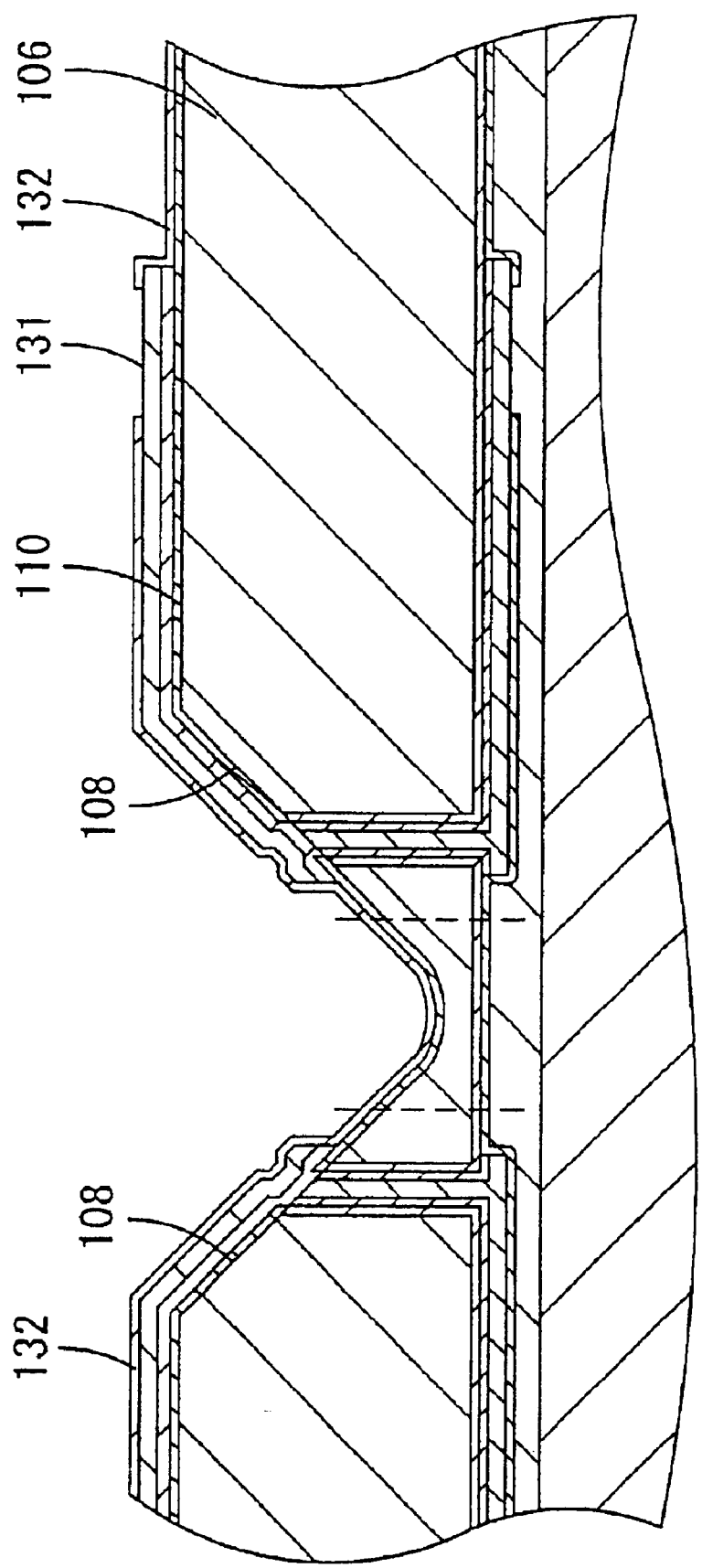
FIG. 34 is a cross section view of one step of the manufacturing process of a wiring board according to the present invention.

Next, as shown in FIG. 34, the fourth insulating layer 132 is formed on the entire surface of the rear plane 110, except for on the opening parts for the second external electrodes 131, and on the inclined planes 108. At this time, after forming the fourth insulating layer 132 on the entire surface of the inclined planes 108 and on the rear plane 110, a mask with openings for the second external electrodes 131 parts is formed and the fourth insulating layer 132 of the opening parts for the second external electrodes 131 is etched and, then, the mask is removed. Here, the fourth insulating layer 132 is a film formed of silicon dioxide ($SiO_2$), silicon nitride (SiN), oxide nitride film (SiON), polyimide, or the like, by using a CVD method, a spattering method, an optical CVD method, an application method, or the like.

Figure 35:
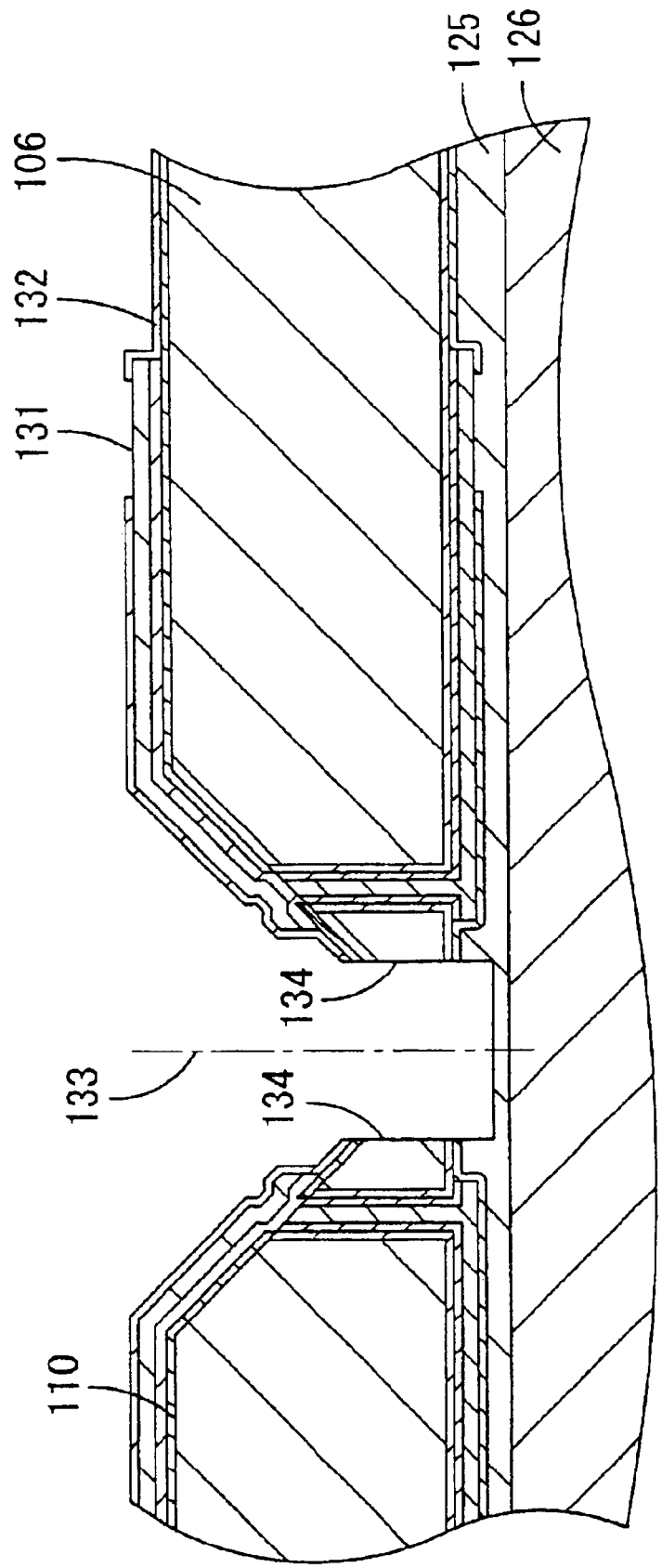
FIG. 35 is a cross section view of one step of the manufacturing process of a wiring board according to the present invention.

Next, as shown in FIG. 35, dicing is carried out in the inside of both edge parts of the cutting blade in the width direction shown with broken lines in FIG. 34 with the center of the scribe line 133 which is a border line for division between the wiring board units and side surfaces 134 are formed so that the inner angles formed by the side surfaces and the rear plane 110 become right angles.

By undergoing such a sequence of manufacturing steps of the wiring board, the first external electrodes are formed on the surface of a wiring board in the condition exposed from the second insulating layer and the second external electrodes are formed on the rear surface of the wiring board in the condition exposed from the fourth insulating layer wherein the first external electrodes are the second external electrodes are electrically connected to each other.

Here, the positions of formation of the first external electrodes and the second external electrodes are not particularly restricted and external electrodes may be, respectively, formed on the positions corresponding to the electrodes of the mounted semiconductor chips and the electrodes on the connection parts with the mother board.

Figure 36:
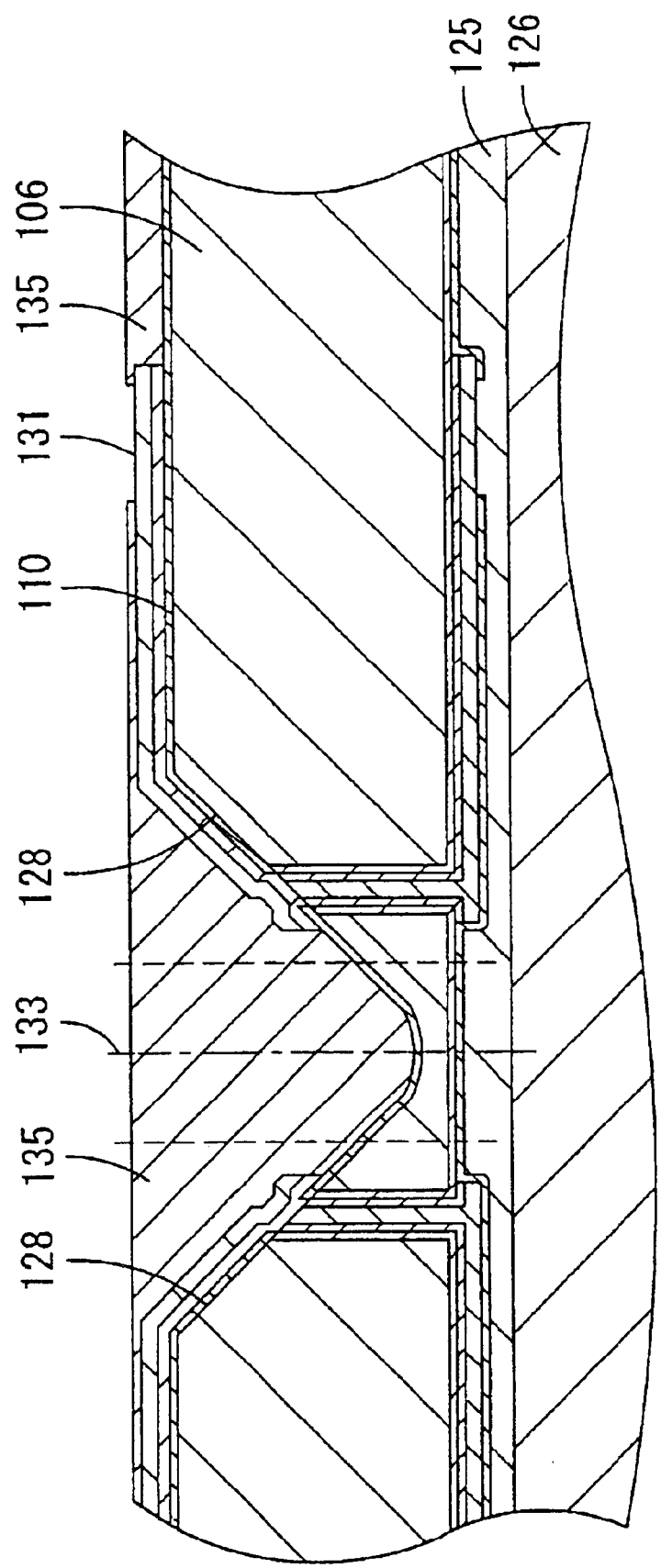
FIG. 36 is a cross section view of one step of the manufacturing process of a wiring board according to the present invention.
Figure 37:
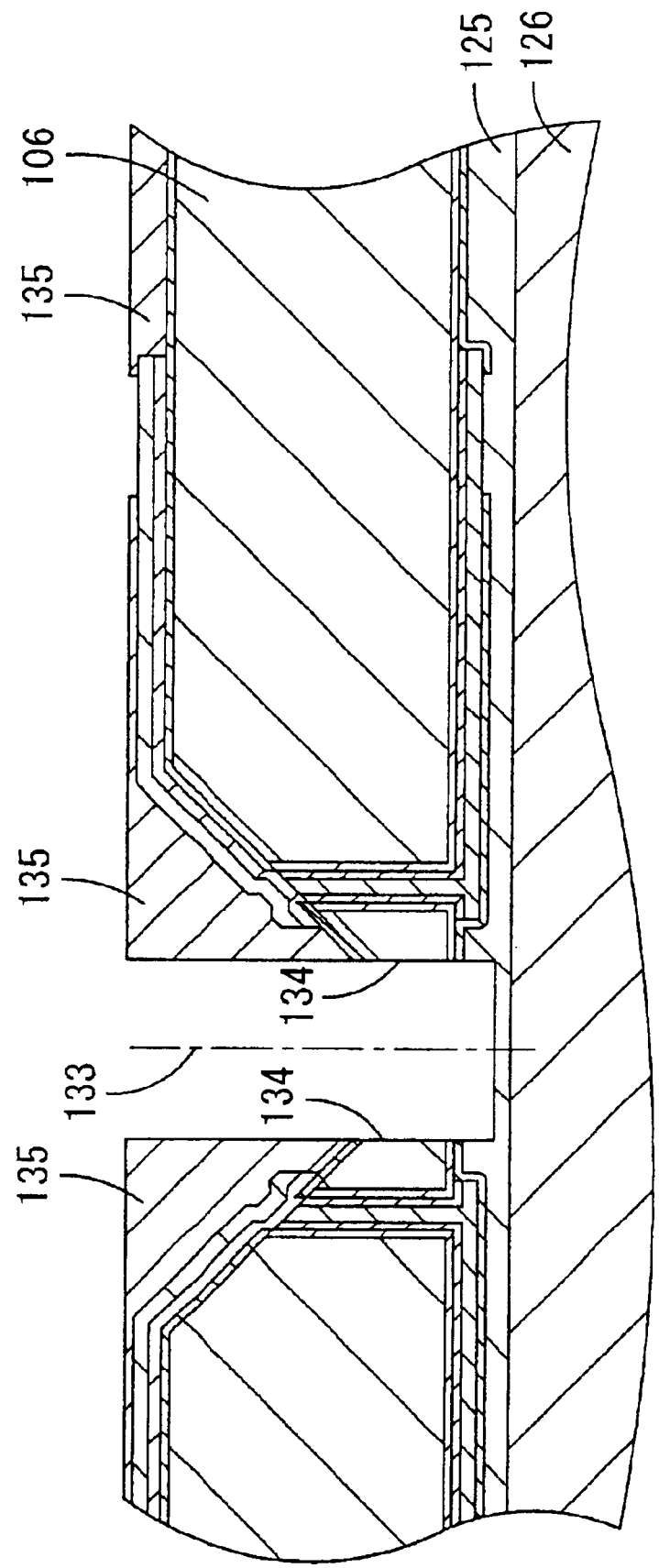
FIG. 37 is a cross section view of one step of the manufacturing process of a wiring board according to the present invention.

FIGS. 36 to 38 are cross section views of the steps for supplying a resin to the inclined planes which is cured after the steps shown in FIGS. 23 to 33. The steps shown in FIGS. 36 to 38 are for the purpose of reinforcing the inclined planes.

As shown in FIG. 36, by applying a liquid resin to the parts which have been bevel cut until the upper surface reaches the height of the rear plane, an insulating resin layer 135 is formed on the entire surface of the rear plane 110 and on the inclined planes 108, except for on the opening parts for the second external electrodes 131.

Here, the liquid resin is preferably a material which can release stress, such as polyimide.

Next, as shown in FIG. 37, dicing is carried out starting from the rear surface by making the scribe line 133 the center so that side surfaces perpendicular to the rear surface can be formed.

Next, as shown in FIG. 38, the adhesive 125 and the support body 126 are removed and the wiring board 106 is divided into pieces.

Here, the form of the through holes or the holes may be circular or quadrangular and, in the case that they are circular, the diameter is 10 $\mu$m to 20 $\mu$m, while in the case that they are quadrangular, the length of one side is 10 $\mu$m to 20 $\mu$m, and is 20 $\mu$m in the present embodiment. Here, in the case that the form of the holes is quadrangular, the corners of the quadrangle do not form right angles but, rather, are rounded forms. In addition, because of a technical innovation in the RIE method it has become possible to process through holes or holes of the diameter or the length of one side is smaller than 10 $\mu$m.

In addition, the thickness of the first insulating layer, the second insulating layer, the third insulating layer and the fourth insulating layer is 1 $\mu$m to 30 $\mu$m and, in the present embodiment, it is 1 $\mu$m in the case of silicon dioxide ($SiO_2$), silicon nitride (SiN) and oxide nitride film (SiON) and is 7 $\mu$m in the case of polyimide. In addition, the second insulating layer and the fourth insulating layer may be made of solder resist as the main material and the thickness in this case is 30 $\mu$m in the present embodiment.

In addition, the thickness of the first conductive patterns 12 and the second conductive patterns 13 is preferably 5 $\mu$m to 15 $\mu$m and is 10 $\mu$m in the present embodiment.

In the present embodiment by dicing parts of the cured liquid resin after applying the liquid resin onto the inclined planes, inconveniences such as chipping at the time of cutting can be prevented and the corner parts of the silicon substrate formed of an insulating resin layer, which is perpendicular to the rear surface and of which the thickness is comparatively great, can be formed so that when the wiring board is divided into pieces, the sides of the wiring boards can be reinforced and the second conductive patterns on the inclined planes can be protected.

As described above, in the present embodiment in addition to the formation steps of a variety of insulating layers, the step of forming holes in the first plane of the silicon substrate which do not completely penetrate through the silicon substrate, the step of forming inclined planes in the rear surface so as to make the holes completely penetrate through the substrate and the step of forming conductive patterns in the holes and on the inclined planes are provided and, thereby, a structure wherein electrodes formed on both sides of the silicon substrate are electrically connected to each other can be implemented.

Furthermore, after forming the first conductive patterns in the holes created in the silicon substrate, inclined planes reaching to the holes, wherein the internal angles made up of the inclined planes and the rear plane are obtuse angles are formed and, thereby, the first conductive patterns are exposed from the rear surface and, therefore, it is not necessary to make the holes deep or to polish the silicon substrate to make it thin so that processing time can be made short and reduction of processing cost can be achieved. In addition, since the freedom of the choice of thickness of the wiring board becomes great, the conveyance of the silicon substrate becomes easier. In addition, by forming, through bevel cutting, inclined planes wherein the inner angles made up of the inclined planes and the rear plane become obtuse angles, the first conductive patterns are exposed from the rear surface and, therefore, the number of manufacturing steps and manufacturing cost can be greatly reduced in comparison with the processing method wherein the holes are first made to penetrate.

In addition, by forming layered metal film made of a barrier layer and a seed layer beneath the first conductive patterns and the second conductive patterns, component elements of the first conductive patterns and the second conductive patterns can be prevented from diffusing into the first electrodes and the silicon substrate by means of the barrier layer and deterioration of the characteristics of the semiconductor chip can be prevented while the first conductive patterns and the second conductive patterns can be formed by means of an electrolytic plating of the seed layer.

As described above, according to the process for a wiring board of the present embodiment, conductive patterns are formed on the inner walls of the through holes so as to go through the through holes in the silicon substrate and the first external electrodes formed on the first plane and the second external electrodes formed on the rear surface are electrically connected through the conductive patterns and, thereby, a wiring board can be manufactured wherein through holes are created in the inclined planes where the internal angles made up of the inclined planes and the rear surface are obtuse angles.

In a wiring board manufactured according to the process for a wiring board of the present embodiment, the electrodes on both sides are electrically connected through conductive patterns which follow the sides of the silicon substrate and, therefore, it becomes possible to connect a semiconductor chip and a wiring board on both sides of the silicon substrate.

In addition, by forming inclined planes in a wiring board, the wiring length can be shortened and by supplying a resin to the inclined planes, shock to the conductive patterns from the outside can be prevented.

Next, the eighth embodiment of the present invention is described.

Here, the contents in common with the seventh embodiment are omitted and the same symbols are attached to the same component elements.

Figure 39:
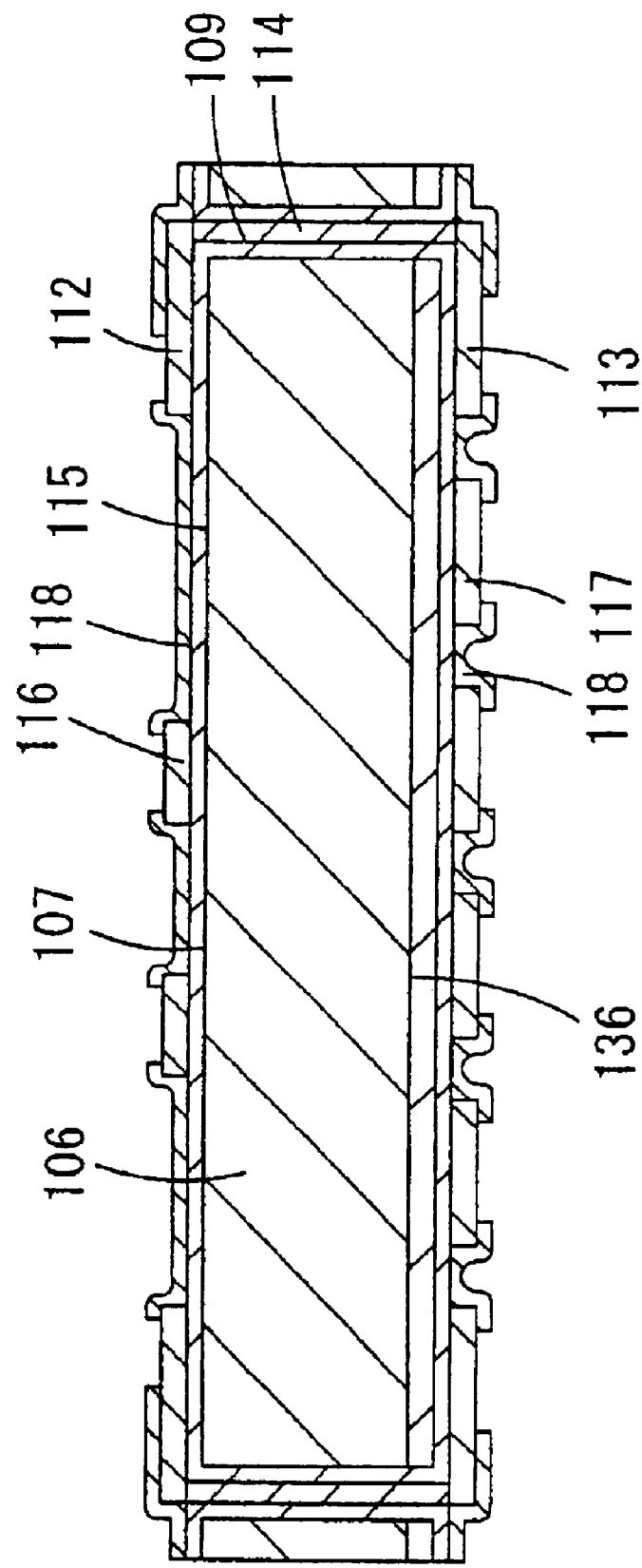
FIG. 39 is a cross section view of a wiring board according to the eighth embodiment of the present invention.

FIG. 39 is a cross section view of a wiring board of the present embodiment.

As shown in FIG. 39, the wiring board of the present embodiment comprises a silicon substrate 106, of which the base material is silicon, wherein holes 109, a first insulating layer 115, a second insulating layer 118, first conductive patterns 112, second conductive patterns 113 and third conductive patterns 114 are, respectively, formed and the first conductive patterns 112 and second conductive patterns 113 are electrically connected through the third conductive patterns 114. The wiring board of the present embodiment is different from the seventh embodiment and has a resin layer 136 of low stress between the silicon substrate 106 and the second conductive patterns 113. As for the material of the resin layer of low stress, an epoxy-based resin, a phenol-based resin, a polyimide resin, a silicon-based resin, an acryl-based resin and a bismalimide-based resin are suitable and an epoxy-based resin is used in the present embodiment. Though in the present embodiment the resin layer of low stress is provided between the silicon substrate and the second conductive patterns, it may be provided between the silicon substrate and the first conductive patterns. In addition, the thickness of the resin layer of low stress is preferably 5 μm to 100 μm and, though it is 20 μm in the present embodiment, the thinner it is the better in order to make the thickness wiring board thinner wherein the thickness of the resin layer of low stress is adjusted in accordance with characteristics such as elasticity and rate of contraction which differ according to the type of resin and in accordance with characteristics of the members such as the size of the substrate, the temperature at the time of mounting, the material of the mother board and the soldering material.

In this manner stress occurring due to temperature change occurring between the substrate and the mother board can be relieved by the resin layer of low stress so as to enhance the reliability of mounting to the board.

Next, a process for a wiring board of the present embodiment is described.

In the present embodiment, after the polishing step of the rear surface 110 of the silicon substrate shown in FIG. 28 in the seventh embodiment by means of mechanical polishing or the CMP method, the step of forming a resin layer of low stress on the rear surface of the silicon substrate is provided. That is to say, a resin of low stress is applied to the rear surface of the silicon substrate in the liquid condition before curing and the resin layer of low stress in necessary places is formed by means of exposure development and is cured by applying heat. Here, there are some cases where the surface of the low stress resin is processed by means of the CMP method in order to make the surface flat after curing.

Next, a semiconductor of the present invention is described.

The respective embodiments of the semiconductor device described below are formed of the respective embodiments of the above described wiring boards and are described as the ninth embodiment and the tenth embodiment.

The ninth embodiment of the present invention is described.

The semiconductor device of the present embodiment uses the wiring board of the seventh embodiment and the contents in common with the seventh embodiment are omitted while the same symbols are attached to the same component elements.

Figure 40:
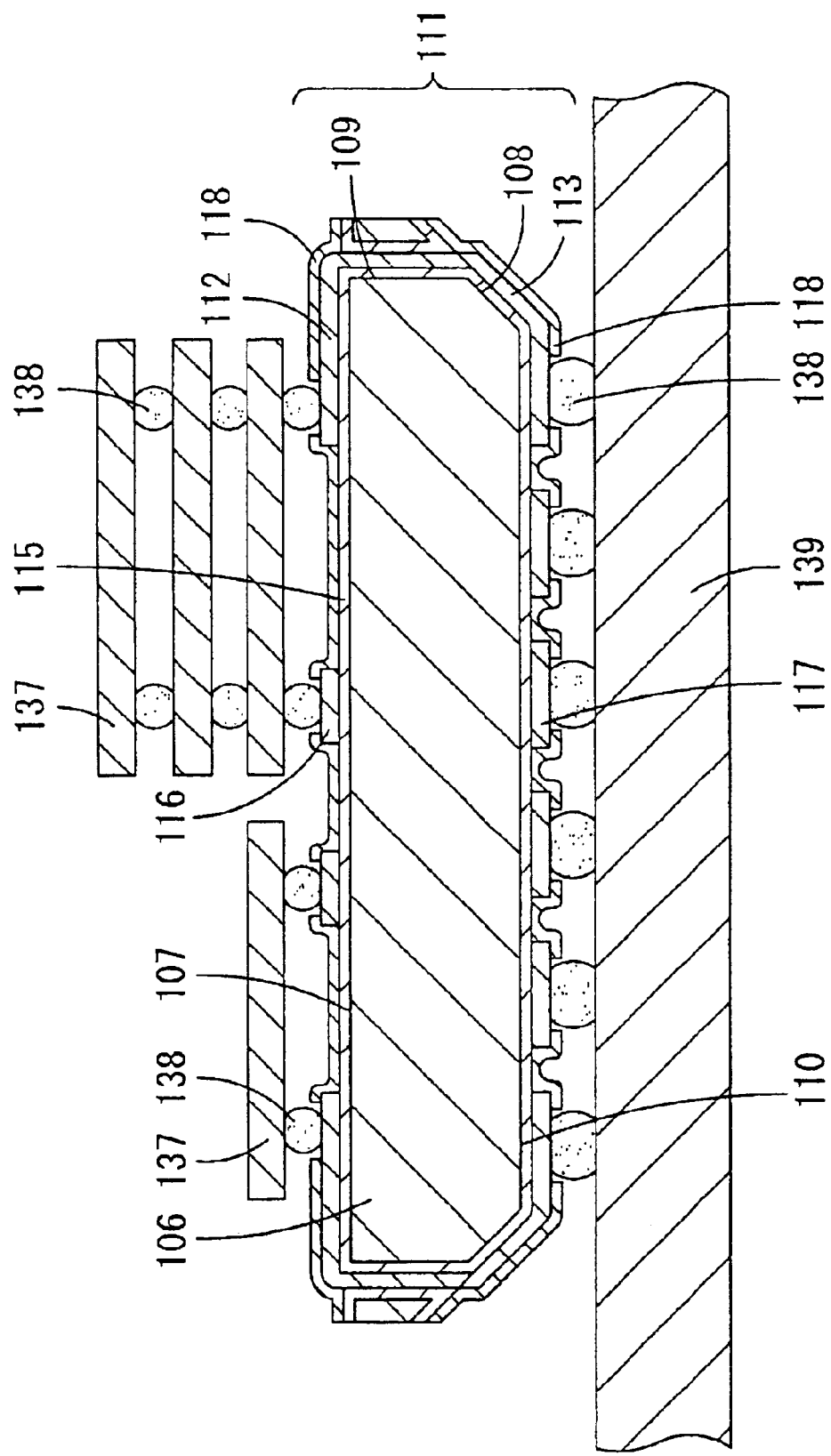
FIG. 40 is a cross section view of a semiconductor device using a wiring board according to the ninth embodiment of the present invention.

FIG. 40 is a cross section view of the semiconductor device of the present embodiment.

In the semiconductor device of the present embodiment, a single, or a plurality of, semiconductor chips 137 is mounted on a wiring board shown in the seventh embodiment, wherein the wiring board 111 is mounted on a mother board 139 by using bumps 138. The wiring board 111 has a silicon substrate 106 as a basic material, wherein inclined planes 108 are formed so that the inner angles made up of the inclined planes and the rear surface 110 are obtuse angles in the silicon substrate 106, and has a plurality of through holes 109 which reach to the inclined planes 108 from the surface 107 of the silicon substrate 106 so that first conductive patterns 112 formed on the surface 107 and in the through holes 109 of the silicon substrate 106 and second conductive patterns 113 formed on the rear surface 110 and on the inclined planes 108 are formed. The first conductive patterns 112 and the second conductive patterns 113 are directly electrically connected through the connection parts in the through holes 109 and on the inclined planes 108. Here, a first insulating layer 115 is formed in order to act as an electrical insulator between the first conductive patterns 112 and the silicon substrate 106 and between the second conductive patterns 113 and the silicon substrate 106. Furthermore, the surfaces of the first conductive patterns 112, other than the electrode parts 116, the surfaces of the second conductive patterns 113, other than the electrode parts 117, and the inclined planes 108 are covered with the second insulating layer 118.

As described above, the semiconductor chips are electrically connected to the first conductive patterns of the silicon wiring board via metal bumps while the second conductive patterns are electrically connected to the mother board via bumps.

By using a wiring board of the present embodiment of which the base material is silicon, thermal expansion characteristics of the semiconductor chips and of the wiring board become approximately the same so that the reliability of the connection parts can be assured and flatness and dimensional precision of the wiring board increase in comparison with a conventional resin wiring board and, therefore, a high density mounting corresponding to wiring density of the semiconductor chips becomes possible. In addition, by intervening metal bumps in the connection parts between the wiring board and the mother board, it becomes possible to reduce stress in the connection parts so as to increase the connection reliability.

Next, the tenth embodiment of the present invention is described.

The semiconductor device of the present embodiment uses the wiring board of the eighth embodiment and contents in common with the eighth embodiment are omitted and the same symbols are attached to the same component elements.

Figure 41:
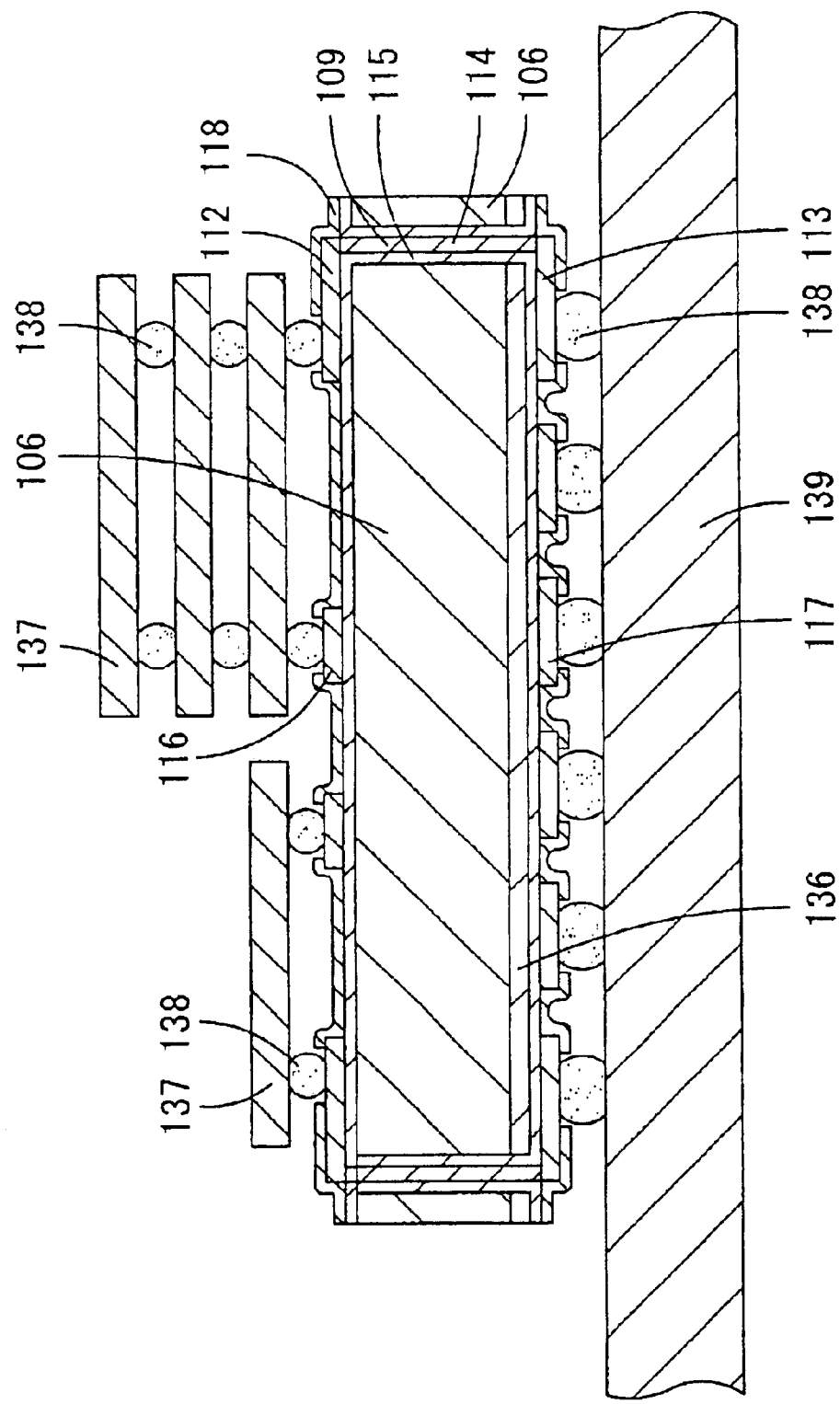
FIG. 41 is a cross section view of a semiconductor device using a wiring board according to the tenth embodiment of the present invention.

FIG. 41 is a cross section view of the semiconductor device of the present embodiment.

As shown in FIG. 41, in the wiring board of the semiconductor device of the present embodiment, a resin layer 136 of low stress is formed between the silicon substrate 106 and the second conductive patterns 113. Here, the resin layer 136 of low stress may be formed between the silicon substrate 106 and the first conductive patterns 112.

According to the present embodiment, stress occurring between the wiring board and the mother board due to temperature change can be relieved by the resin layer of low stress and the reliability of mounting of the wiring board to the mother board can be increased. In addition, because of the semiconductor device wherein semiconductor chips are mounted on the wiring board, of which the base material is silicon, the thermal expansion characteristics of the semiconductor chips and of the wiring board become approximately the same and, thereby, the reliability of the connection part can be assured and stress of the connection -parts between the wiring board and the mother board using metal bumps can be reduced so that the connection reliability is increased and the connection stability is increased due to the flatness and dimensional precision of the wiring board using the silicon substrate and miniaturization, higher density and higher operational speed can be implemented.

Here, though semiconductor chips are mounted on the wiring board in the ninth and tenth embodiments, electronics parts other than semiconductor chips may be mounted.

As described above, in the respective embodiments of the semiconductor device of the present invention, by using silicon, which is the same material of the semiconductor chips, for the wiring board, heat stress occurring in the connection parts between the semiconductor chips and the wiring board at the time of heat application for mounting the semiconductor chips is reduced so that the connection reliability is increased and the wiring patterns formed in the wiring board has approximately the same level of flatness and dimensional precision as of the wiring patterns formed in the semiconductor chips so as to realize the high density mounting of semiconductor chips onto the wiring board. In addition, by mounting the wiring board onto the mother board via metal bumps, stress reduction can be achieved by the metal bumps so as to increase the connection reliability.

In addition, the wires can be made short forming inclined planes wherein the internal angles made up of the inclined planes and the rear surface of the wiring board are obtuse angles as parts of the external form of the wiring board and the implementation of a semiconductor device on which semiconductor chips of which the conductive patterns are protected are mounted becomes possible by forming a resin in the inclined planes.

In addition, by forming a resin layer of low stress on the top surface or on the rear surface of the silicon substrate, stress occurring between the wiring board and the mother board can be relieved so as to increase the connection reliability.

As described above, according to the wiring board the process thereof of the present invention, electrodes on both sides of a silicon substrate are electrically connected via conductive patterns formed within the through holes. Accordingly, in a semiconductor device using this wiring board, stress of respective connection parts via metal bumps is reduced so as to enhance reliability and stability of the connection and wiring density are increased due to flatness and dimensional precision of the wiring board using silicon so that miniaturization, higher density and higher operational speed can be implemented.

In addition, wires can be made short by forming inclined planes wherein the inner angles made up of the inclined planes and the rear surface of the wiring board are obtuse angles as parts of the external form of the wiring board and an implementation of a semiconductor device on which semiconductor chips, of which the conductive patterns are protected, are mounted becomes possible by forming resin on the inclined planes and, furthermore, by forming a resin layer of low stress on the top surface or on the rear surface of the silicon substrate, stress occurring between the wiring board and the mother board can be relieved so as to increase the connection reliability.

Figure 42:
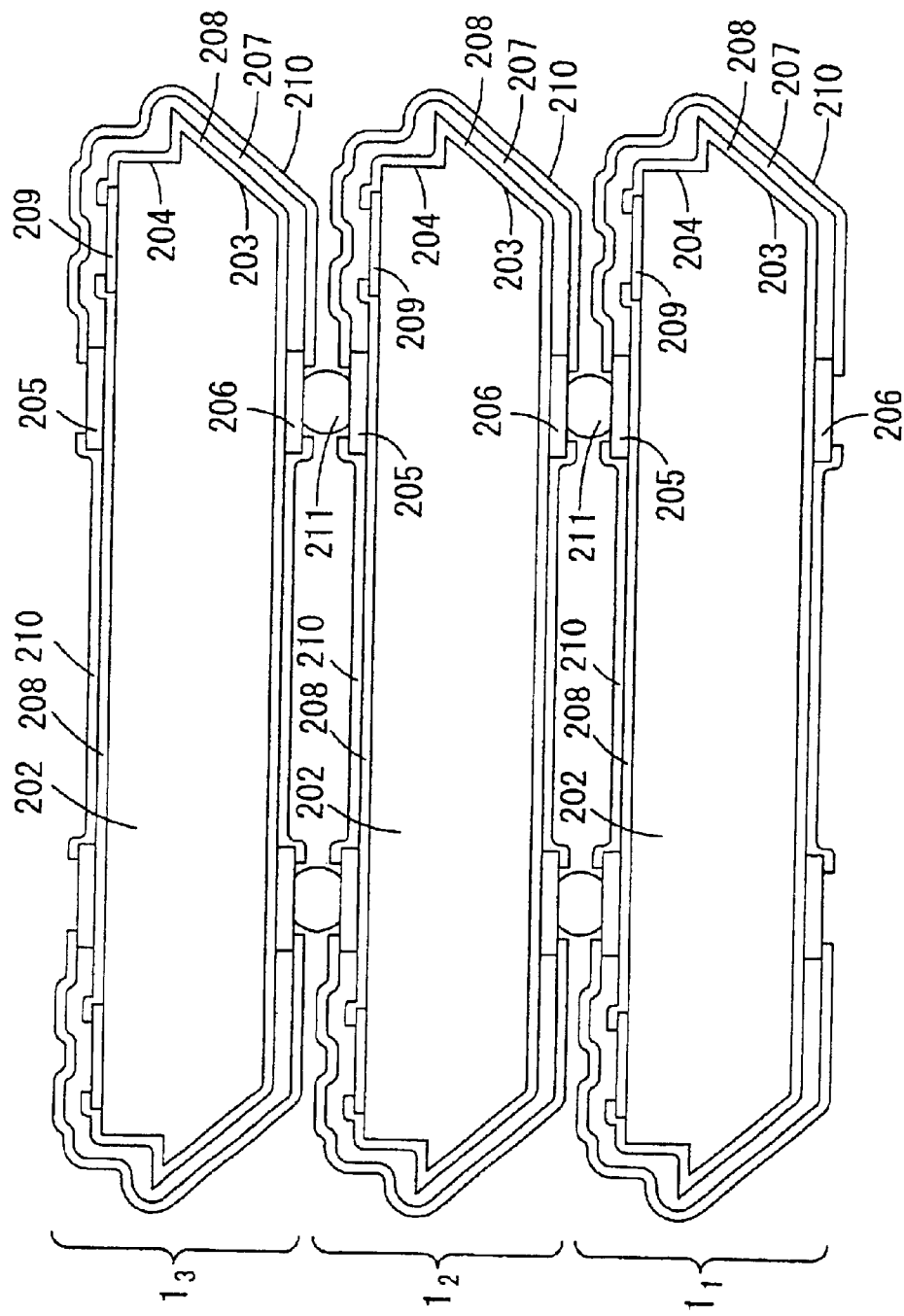
FIG. 42 is a cross section view of a multi-chip semiconductor device according to the eleventh embodiment of the present invention.

The eleventh embodiment of the present invention is described in reference to FIG. 42. FIG. 42 is a cross section view of a multi-chip semiconductor device according to the eleventh embodiment of the present invention. This multi-chip semiconductor device has a structure wherein three semiconductor chips $1_1$, $1_2$ and $1_3$ are layered. Respective semiconductor chips $1_1$, $1_2$ and $1_3$ are made of semiconductor substrates 202 which have, on the surface, elements (not shown) which are integrally formed and multi-layer conductive patterns (not shown) formed on the elements and the semiconductor substrates 202 have inclined planes 203 which are side surfaces formed so that acute angles are made up of the top surfaces and the side surfaces and a plurality of recesses 204 formed around the peripheries of the top surfaces and are formed of first electrodes 205 formed on the top surfaces, second electrodes 206 formed on the rear surfaces, conductive patterns 207 for connecting the first electrodes 205 and the second electrodes 206 are formed so as to expand on the top surfaces and on the rear surfaces by following in the recesses 204 and on the inclined planes 203. Insulating layers 208 are formed between the first electrodes 205 and the semiconductor substrates 202, between the second electrodes 206 and the semiconductor substrates 202 and between the conductive patterns 207 and the semiconductor substrates 202. In addition, respective semiconductor chips $1_1$, $1_2$ and $1_3$ are covered with an insulating layer 210 on the entire surface, except for the openings for the first electrodes 205 and the second electrodes 206. The first electrodes 205 of the semiconductor chip $1_1$ are electrically connected to the second electrodes 206 of the semiconductor chip $1_2$, for example via connection members 211, such as metal bumps. Thereby, the semiconductor chip $1_1$ is electrically connected to the semiconductor chip $1_2$. In the same manner, the first electrodes 205 of the semiconductor chip $1_2$ are electrically connected to the second electrodes 206 of the semiconductor chip $1_3$ via connection members 211 so that the semiconductor chip $1_2$ is electrically connected to the semiconductor chip $1_3$. In this manner, the semiconductor chips $1_1$, $1_2$ and $1_3$ are electrically connected to each other.

According to the present embodiment, the semiconductor chips $1_1$, $1_2$ and $1_3$ are layered on each other so as to be different from a conventional multi-chip semiconductor device wherein a plurality of semiconductor chips are arranged in a plane and there is no problem that the area of the device will increase as the number of semiconductor chips increases.

In addition, the connections are made via the electrodes 205 and 206 which are arranged on the top surfaces and the rear surfaces of the semiconductor chips $1_1$ to $1_3$ and, therefore, unlike a conventional multi-chip semiconductor device wherein the semiconductor chips $1_1$ to $1_3$ are layered on each other and connected through metal wires, there is no restriction such as wherein the higher the semiconductor chip is in the layers, the larger must be the area of the semiconductor chip so that the surface electrodes on the lower layer are exposed and it is possible not only to layer semiconductor chips of the same size but also, to layer semiconductor chips of different sizes in a desired order and, in addition, there is no problem such that the wire length between respective chips becomes long.

Furthermore, since the connections are made via the electrodes which are arranged on the top surfaces and the rear surfaces of the semiconductor chips, unlike a conventional multi-chip semiconductor device in a COC structure wherein the surfaces face each other so as to be connected, the number of layers of the semiconductor chips is not limited to two. Then, since only the semiconductor chips are layered, unlike a conventional multi-chip semiconductor device wherein the semiconductor chips are layered by using a wiring board, the height of the layers can be made low so that the size of the layered semiconductor chips can be equal to the mounting area of the device.

Therefore, according to the present embodiment, a multi-chip semiconductor device can be implemented wherein the mounting area is small, there are no limitations as to the size and layering order of the layered semiconductor chips, the wire length between respective semiconductor chips is short, the height of the layers is low and it is possible to make the number of layers of the semiconductor chips two, or more, and which can achieve miniaturization, higher density and higher operational speed.

Here, though in the present embodiment, the case where the number of layers of the semiconductor chips is three is described, in the case where the number of layers of the semiconductor chips is four, or more, a similar connection can be made in the structure of the present embodiment.

FIG. 43 is a cross section view of a multi-chip semiconductor device according to the twelfth embodiment of the present invention. Here, the same symbols as in FIG. 42 are attached to the parts corresponding to the multi-chip semiconductor device in FIG. 42, of which the detailed descriptions are omitted.

The present embodiment is an example wherein no connection members 211 are utilized for the connections of the respective electrodes 205 and 206. The first electrodes 205 of the semiconductor chip $1_1$ are directly connected to second electrodes 206 of the semiconductor chip $1_2$. Thereby, the semiconductor chip $1_1$ is electrically connected to the semiconductor chip $1_2$. The first electrodes 205 of the semiconductor chip $1_2$ are directly connected to the second electrodes 206 of the semiconductor chip 213 so as to be electrically connected. In this manner, the semiconductor chips $1_1$, $1_2$ and $1_3$ are electrically connected to each other.

According to the present embodiment, the electrodes are directly connected without using connection members and, thereby, the height of the layers can further be made lower and the wire length can be made shorter. Accordingly, a similar effect to the first embodiment can be gained and, in addition, a multi-chip semiconductor device can be implemented wherein the wire length between respective semiconductor chips is short and the height of the layers is low and which can achieve further miniaturization and a still higher operational speed.

FIGS. 44 to 46 are cross section views showing the steps of a process for a semiconductor chip of a multi-chip semiconductor device according to the thirteenth embodiment of the present invention.

Figure 44A:
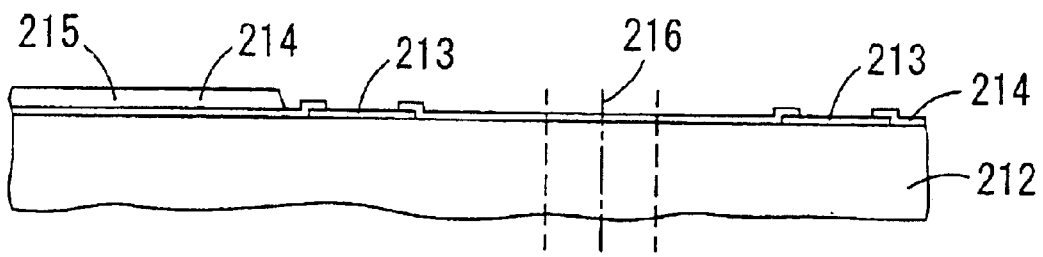
FIG. 44 is a cross section view of a step showing a surface formation method of a chip for a multi-chip semiconductor device according to the thirteenth embodiment of the present invention.

First, as shown in FIG. 44A, a semiconductor substrate 212 in a wafer condition is prepared. This semiconductor substrate 212 is gained after forming elements (not shown) and multi-layer conductive patterns (not shown) on the surface and surface electrodes 213 are provided in the multi-layer conductive patterns and an insulating layer 214 made of SiN and a resin layer 215 made of polyimide are formed in desired regions on the surface. Here, there are some cases where the insulating layer 214 and the resin layer 215 are formed of other materials or are not formed.

Figure 44B:
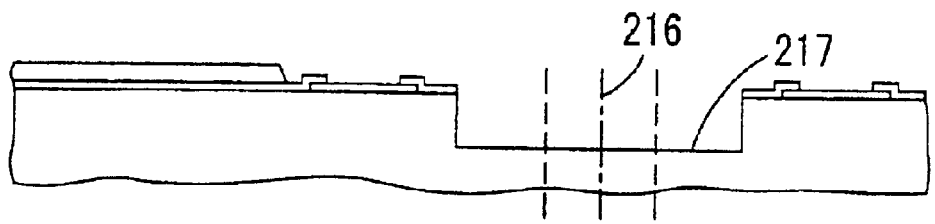

Next, as shown in FIG. 44B, a recess 217 is created in the surface of the semiconductor substrate 12 by means of an RIE method so as to cross the scribe line 216. At this time, a mask is formed so as not to etch the other parts and the mask is removed after etching. The depth of this recess 217 is 20 $\mu$m to 100 $\mu$m. A partial plan view at this time is shown in FIG. 47. FIGS. 44B and 47B are cross section views along line V–V' in FIG. 47A. Here, a method for creating the recess 217 is not limited to the RIE method but, rather, optical etching, wet etching, supersonic processing, discharge processing, or the like, can be used. In addition, the above processing methods may be combined.

Figure 44C:
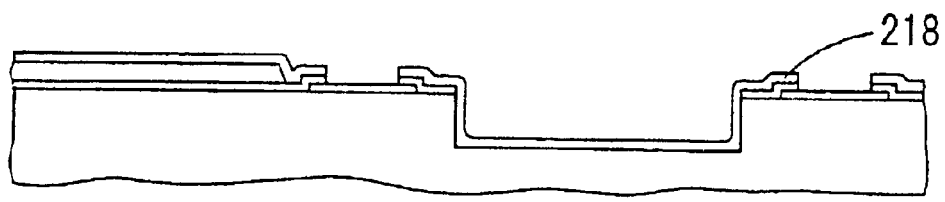

Next, as shown in FIG. 44C, a first insulating layer 218 is formed on the entire surface, including the inner walls, of the recess 217, except for on the openings for the surface electrodes 213. At this time, after forming the first insulating layer 218 on the entire surface, a mask is formed so that the first insulating layer 218 in the opening parts for the surface electrodes 213 is etched and, after that, the mask is removed. Here, as for the first insulating layer 218, a layer of $SiO_2$, SiN, SiON, polyimide film, or the like, is formed by means of a CVD method, a spattering method, an optical CVD method, an application method, or the like.

Figure 44D:
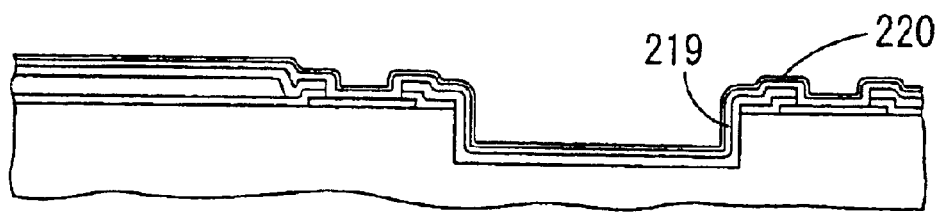

Next, as shown in FIG. 44D, a layered metal film wherein a barrier layer 219 and a seed layer 220 are sequentially layered is formed on the entire surface. As for the method for forming the barrier layer 219 and the seed layer 220, a spattering method, a CVD method or an electron beam deposition method is used. Ti, Ti/W, Cr or Ni is used for the barrier layer while Cu, Au, Ag or Ni is used for the seed layer.

Figure 44E:
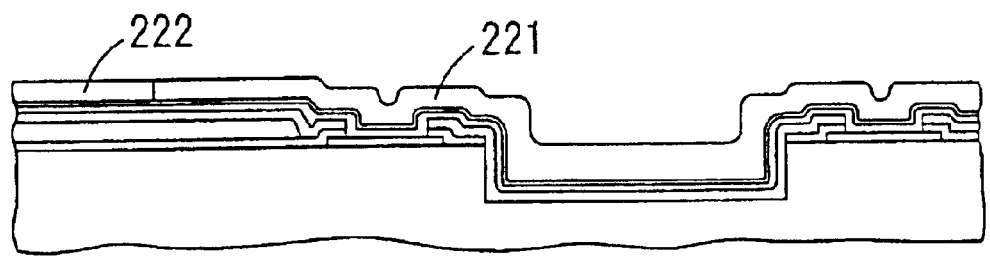

Next, as shown in FIG. 44E, the first conductive patterns 221 are formed by means of electrolytic plating by using the seed layer 220 as an electrode so as to fill in the recess 217 and so as to be in desired wire and electrode forms. At this time, in order to form desired wires and electrodes, a plating resist 222 is formed on the seed layer 220 so that the plating resist 222 is removed after electrolytic plating. As for the first conductive patterns, Cu, Au, W, Mo, Ni, Ti, Al, or the like, is used.

Figure 44F:
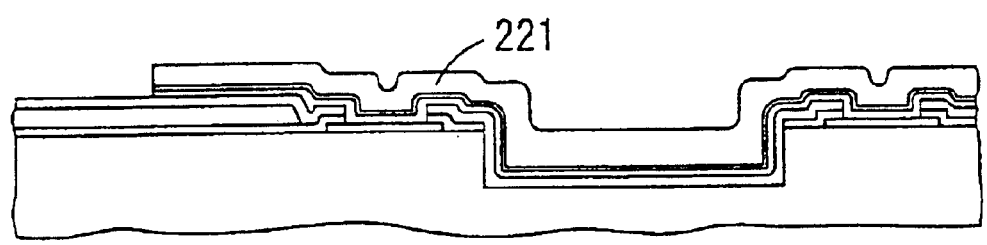

Next, as shown in FIG. 44F, the seed layer 220 in the region other than the region where the first conductive patterns 221 are formed is removed through etching by using the first conductive patterns 221 as a mask, and, in the same manner, the barrier layer 219 in the region other than the region where the first conductive patterns 221 are formed is removed through etching by using the first conductive patterns 221 as a mask.

Figure 44G:
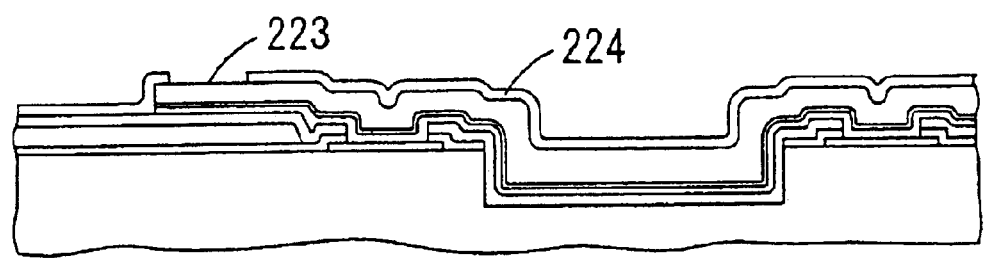

Next, as shown in FIG. 44G, a second insulating layer 224 is formed on the entire surface, except for the opening parts for the first electrodes 223. At this time, after forming the second insulating layer 224 on the entire surface, a mask is formed so that the second insulating layer 224 in the opening parts for the first electrodes 223 is etched and, after that, the mask is removed. Here, as for the second insulating layer 224, a layer of $SiO_2$, SiN, SiON, polyimide film, or the like, is formed by means of a CVD method, a spattering method, an optical CVD method, an application method, or the like.

As a result, only the first electrodes 223 electrically connected to the surface electrodes 213 are formed on the wafer surface in the condition of being exposed from the second insulating layer 224.

Figure 45A:
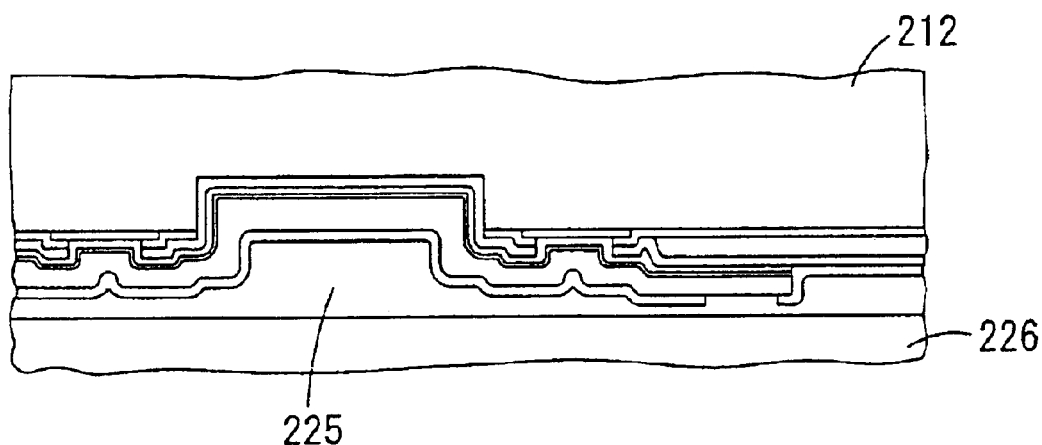
FIG. 45 is a cross section view of an earlier step showing a rear side formation method of a chip for a multi-chip semiconductor device according to the thirteenth embodiment of the present invention.

Next, as shown in FIG. 45A, the wafer surface is adhered to the support body 226 by means of the adhesive 225 and the semiconductor substrate 212 is polished from the rear surface so as to be made thin to the desired thickness. The polishing method may be a mechanical polishing or CMP. The thickness of the semiconductor substrate is 50 μm to 200 μm.

Next, as shown in FIG. 44B, the formation of the inclined planes 227 wherein acute angles are made up of the top surface and the inclined planes through bevel cutting starting from the rear surface of the semiconductor substrate 212, the exposure of the first conductive patterns 221 from the inclined planes 227 so as to be visible from the rear surface and the division into semiconductor chips 228 are carried out at the same time.

Here, the processing method may be etching.

Figure 45B:
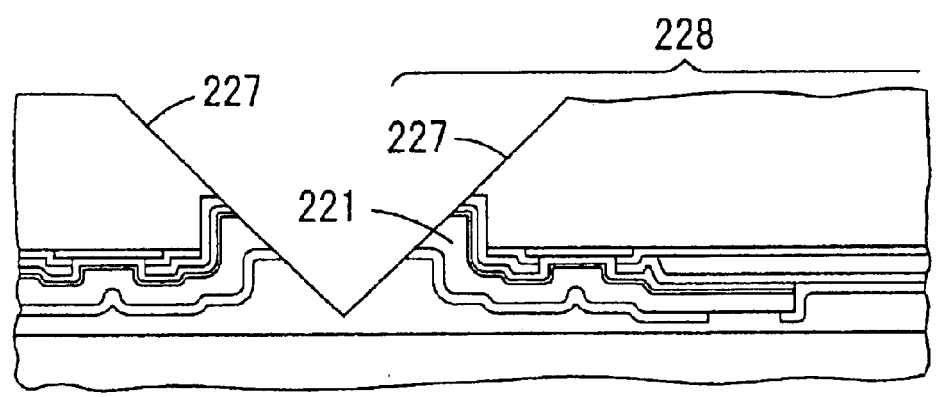
Figure 45C:
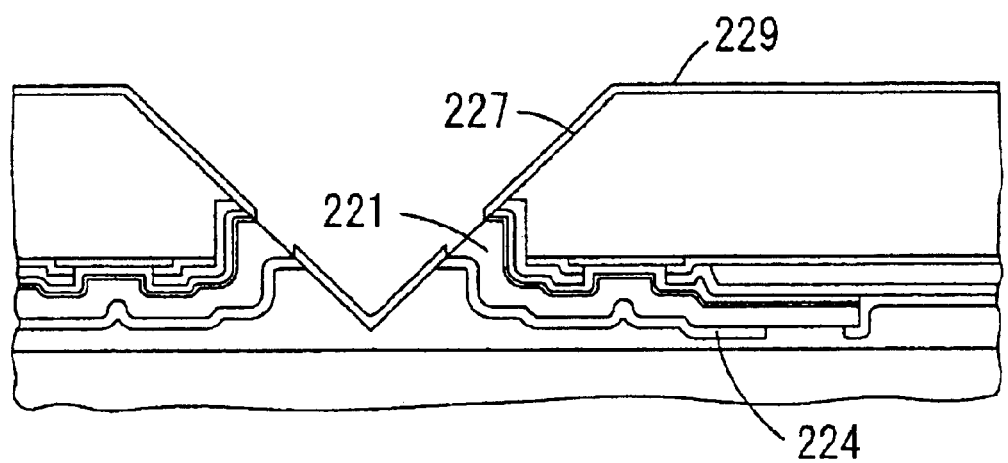

Next, as shown in FIG. 45C, a third insulating layer 229 is formed on the entirety of both the inclined planes 227 and the rear surface, except for the parts of the first conductive patterns 221 exposed from the inclined planes 227. At this time, after forming the third insulating layer 229 on the entirety of both the inclined planes 227 and the rear surface, a mask is formed so that the third insulating layer 229 in the opening parts for the first conductive patterns 221 are etched and, after that, the mask is removed. Here, as for the third insulating layer 229, a layer of $SiO_2$, SiN, SiON, polyimide film, or the like, is formed by means of a CVD method, a spattering method, an optical CVD method, an application method, or the like.

The third insulating layer 229 is preferably formed of a material of which the etching rate is faster than that of the first insulating layer 218 and the second insulating layer 224.

Thereby, at the time of creating openings by etching the third insulating layer 229, the first insulating layer 218 and the second insulating layer 224 are hardly etched even when the mask shifts so that the openings can be created by selectively etching the third insulating film 229 without partially removing the first insulating layer 218 or the second insulating layer 224 which cover the first conductive patterns 221.

Figure 45D:
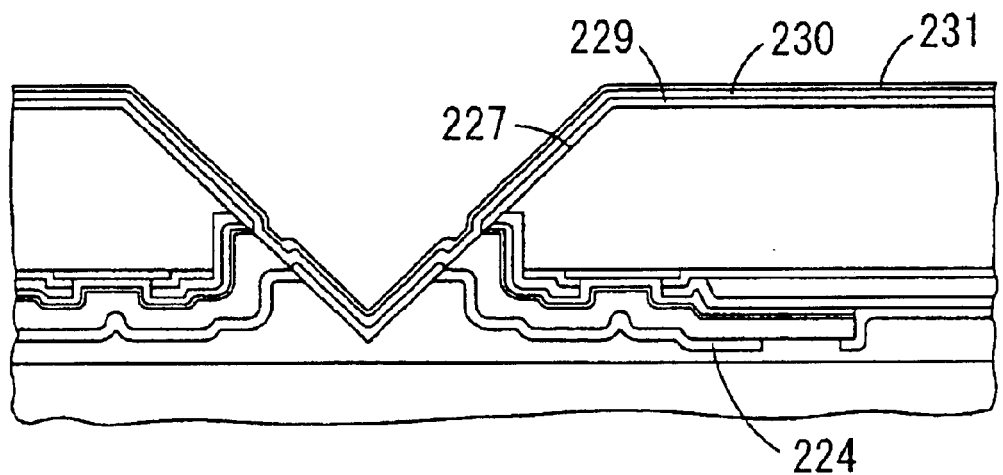

Next, as shown in FIG. 45D, a layered metal film, wherein a barrier layer 230 and a seed layer 231 are sequentially layered, is formed on the entirety of both the inclined planes 227 and the rear surface. As for a method for forming the barrier layer 230 and the seed layer 231, a spattering method, a CVD method, an electron beam deposition method, or the like, is used. Ti, Ti/W, Cr or Ni is used for the barrier layer 230 while Cu, Au, Ag or Ni is used for the seed layer 231.

Figure 46A:
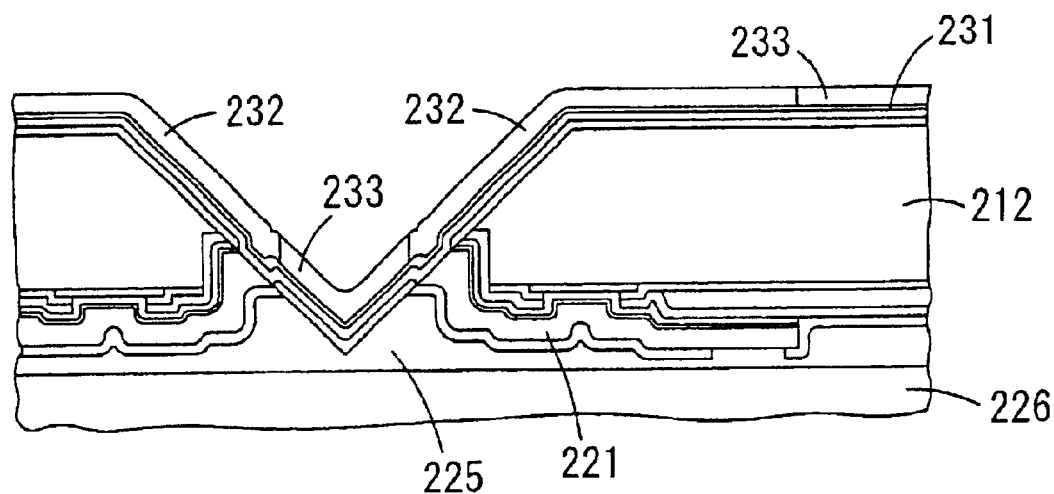
FIG. 46 is a cross section view of a latter step showing a rear side formation method of a chip for a multi-chip semiconductor device according to the thirteenth embodiment of the present invention.

Next, as shown in FIG. 46A, the second conductive patterns 232 are formed on the inclined planes 227 and on the rear surface by means of electrolytic plating using the seed layer 231 as an electrode in desired wire and electrode forms so as to connect to the first conductive patterns 221 which are exposed from the inclined planes 227. At this time, in order to form desired wires and electrodes, a plating resist 233 is formed on the seed layer 231 so that the plating resist 233 is removed after electrolytic plating. As for the second conductive patterns 232, Cu, Au, W, Mo, Ni, Ti, Al, or the like, is used.

Figure 46B:
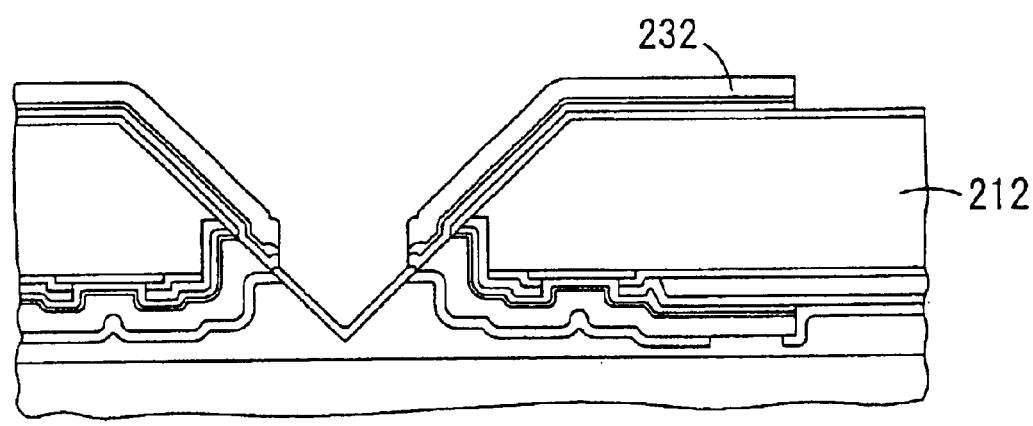

Next, as shown in FIG. 46B, the seed layer 231 in the region other than the region where the second conductive patterns 232 are formed is removed through etching by using the second conductive patterns 232 as a mask and, in the same manner, the barrier layer 230 in the region other than the region where the second conductive patterns 232 are formed is removed through etching by using the second conductive patterns 232 as a mask.

Next, as shown in FIG. 46C, a fourth insulating layer 235 is formed on the entirety of both the inclined planes 227 and the rear surface except for the opening parts for the second electrodes 234 and the scribe line 216. At this time, after forming the fourth insulating layer 235 on the entirety of both the inclined planes 227 and the rear surface, a mask is formed so that the fourth insulating layer 235 in the opening parts for the second electrodes 234 and the fourth insulating layer 235 and the third insulating layer 229 on the scribe line 216 are etched and, after that, the mask is removed. Here, as for the fourth insulating layer 235, a layer of $SiO_2$, SiN, SiON, polyimide film, or the like, is formed by means of a CVD method, a spattering method, an optical CVD method, an application method, or the like.

Next, as shown in FIG. 46D, the adhesive 225 and the support body 226 are removed and the semiconductor chip 228 is divided into pieces.

As a result of this, only the first electrodes 223 are formed on the surface of the semiconductor chip 228 in the condition of exposure from the second insulating layer 224 and only the second electrodes 234 are formed on the rear surface in the condition of exposure from the fourth insulating layer 235 on the rear surface so that the structure is completed wherein the surface electrodes 213, the first electrodes 223 and the second electrodes 234 are electrically connected to each other.

As described above, the present embodiment is provided with the step of forming a recess 217 in the surface of the semiconductor substrate 212 so as to cross the scribe line 216 and the step of bevel cutting along the scribe line 216 starting from the rear surface and, thereby, the structure can be formed which has the first electrodes 223 and the second electrodes 234, which are electrically connected to each other and which are also electrically connected to the surface electrodes 213, on the top surface and the rear surface, respectively, of the semiconductor substrate 212.

Therefore, according to the present embodiment, after forming the first conductive patterns 221 on the top surface of the semiconductor substrate 212 wherein the recess 217 is formed, only by forming the second conductive patterns 232 on the rear surface in which the inclined planes 227 where the top surface and the inclined planes form acute angles, can wires that have connections from the top surface to the rear surface be gained so that electrically connected electrodes on the two sides can be easily formed.

In addition, according to the present embodiment, after forming first conductive patterns 221 within the recess 217 formed in the wafer condition, the surface is cut so as to form acute angles in the center part of the recess 217 and, thereby, parts of the first conductive patterns 221 for wiring can be made visible from the rear surface and it is not necessary to form the recess 217 extremely deeply while it is also not necessary to polish the semiconductor substrate 212 so as to become extremely thin so that the freedom of setting the thickness of the semiconductor chip 228 is large, the number of manufacturing steps can be reduced and the cost for the chips for a multi chip semiconductor device can be reduced.

Furthermore, according to the present embodiment, the step of forming the first electrodes 223 and the step of forming the first conductive patterns 221 can be carried out simultaneously while the step of forming the second electrodes 234 and the step of forming the above described second conductive patterns 234 can be carried out simultaneously and, thereby, the number of manufacturing steps can further be reduced.

In addition, according to the present embodiment, the formation of the inclined planes 227, where the top surface and the inclined planes form acute angles, through bevel cutting, the division of the semiconductor chip 228 into pieces and the conversion of the first conductive patterns into the condition of being visible from the rear surface can be carried out simultaneously so that the number of manufacturing steps and the manufacturing costs can be reduced to a great extent in comparison with the case of the formation by means of other methods.

Then, since a barrier layer (219, 230) and a seed layer (220, 231) are formed without fail beneath the first conductive patterns 221 and the second conductive patterns 232, the characteristic deterioration of the semiconductor chip due to the diffusion of the component elements of the first conductive patterns 221 and the second conductive patterns 232 into the surface electrodes 213 and the semiconductor substrate 212 can be prevented by the barrier layer (219, 230) and the first conductive patterns 221 and the second conductive patterns 232 can be formed by means of an electrolytic plating using the seed layer (220, 231).

Figure 49:
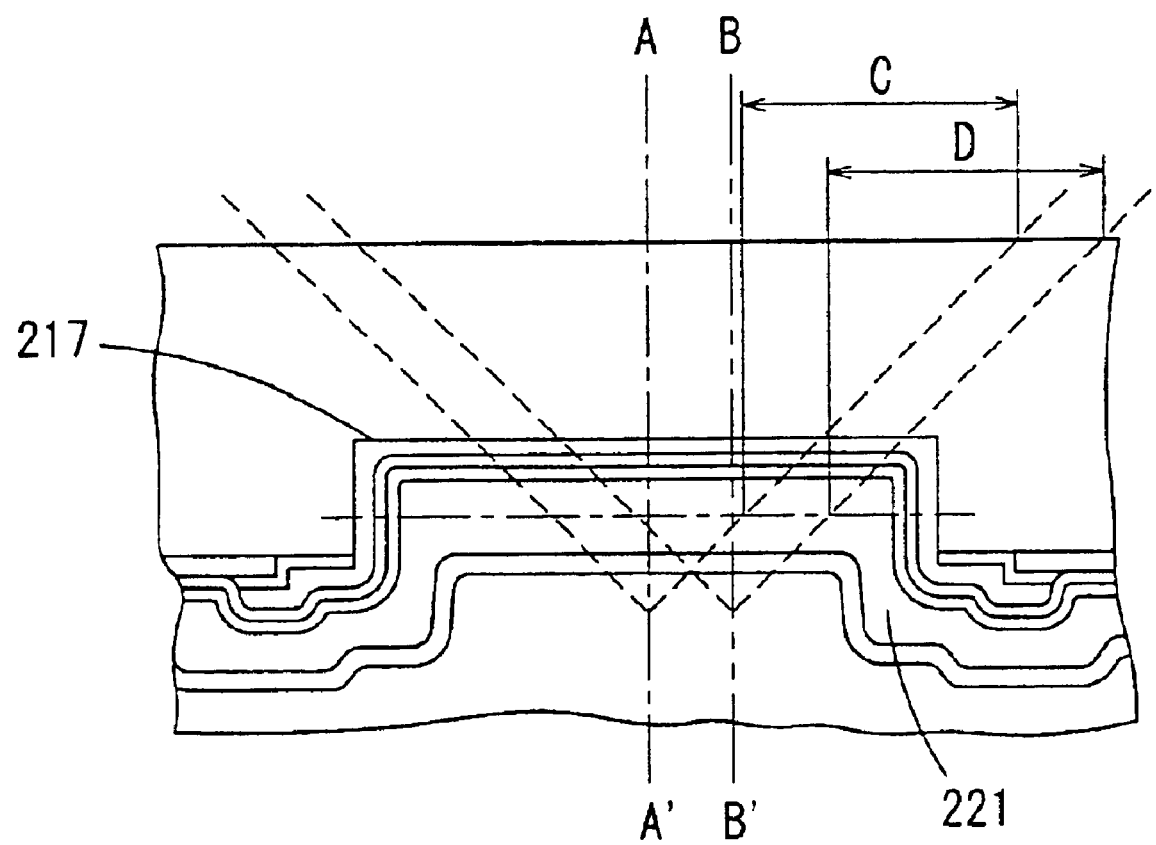
FIG. 49 is a cross section view showing the case where the bevel cut line is shifted.

FIG. 49 is a cross section view showing the case where the lines of bevel cutting shift in the step of FIG. 45B and the same symbols as in FIG. 45 are attached to the corresponding components of FIG. 49. In FIG. 49, A–A' shows a line to be cut according to the original plan while B–B' shows a case of shifting. The width of the recess is made to be sufficiently broad so that the bottom of the recess 217 is always cut through even in the above case of shift and, thereby, the distances C and D starting from the center of a first conductive pattern 221, which is exposed from one of the inclined planes that are formed by being cut along respective lines, to the contact point between the inclined plane and the rear surface become equal so that the form and the positions of the exposed first conductive patterns 221 can be stabilized.

Figure 50:
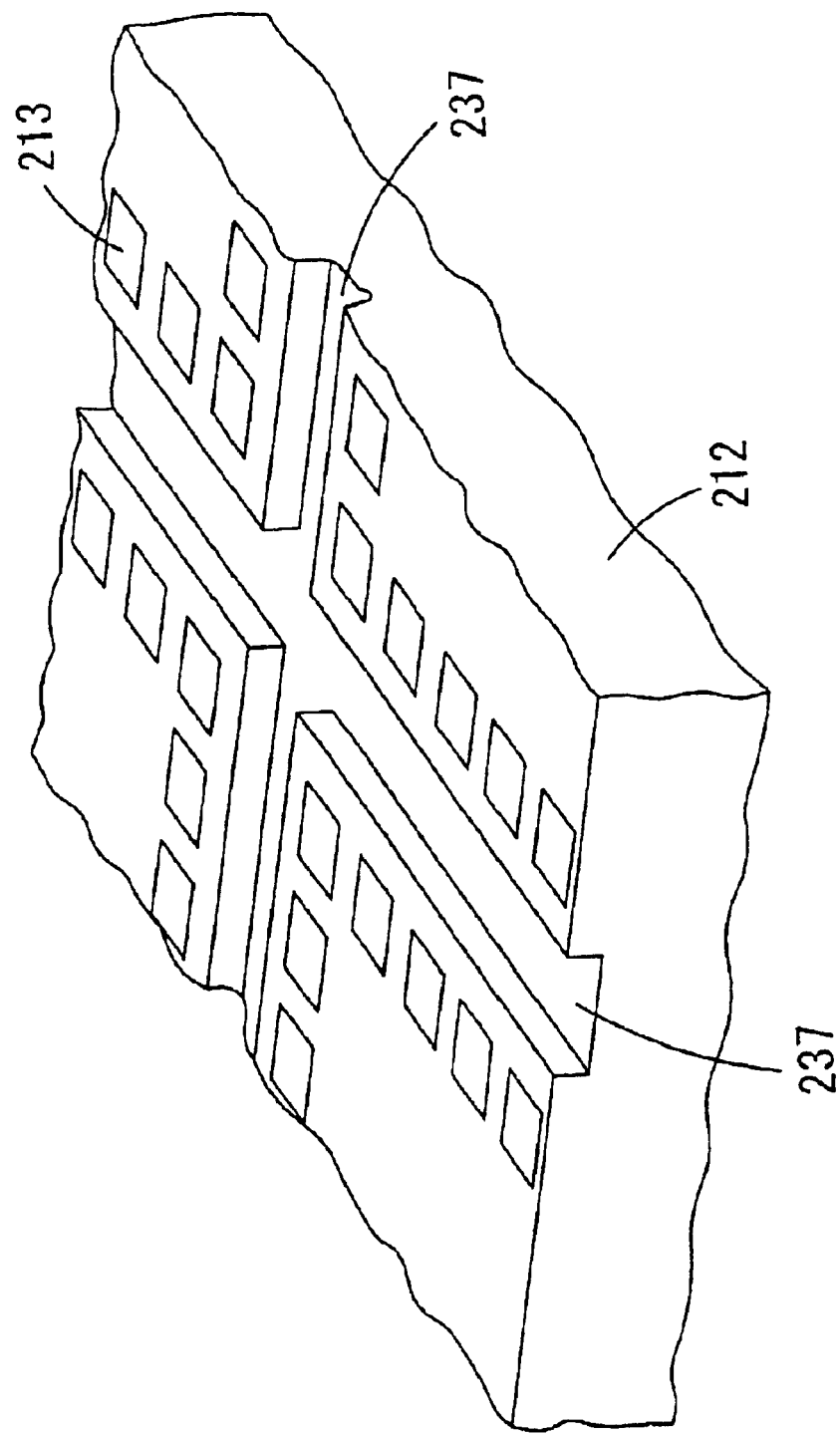
FIG. 50 is a perspective view showing another method of a recess formation.

FIG. 50 is a view showing another method in the step of FIG. 44B and the same symbols are attached to the components in common with those in FIG. 44. Instead of the recess 217 in the step of FIG. 44B, a trench 237 is created through dicing so as to cross the scribe line 216 in the surface of the semiconductor substrate 212. The depth of this trench 237 is 20 $\mu$m to 100 $\mu$m. Through simultaneous creation by means of dicing, the trench can be formed in a fewer number of steps and in a shorter period of time in comparison with the case of creation through etching.

Figure 48A:
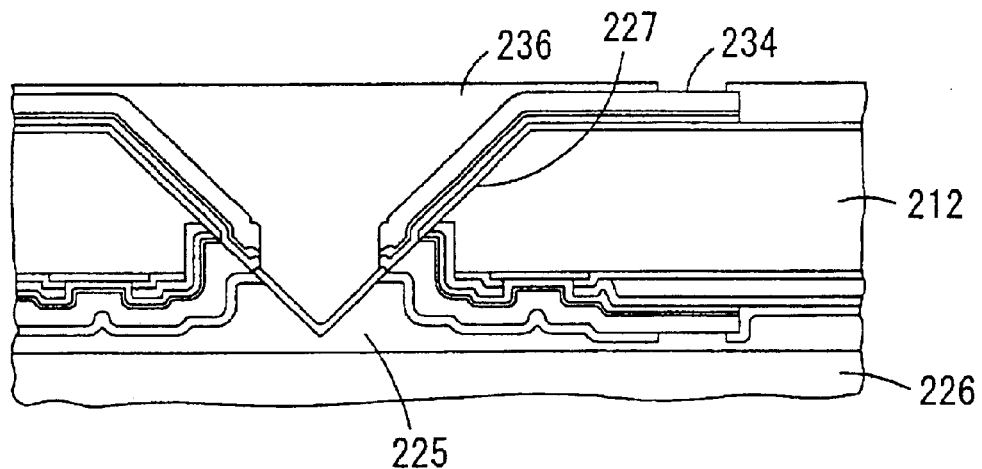
FIG. 48 is a cross section view of a step showing a manufacturing process of a semiconductor chip for a multi-chip semiconductor device according to the fourteenth embodiment of the present invention.

FIG. 48 is a cross section view showing the steps of a process for a semiconductor chip for a multi-chip semiconductor device according to the fourteenth embodiment of the present invention. Here, the same symbols as in FIGS. 44, 45 and 46 are attached to the components corresponding to those of the chip for a multi-chip semiconductor device in FIGS. 44, 45 and 46, of which the detailed descriptions are omitted. In the present embodiment, after the step of FIG. 46B of the thirteenth embodiment, as shown in FIG. 48A, an insulating resin layer 236 is formed by applying a liquid resin on the entirety of both the inclined planes 227 and the rear surface, except for the opening parts for the second electrodes 234, so as to achieve flatness and by curing the liquid resin. Here, though in the present embodiment, the additional step takes place after the step of FIG. 46B, it may take place after the step of FIG. 46C. The liquid resin, such as a polyimide, can preferably relieve stress.

Figure 48B:
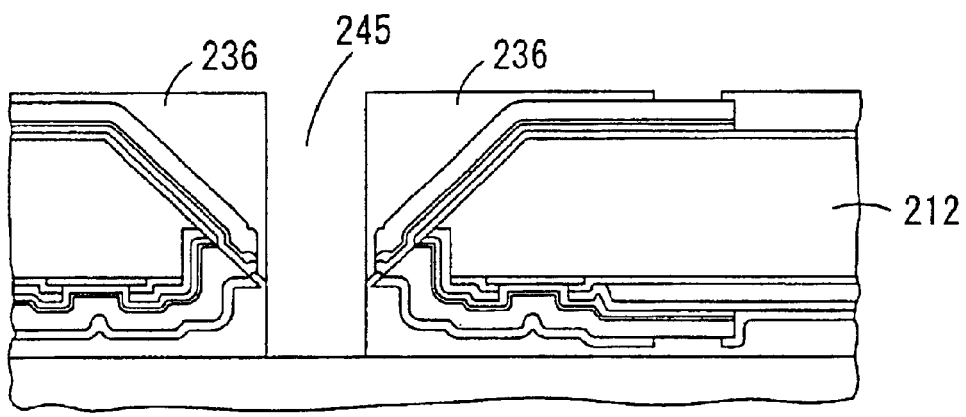

Next, as shown in FIG. 48B, dicing is carried out on the rear surface so that side surfaces perpendicular to the top surface are formed.

Figure 48C:
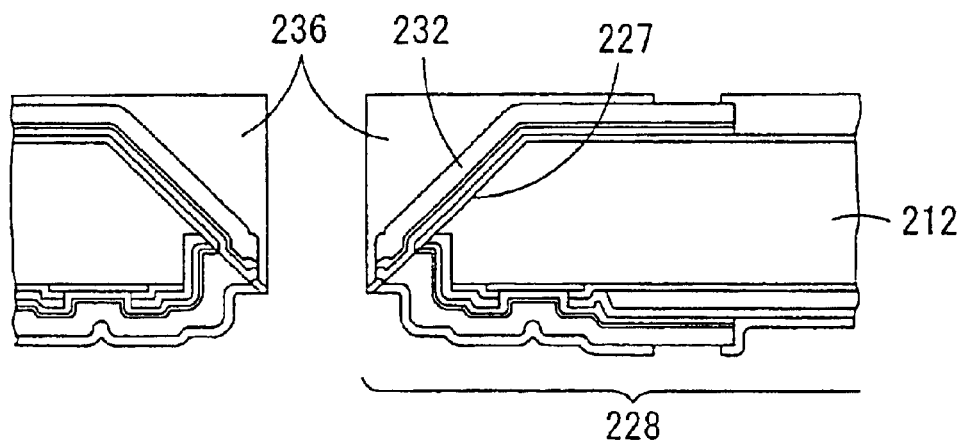

Next, as shown in FIG. 48C, the adhesive 225 and the support body 226 are removed and the semiconductor chip 228 is divided into pieces.

As described above, in the present embodiment the side surfaces formed of the inclined planes 227 can be covered with a liquid resin and, by dicing parts of the cured liquid resin, side surfaces formed of thick insulating resin layers 236 which are perpendicular to the top surface can be gained and, at the same time, the chip can be divided into pieces.

Accordingly, the side surfaces of the chips for a multi-chip semiconductor device can be reinforced and the protection of the second conductive patterns 232 on the inclined planes 227 can be enhanced.

Figure 51:
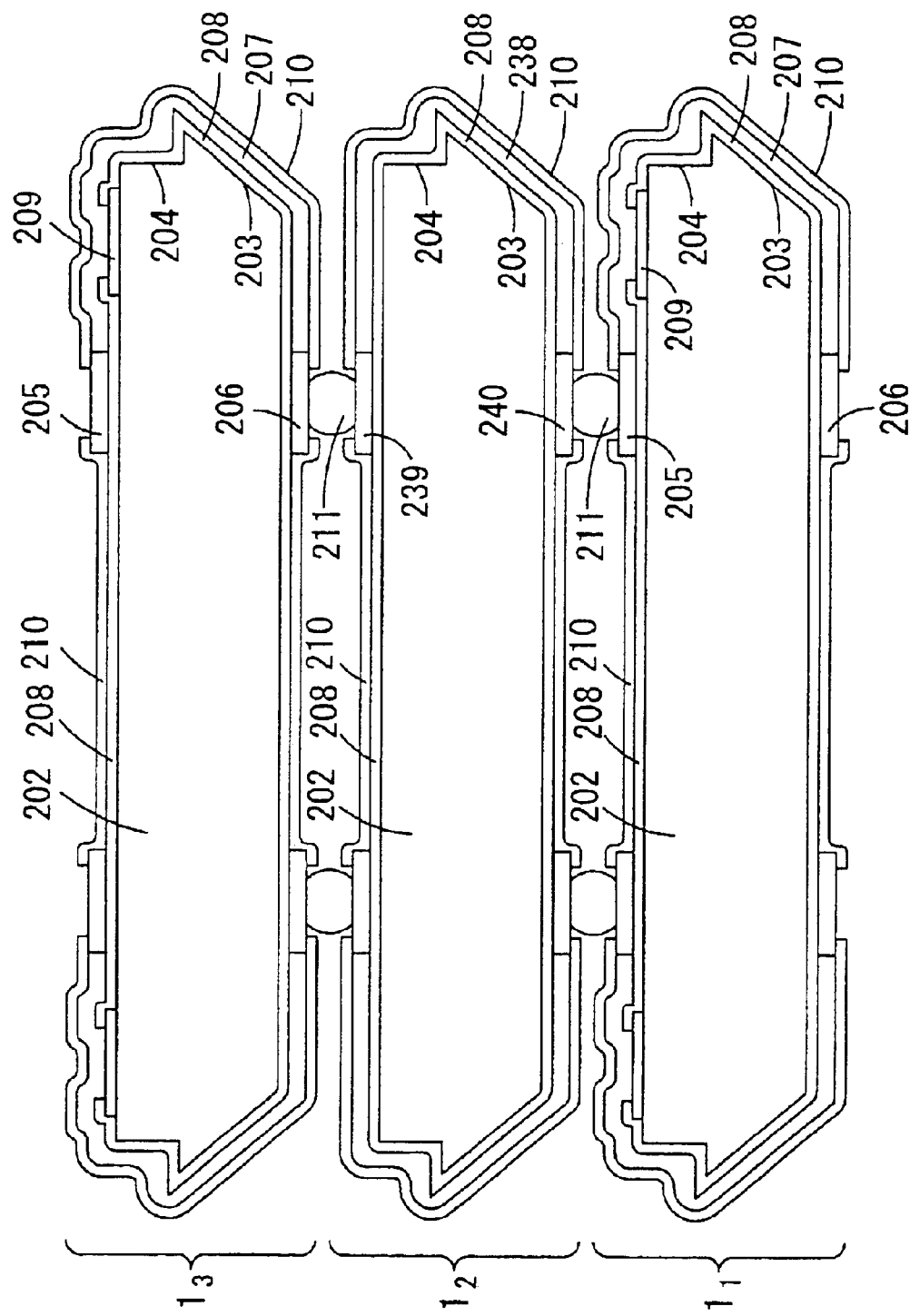
FIG. 51 is across section view of a multi-chip semiconductor device according to the fifteenth embodiment of the present invention.

FIG. 51 is across section view of a multi-chip semiconductor device according to the fifteenth of the present invention. Here, the same symbols as in FIG. 42 are attached to the components corresponding to those of the multi-chip semiconductor device in FIG. 42, of which the detailed descriptions are omitted.

The characteristic of the present embodiment is that at least one of the electrically connected electrodes on the two sides formed on the semiconductor chip $1_2$ is not connected to the surface electrodes.

This multi-chip semiconductor device has a structure wherein three semiconductor chip $1_1$, $1_2$ and $1_3$ are layered on each other. As for the semiconductor chips $1_1$ and $1_3$, the first electrodes 205 formed on the top surface, the second electrodes 206 formed on the rear surface and the surface electrodes 209 are electrically connected through the conductive patterns 207 and the semiconductor chip $1_2$ has the conductive patterns 238 which are not electrically connected to at least one surface electrode 209 and the conductive patterns 238 electrically connect the first electrodes 239 formed on the top surface and the second electrodes 240 formed on the rear surface.

Thereby, the first electrodes 205 of the semiconductor chip $1_1$ electrically connected to the second electrodes 240 of the semiconductor chip $1_2$ and the second electrodes 206 of the semiconductor chip $1_3$ electrically connected to the first electrodes 239 of the semiconductor chip $1_2$ are electrically connected to each other but they are not connected to the integrated circuit of the semiconductor chip $1_2$. Therefore, according to the present embodiment, in the case that the electrodes (205, 206), which are not necessary to be electrically connected to integrated circuit of the semiconductor chip $1_2$ and which are desired to be electrically connected to each other, are provided in the semiconductor chips $1_1$ and $1_3$, the semiconductor chip $1_2$ can be bypassed by connecting these electrodes (205, 206) to the electrically connected electrodes on the two sides (239, 240), which are not electrically connected to the integrated circuit formed in the semiconductor chip $1_2$.

Figure 52:
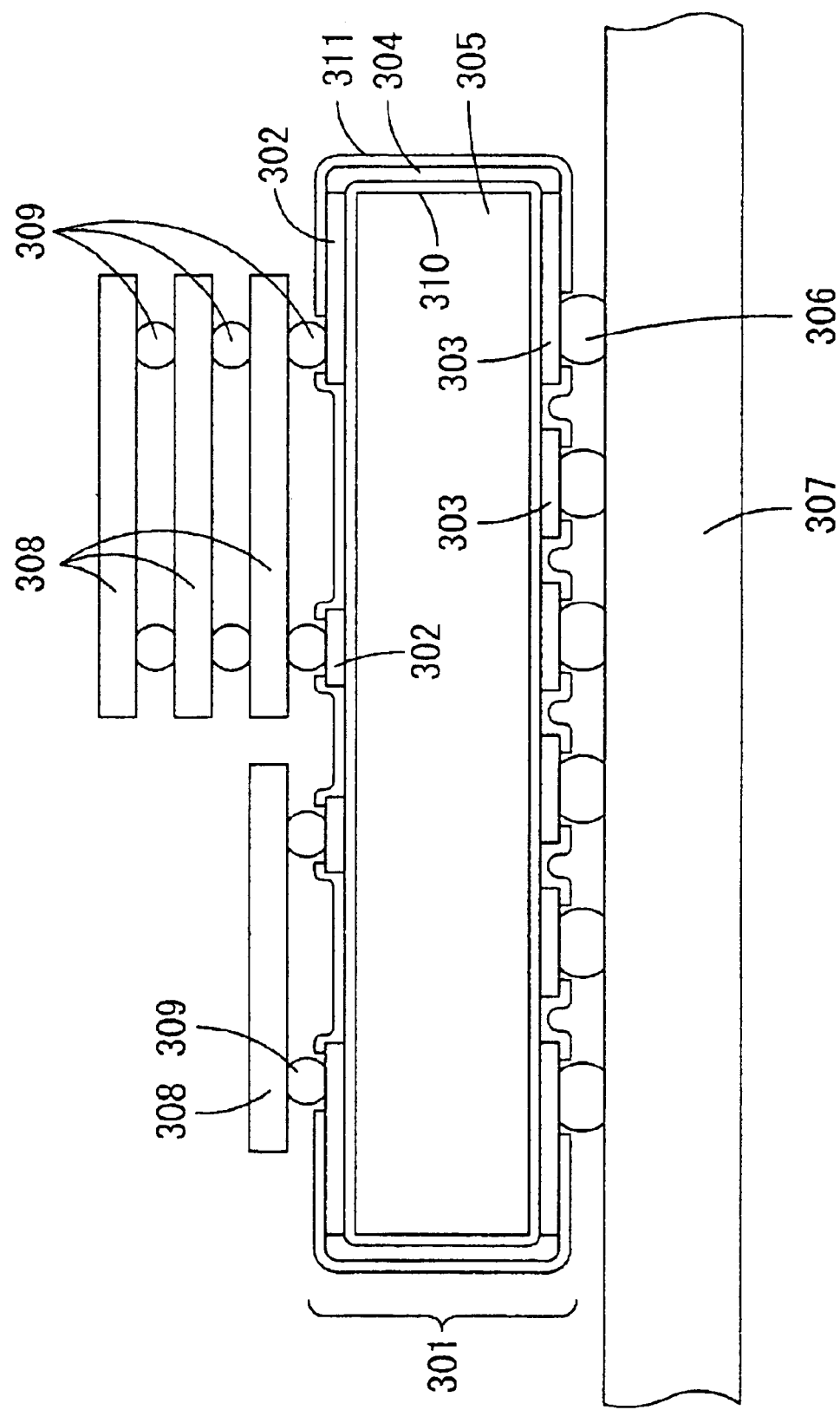
FIG. 52 is a cross section view of a multi-chip semiconductor device using a silicon wiring board according to the sixteenth embodiment of the present invention.

The sixteenth embodiment of this invention is described in reference to FIG. 52. FIG. 52 is a cross section view of a multi-chip semiconductor device using a silicon wiring board of the sixteenth embodiment of this invention.

As shown in FIG. 52, this multi-chip semiconductor device has a configuration wherein a single, or a plurality of, layered electronic part(s) such as a plurality of semiconductor chips 308, or the like, is (are) mounted on the surface of a silicon wiring board 301, which is mounted on a mother board 307 by using solder balls 306. The silicon wiring board 301 has a silicon substrate 305 made of silicon and is manufactured of first conductive patterns 302 formed on the top surface, second conductive patterns 303 formed on the rear surface and third conductive patterns 304 formed on the side surfaces. The first conductive patterns 302 and the second conductive patterns 303 are electrically connected via the third conductive patterns 304. The first conductive patterns 302 are used for mounting and for wiring electronic parts 308 and are made of, at least, one layer while the second conductive patterns 303 have electrodes for being mounted to the mother board 7 and are made of, at least, one layer.

In addition, an insulating layer 310 is formed between the first conductive patterns 302 and the silicon substrate 305, between the second conductive patterns 303 and the silicon substrate 305 and between the third conductive patterns 304 and the silicon substrate 305 and these conductive patterns and the substrate are electrically insulated from each other. The silicon wiring board 301 is covered with the insulating layer 311 on the entire surface other than the electrode parts of the first conductive patterns 302 and the electrode parts of the second conductive patterns 303. The semiconductor chip 308 is electrically connected to the first conductive patterns 302 on the silicon wiring board 301 via metal bumps 309. The second conductive patterns 303 on the silicon wiring board 301 are electrically connected to the mother board 7 via solder balls 306. In this manner, a plurality of semiconductor chips 308 are, respectively, electrically connected to the respective semiconductor chips 308 via the silicon wiring board 301 and are also electrically connected to the mother board 307.

As for the above described wiring board for a multi-chip semiconductor device, the step of forming the first conductive patterns 302 on the surface of a silicon wafer, the step of forming the second conductive patterns 303 on the rear surface of the silicon wafer, the step of forming side surfaces by dividing the silicon wafer into silicon substrate 305 pieces and the step of forming the third conductive patterns 304, which electrically connect the first conductive patterns 302 and the second conductive patterns 303, on the side surfaces are carried out.

In addition, after the step of forming the first conductive patterns, the step of forming the side surfaces by dividing the silicon wafer into silicon substrate pieces is carried out and, after that, the step of forming the second conductive patterns and the step of forming the third conductive patterns may be carried out simultaneously.

According to this embodiment, a wiring board of which the base material is silicon can be gained and in a multi-chip semiconductor device using this, stress of the connection parts of metal bumps is reduced so as to increase reliability, the flatness and dimensional precision of the wiring board enhances the stability of the connection, an increase in wiring density is made possible at a level that cannot be achieved by a resin wiring board so that miniaturization, higher density and higher operational speed can be implemented.

Figure 53:
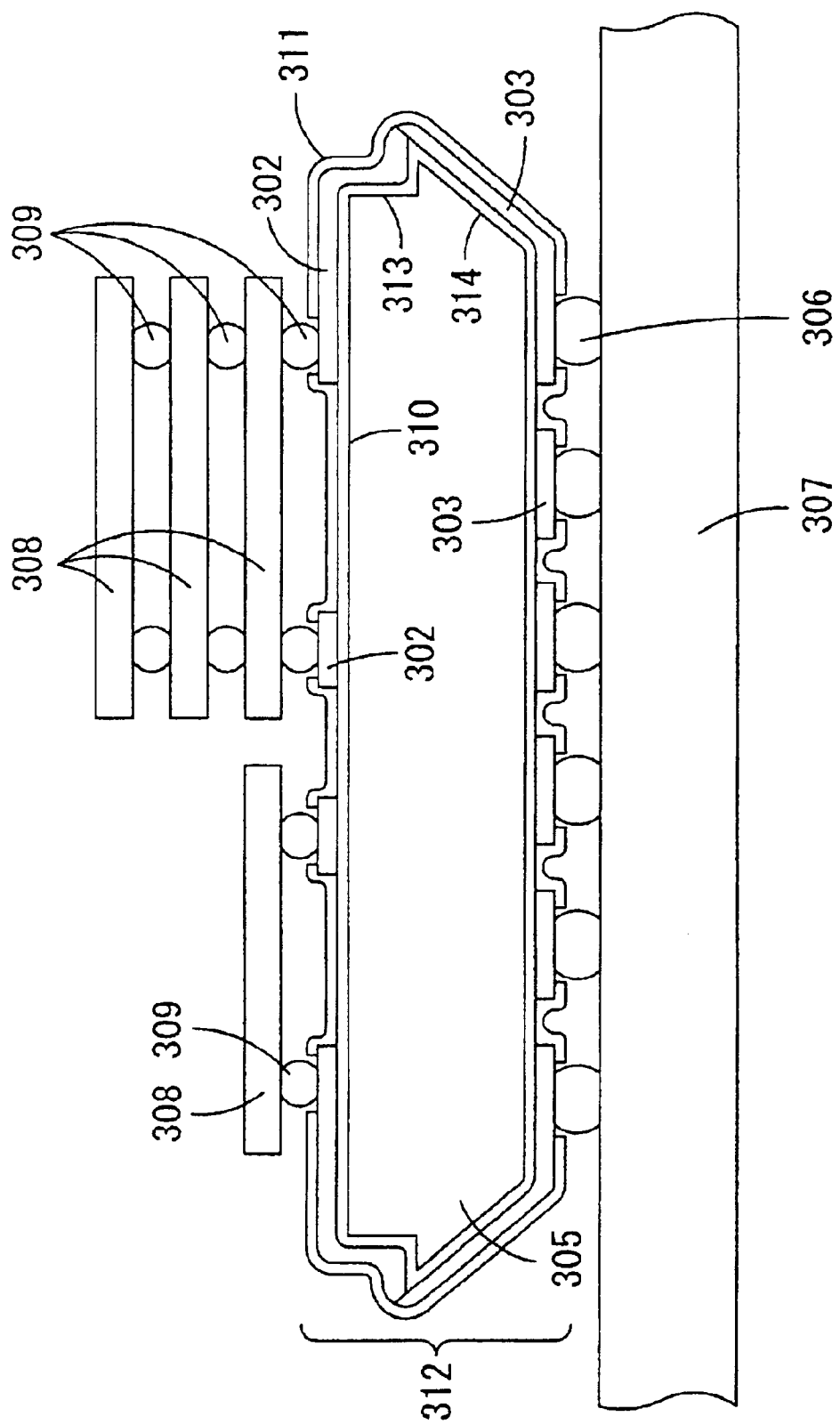
FIG. 53 is a cross section view of a multi-chip semiconductor device using a silicon wiring board according to the seventeenth embodiment of the present invention.

The seventeenth embodiment of this invention is described in reference to FIG. 53. FIG. 53 is a cross section view of a multi-chip semiconductor device using a silicon wiring board of the seventeenth embodiment of this invention.

As shown in FIG. 53, this multi-chip semiconductor device has a structure wherein a single, or a plurality of, layered electronic part(s) such as semiconductor chip(s) 308 is (are) mounted on the surface of a silicon wiring board 312, which is mounted to a mother board 307 by using solder balls 306. The silicon wiring board 312 is made of a silicon substrate 305 and this silicon substrate 305 has inclined planes 314, which are four side surfaces formed so that the side surfaces and the top surface form acute angles, and a plurality of recesses 313 created around the top surface and is constructed of the first conductive patterns 302 formed on the top surface and in the recess 313 and of the second conductive patterns 303 formed on the rear surface and on the inclined planes 314. The first conductive patterns 302 and the second conductive patterns 303 are directly electrically connected at the points where the recess 313 and the inclined planes 314 join. The first conductive patterns 302 are for mounting and for wiring the electrode parts 308 and are formed of, at least, one layer while the second conductive patterns 303 have electrodes for being mounted to the mother board 307 and are formed of at least one layer. In the case that the silicon substrate 312 is utilized upside down, the first conductive patterns 302 have electrodes for being mounted to the mother board 317 and are formed of at least one layer while the second conductive patterns 303 are for mounting and for wiring electronic parts and are formed at least one layer.

In addition, an insulating layer 310 is formed between the first conductive patterns 2 and the silicon substrate 305 as well as between the second conductive patterns 303 and the silicon substrate 305 so that the conductive patterns and the substrate are electrically insulated from each other. The silicon wiring board 312 is covered with an insulating layer 311 on the entire surface other than the electrode parts for the first conductive patterns 302 and the electrode parts for the second conductive patterns 303. The semiconductor chip 308 is electrically connected to the first conductive patterns 302 on the silicon wiring board 311 via metal bumps 309. The second conductive patterns 303 on the silicon wiring board 312 are electrically connected to the mother board 307 via solder balls 306. In this manner, a plurality of semiconductor chips 308 are, respectively, electrically connected to respective semiconductor chips 308 via the silicon wiring board 301 and, at the same time, are electrically connected to the mother board 307.

According to this embodiment, a wiring board of which the base material is silicon can be easily gained and in a multi-chip semiconductor device using this, stress of the connection parts of metal bumps is reduced so as to increase reliability, the flatness and dimensional precision of the wiring board enhances the stability of the connection, an increase in wiring density is made possible at a level that cannot be achieved by a resin wiring board so that miniaturization, higher density and higher operational speed can be implemented.

Figure 54:
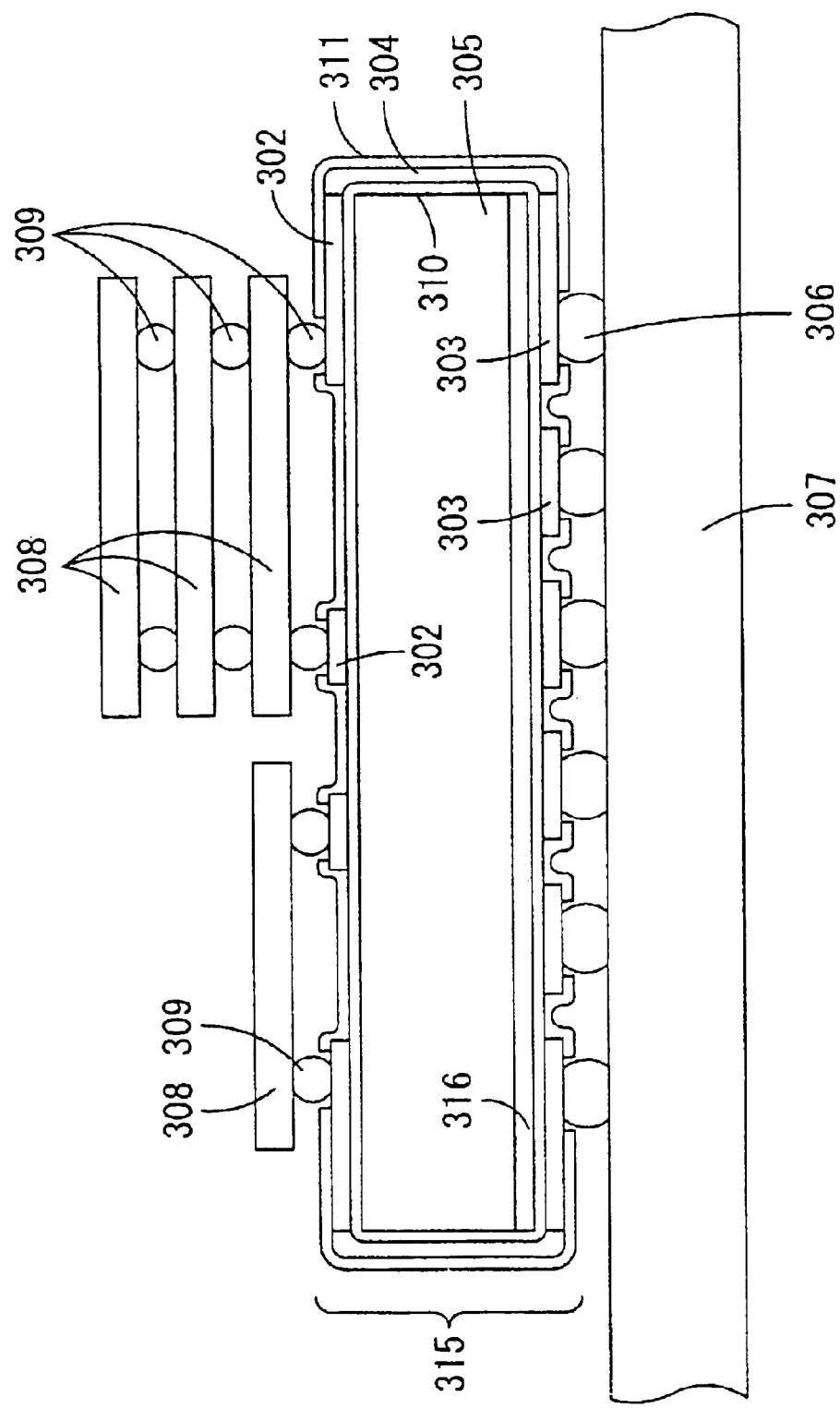
FIG. 54 is across section view of a multi-chip semiconductor device using a silicon wiring board according to the eighteenth embodiment of the present invention.

The eighteenth embodiment of this invention is described in reference to FIG. 54. FIG. 54 is a cross section view of a multi-chip semiconductor device using a silicon wiring board of the third embodiment of this invention. As shown in FIG. 54, the silicon wiring board 315 of this multi-chip semiconductor device has a resin layer 316 of low stress between the second conductive patterns 303 and the silicon substrate 305. Here, the same symbols as in FIG. 52 are attached to the components corresponding to those of the multi-chip semiconductor device in 52, of which the detail descriptions are omitted.

According to this embodiment, stress due to temperature change occurring between the mother board and the semiconductor device can be relieved by the resin layer so as to enhance the reliability of the mounting to the mother board. In addition, the resin layer 316 of this embodiment may be applied to the multi-chip semiconductor device of FIG. 53. Though, in the present embodiment, the case is shown where the second conductive patterns 303 are connected to the mother board 307, the resin layer 316 of low stress is formed between the first conductive patterns 302 and the silicon substrate 305 in the case that the semiconductor device is utilized upside down, that is to say, in the case that the first conductive patterns 303 are connected to the motherboard 307. In addition, in order to further relieve stress, the resin layer 316 of low stress may be formed both between the first conductive patterns 302 and the silicon substrate 305 as well as between the second conductive patterns 303 and the silicon substrate 305.

The nineteenth embodiment of this invention is described in reference to FIGS. 55 to 58. FIGS. 55 to 57 are cross section views showing the steps of a process for a wiring board for a multi-chip semiconductor device of the nineteenth embodiment of this invention while FIG. 58 is a plan view showing a method for creating a recess in a chip for a multi-chip semiconductor device of the nineteenth embodiment of this invention.

Figure 57A:
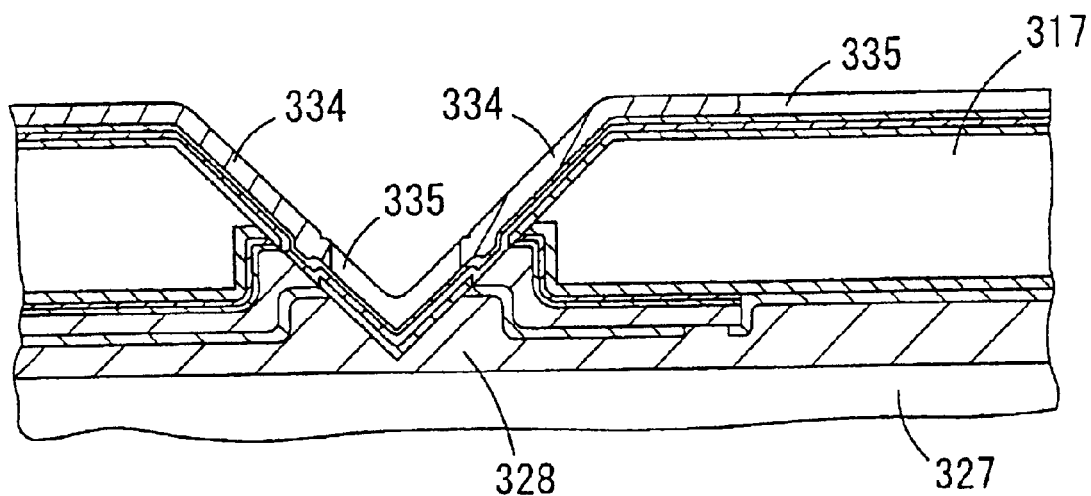
FIG. 57 is a cross section view of the steps subsequent to FIG. 56.
Figure 57B:
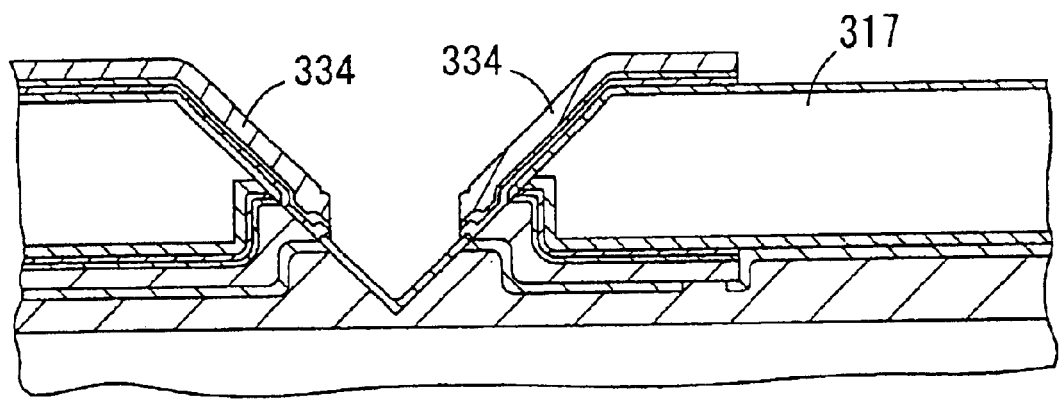
Figure 57C:
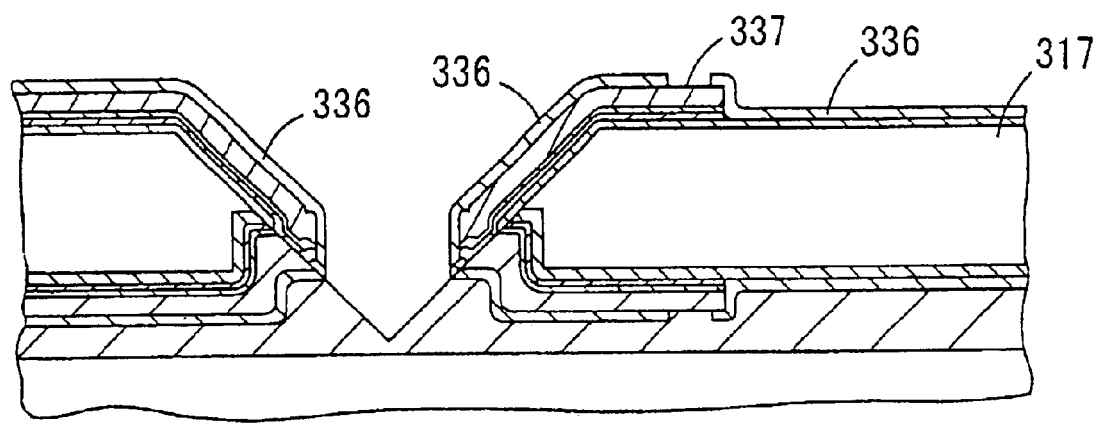
Figure 57D:
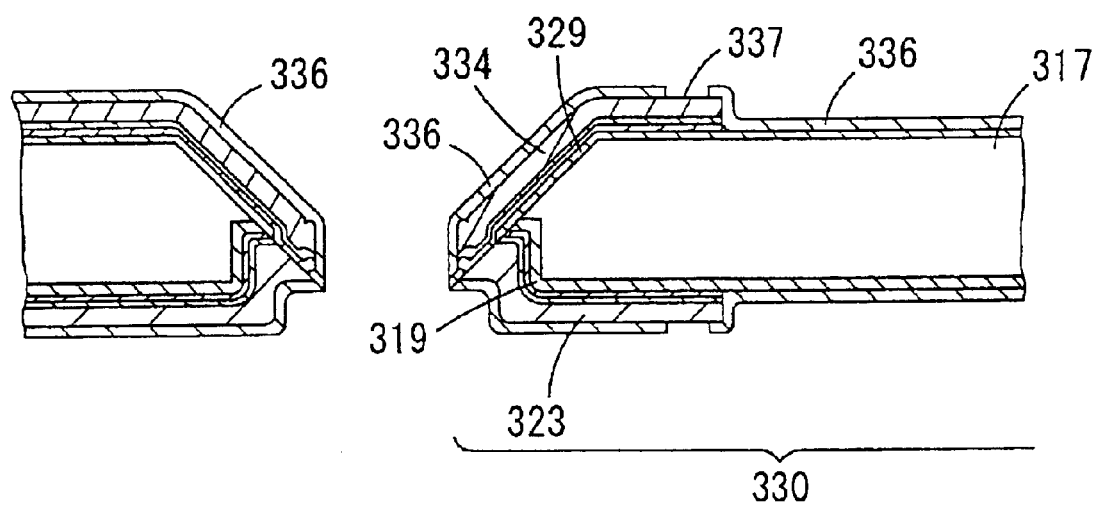

As shown in FIG. 57D, this silicon wiring board 330 has a silicon substrate 317 made of silicon wherein side surfaces (inclined planes 329) are formed so that the side surfaces and the top surface form acute angles and a recess 319 is formed around the top surface in the same manner as in the second embodiment and is provided with first conductive patterns 323 which are formed on the top surface and within the recess 319 of this silicon substrate 317 and which are made of at least one layer that have electrodes and with second conductive patterns 334 which are formed on the rear surface and the side surfaces of the silicon substrate 317, which are connected to the first conductive patterns 323 and which are made of at least one layer that has electrodes.

Figure 55A:
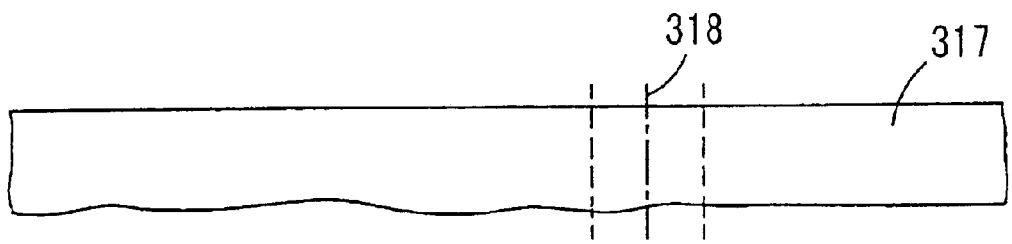
FIG. 55 is a cross section view of a step showing a manufacturing process of a wiring board for a multi-chip semiconductor device according to the nineteenth embodiment of the present invention.

Next, a process for a wiring board for a multi-chip semiconductor device in the above described structure is described. First, as shown in FIG. 55A, a silicon substrate 317 in a wafer condition is prepared.

Figure 55B:
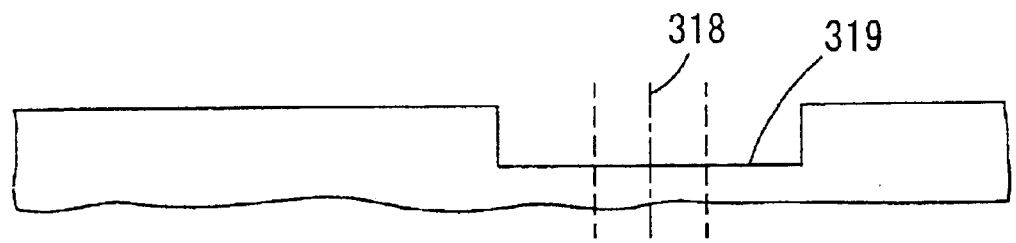

Next, as shown in FIG. 55B, a recess 319 is formed on the surface of the silicon substrate 317 by means of an RIE method so as to cross the scribe line 318. At this time, a mask is formed in order for the other portions not to be etched and the mask is removed after etching. The depth of this recess 319 is 20 $\mu$m to 100 $\mu$m. A partial plan view at the time of this is shown in FIG. 58. FIG. 55B is a cross section view along V–V' in FIG. 58. Here, the method for creating the recess 319 is not limited to the RIE method but rather optical etching, wet etching, supersonic wave processing, discharge processing or the like may be used. In addition, the above processing methods may be combined.

Figure 55C:
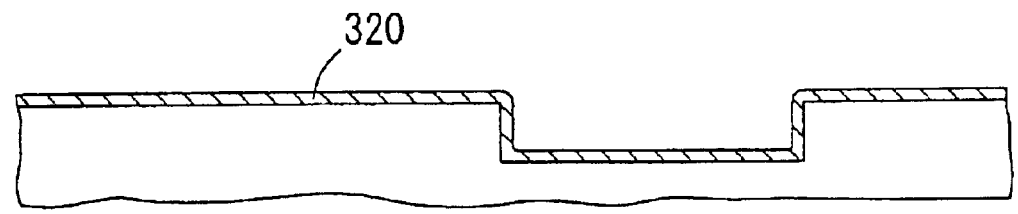

Next, as shown in FIG. 55C, a first insulating layer 320 is formed on the entire surface including the inner walls of the recess 319. Here, the first insulating layer 320 is formed of a layer such as $SiO_2$, SiN, SiON or polyimide film by means of a CVD method, a spattering method, an optical CVD method, an application method, or the like.

Figure 55D:
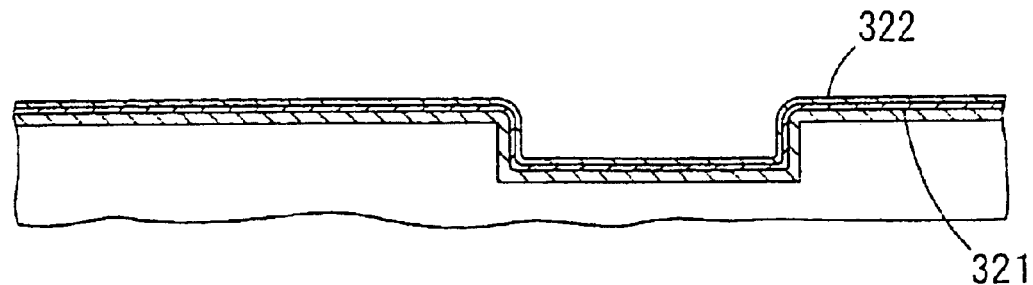

Next, as shown in FIG. 55D, a layered metal film, wherein a barrier layer 321 and a seed layer 322 are layered in sequence, is formed on the entirety of the top surface. As for the method for forming the barrier layer 321 and the seed layer 322, a spattering method, a CVD method, an electron beam deposition method, or the like. Ti, Ti/W, Cr or Ni is used for the barrier layer 321 while Cu, Au, Ag or Ni is used for the seed layer 322.

Figure 55E:
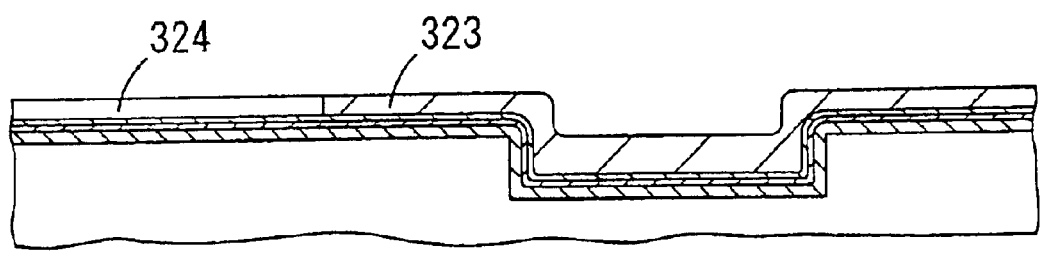

Next, as shown in FIG. 55E, the first conductive patterns 323 are formed so as to fill into the recess 319 and to be in desired wire and electrode forms by means of an electrolytic plating using the seed layer 322 as an electrode. At this time, a plating resist 324 is formed on the seed layer 322 for the formation of desired wires and electrodes and the plating resist 324 is removed after the electrolytic plating. As for the wire material, Cu, Au, W, Mo, Ni, Ti, Al or the like is used.

Figure 55F:
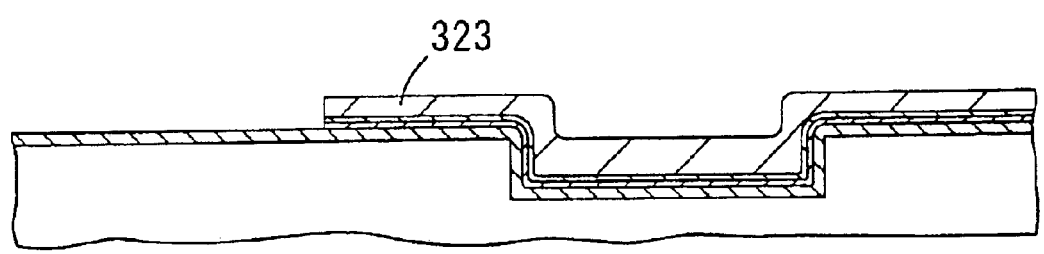

Next, as shown in FIG. 55F, the seed layer 322 in the region other than the region where the first conductive patterns 323 are formed is removed through etching using the first conductive patterns 323 as a mask and the barrier layer in the region other than the region where the first conductive patterns 323 are formed is removed through etching using the same first conductive patterns 323 as a mask.

Figure 55G:
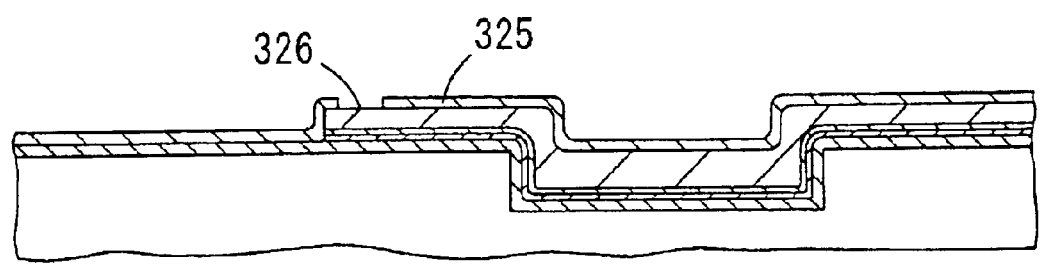

Next, as shown in FIG. 55G, a second insulating layer 325 is formed on the entire surface except for the first conductive pattern electrode parts 326. At this time, after forming the second insulating layer 325 on the entire surface, a mask is formed and the second insulating layer 325 on the first conductive pattern electrode parts 326 is etched and, after that, the mask is removed. Here, the second insulating layer 325 is formed of a layer such as $SiO_2$, SiN, SiON or polyimide film by means of a CVD method, a spattering method, an optical CVD method, an application method, or the like.

As a result of this, only the first conductive pattern electrode parts 326 are formed on the wafer surface in the condition of exposing from the second insulating layer 325.

Figure 56A:
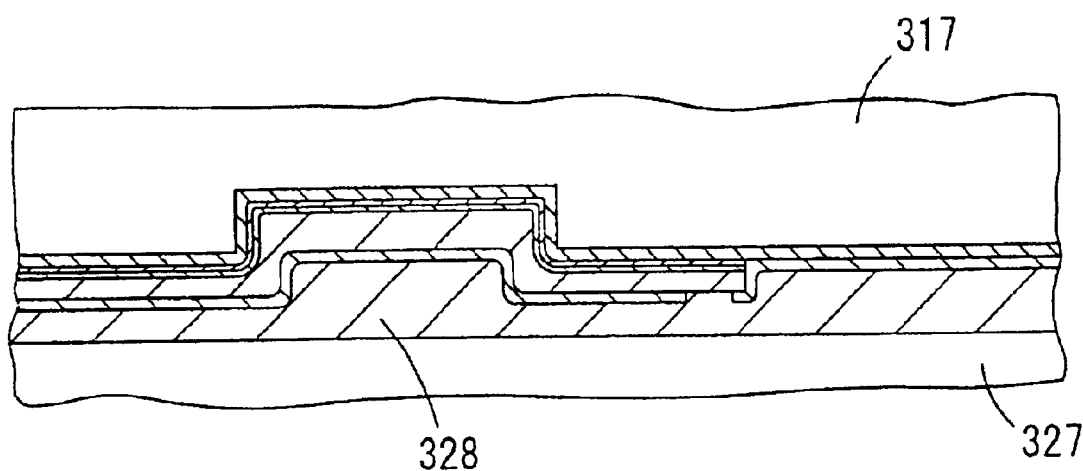
FIG. 56 is a cross section view of the steps subsequent to FIG. 55.

Next, as shown in FIG. 56A, the wafer surface is adhered to a support body 327 with an adhesive 328 and the silicon substrate 317 is polished starting from the rear surface so as to be made thinner to have a desired thickness. The polishing method may be mechanical polishing, chemical polishing or CMP. The thickness of the silicon substrate 317 is 50 $\mu$m to 200 $\mu$m.

Figure 56B:
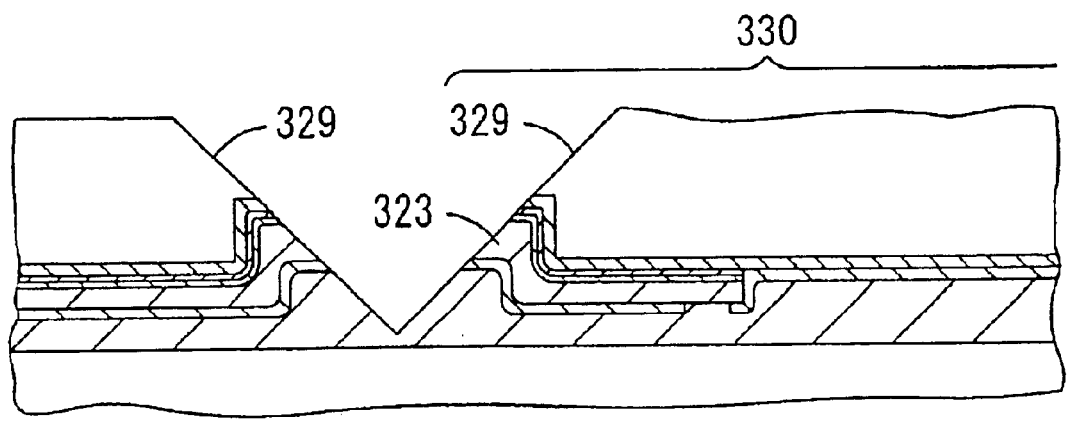

Next, as shown in FIG. 56B, bevel cutting is carried out in the rear surface of the silicon substrate 317 along the scribed line so that formation of inclined planes 329 wherein the top surface and the inclined planes form acute angles, exposure of the first conductive patterns 323 from the inclined planes 329 so as to make the patterns visible from the rear surface and division of the substrate into the silicon wiring boards 330 are carried out simultaneously. Here, the processing method may be etching.

Figure 56C:
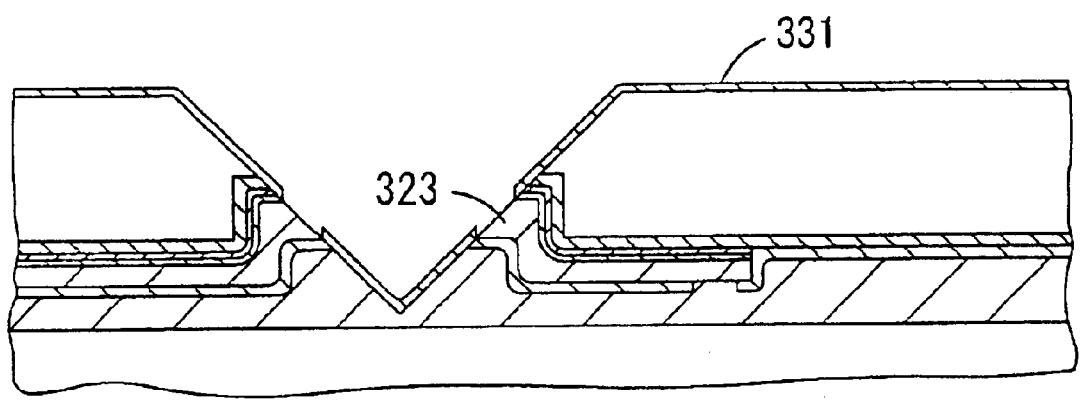

Next, as shown in FIG. 56C, a third insulating layer 331 is formed on the entirety of both the inclined planes 329 and the rear surfaces except for the parts of the first conductive patterns 323 exposed from the inclined planes 329. At the time of this, after forming the third insulating layer 331 on the entirety of both the inclined planes 329 and the rear surface, a mask is formed so that the third insulating layer 331 of the opening parts for the first conductive patterns 323 is etched and, after that, the mask is removed. Here, the third insulating layer 331 is formed of a layer such as $SiO_2$, SiN, SiON or polyimide film by means of a CVD method, a spattering method, an optical CVD method, an application method, or the like. It is desirable for the third insulating layer 331 to be formed of a material of which the etching rate is faster than that of the first insulating layer 320 and the second insulating layer 325. Thereby, even in the case a mask shift occurs at the time of etching of the third insulating layer 331 for openings, the third insulating film 331 can be selectively etched for openings without etching the first insulating layer 320 and the second insulating layer 325 and the first insulating layer 320 and the second insulating layer 325, which cover the first conductive patterns 323, are not partially removed.

Figure 56D:
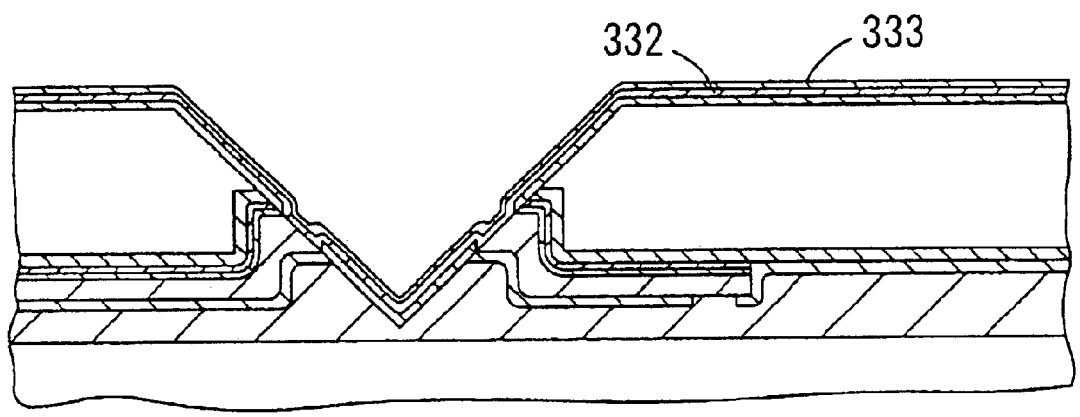

Next, as shown in FIG. 56D, a layered metal film, wherein a barrier layer 332 and a seed layer 333 are layered in sequence, is formed on the entirety of both the inclined planes 329 and the rear surface. As for the method for forming the barrier layer 332 and the seed layer 333, a spattering method, a CVD method, an electron beam deposition method, or the like is used. Ti, Ti/W, Cr or Ni is used for the barrier layer while Cu, Au, Ag or Ni is used for the seed layer.

Next, as shown in FIG. 57A, second conductive patterns 334 are formed on the inclined planes 329 and the rear surface by means of an electrolytic plating using the seed layer 333 as an electrode so as to be electrically connected to the first conductive patterns 323 exposed from the inclined planes 329 and to be desired wire and electrode forms. At this time, in order to gain desired wire and electrode forms, a plating resist 335 is formed on the seed layer 333 so that the plating resist 335 is removed after the electrolytic plating. As for the wire material, Cu, Au, W, Mo, Ni, Ti, Al or the like is used.

Next, as shown in FIG. 57B, the seed layer 333 in the region other than the region where the second conductive patterns 334 are formed is removed through etching by using the second conductive patterns 334 as a mask and the barrier layer 332 in the region other than the region where the second conductive patterns 334 are formed is removed through etching by using the same second conductive patterns 334 as a mask.

Next, as shown in FIG. 57C, a fourth insulating layer 336 is formed on the entirety of the inclined planes 329 and the rear surface except for the second conductive pattern electrode parts 337 and adhesive 328 parts. At that time, after forming the fourth insulating layer 336 on the entirety of both the inclined planes 329 and the rear surface, a mask is formed so that the fourth insulating layer 336 on the second conductive pattern electrode parts 337 as well as the fourth insulating layer 336 and the third insulating layer 331 on the adhesive 328 parts are etched and, after that, the mask is removed. Here, the fourth insulating layer 336 is formed of a layer such as $SiO_2$, SiN, SiON or polyimide film by means of a CVD method, a spattering method, an optical CVD method, an application method, or the like.

Next, as shown in FIG. 57D, the adhesive 328 and the support body 327 are removed and the silicon wiring board 330 is gained.

As a result of this, only the first conductive pattern electrode parts 326 are formed on the surface of the silicon wiring board 330 in the condition of being exposed from the second insulating layer 325 while only the second conductive pattern electrode parts 337 are formed on the rear surface in the condition exposed from the insulating layer 336 so as to complete the structure wherein the first conductive pattern electrode parts 326 on the surface and the second conductive pattern electrode parts 337 on the rear surface are electrically connected to each other.

As described above, in this embodiment, the step of forming a recess 319 on the surface of the silicon substrate 317 so as to cross the scribe line 318, the step of bevel cutting the scribe line 318 from the rear surface are provided and, thereby, just by forming conductive patterns on the top surface and on the rear surface, a structure which has electrodes electrically connected to each other on the top surface and on the rear surface, respectively, of the silicon wiring board 330 can be formed.

Therefore, according to the present embodiment, electrically connected electrodes on both sides can be easily formed.

In addition, according to the present embodiment, after forming first conductive patterns 323 within the recess 319 created in the wafer condition the central part of the recess 319 is cut so that the cutting lines and the top surface form acute angles and, thereby, parts of the first conductive patterns 323 for wiring can be made visible from the rear surface and, therefore, it is not necessary to create the recess 319 extremely deeply and it is also not necessary to polish the silicon substrate 317 so as to become extremely thin so that the freedom of setting the thickness of the silicon wiring board 330 is great, the number of manufacturing steps can be reduced and the cost can be reduced.

In addition, according to the present embodiment, formation of inclined planes 329 where the top surface and the inclined planes form acute angles through bevel cutting, division of the silicon wiring board 330 into pieces and the exposure of the first conductive patterns 323 so as to be visible from the rear surface can be carried out simultaneously and the number of manufacturing steps and the manufacturing cost can be reduced to a great extent in comparison with the case where other means are used for the formation.

The twentieth embodiment of this invention is described in reference to FIG. 59. FIG. 59 is a cross section views showing the steps of a process for a wiring board for a multi-chip semiconductor device of the twentieth embodiment of this invention.

Figure 59A:
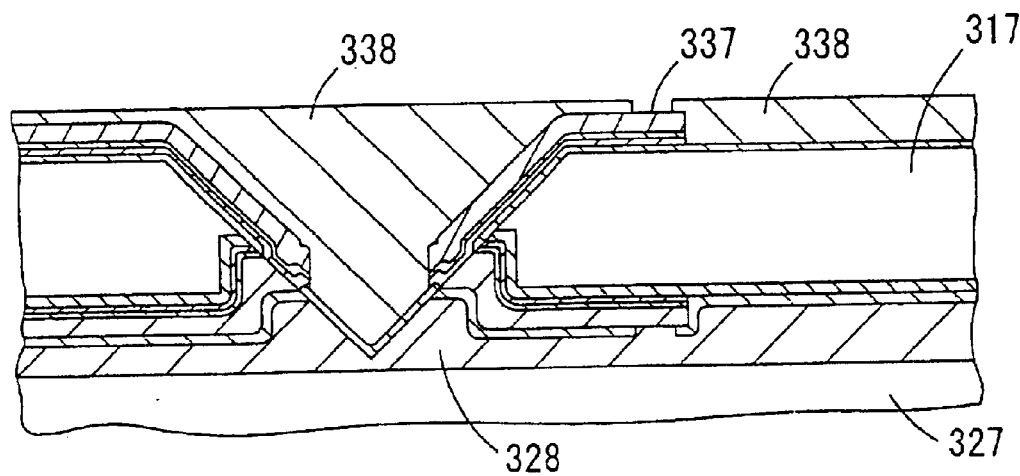
FIG. 59 is a cross section view of showing a step showing a manufacturing method of the wiring board for a multi-chip semiconductor device according to the twentieth embodiment of the present invention.
Figure 59B:
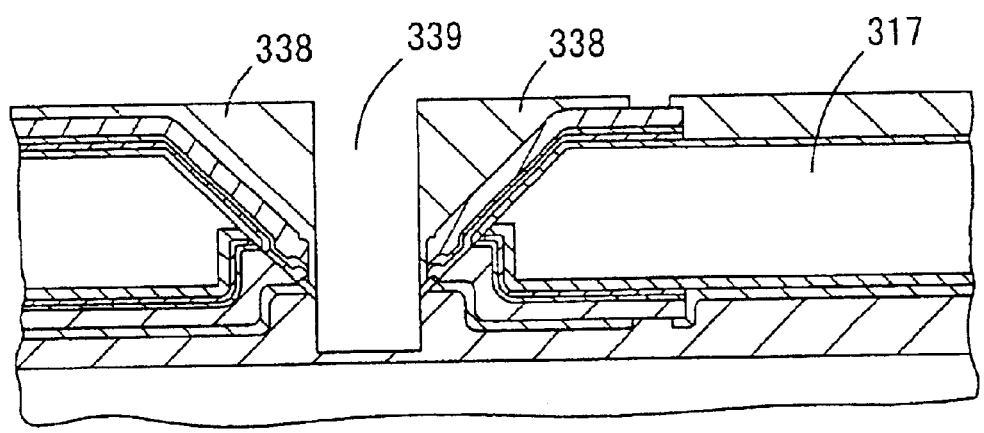
Figure 59C:
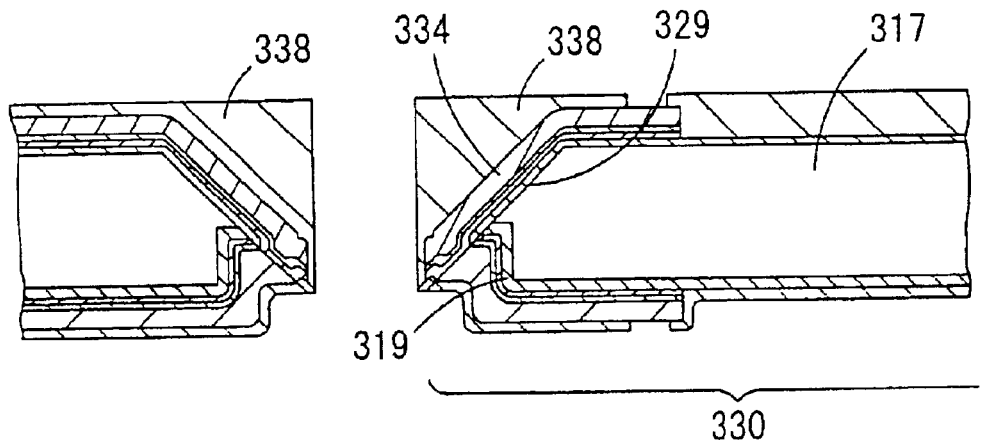
Figure 60:
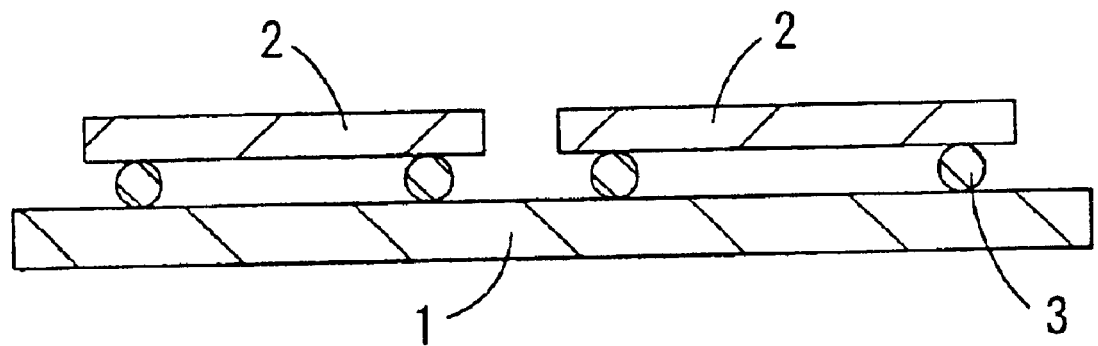
FIG. 60 is a cross section view of showing a conventional semiconductor device.
Figure 61:
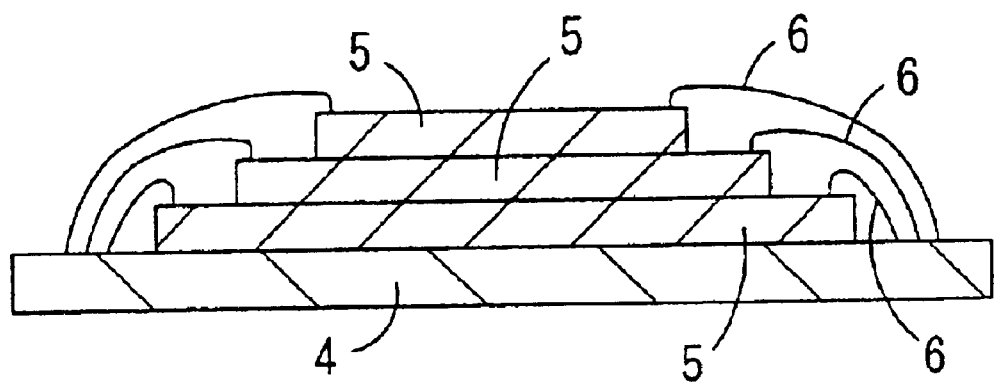
FIG. 61 is a cross section view of showing a conventional semiconductor device.
Figure 62:
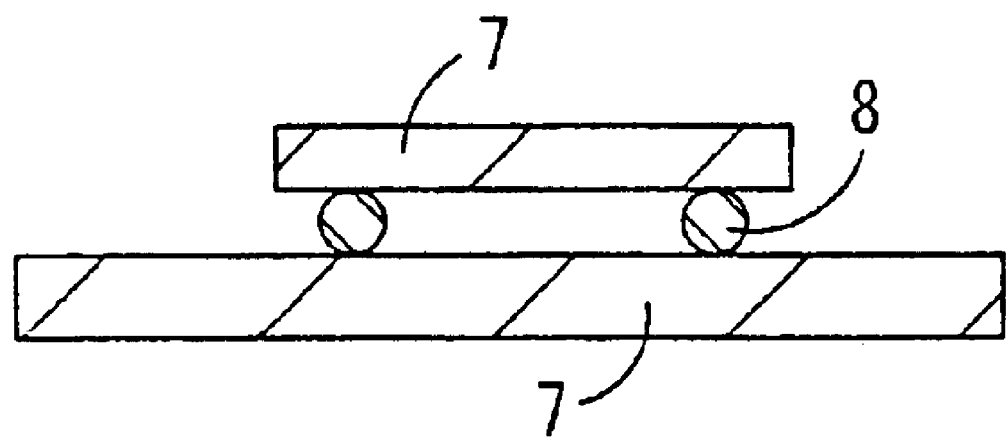
FIG. 62 is a cross section view of showing a conventional semiconductor device.
Figure 63:
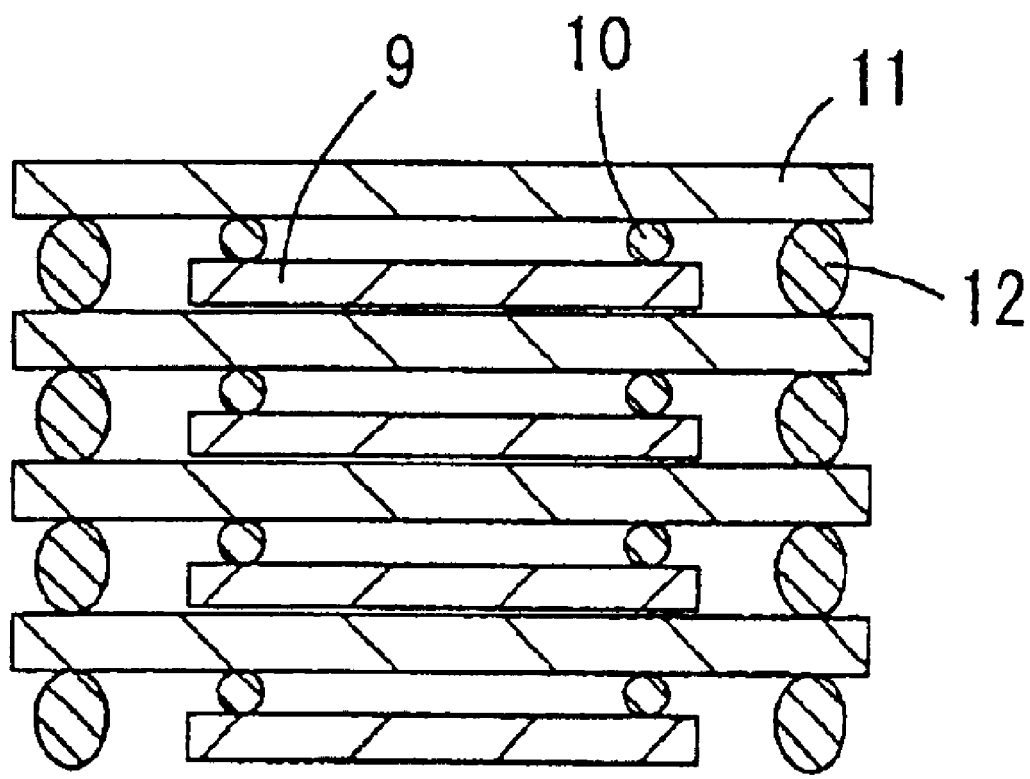
FIG. 63 is a cross section view of showing a conventional semiconductor device.
Figure 64:
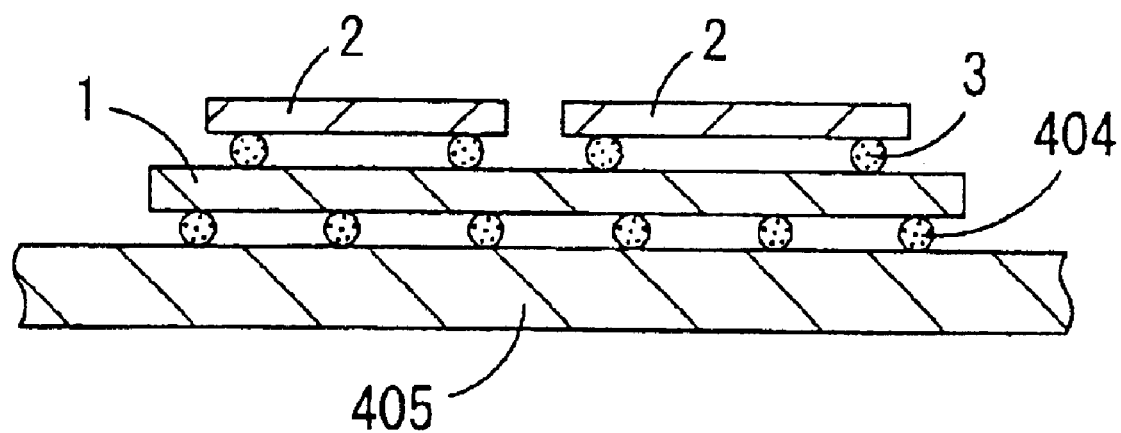
FIG. 64 is a cross section view of a conventional semiconductor device.

As shown in FIG. 59C, this silicon wiring board 330 has a silicon substrate 317 made of silicon wherein side surfaces (inclined planes 329) are formed so that the top surface and the side surfaces form acute angles while a recess 319 is formed around the top surface in the same manner as in the second embodiment and is provided with first conductive patterns 323 which are formed on the surface and in the recess 319 of this silicon substrate 317 and which is made of at least one layer having electrodes and with the second conductive patterns 334 which are formed on the rear surface and the side surfaces of the silicon substrate 317, which are connected to the first conductive patterns 323 and are made of at least one layer having electrodes, wherein an insulating layer 338 is formed on the side surfaces so that the side surfaces and the top surface of the silicon substrate 317 form right angles.

Next, a process for a wiring board for a multi-chip semiconductor device in the above mentioned structure is described. Here, the same symbols as in FIGS. 55 to 57 are attached to the components corresponding to those of the wiring board for a multi-chip semiconductor device in FIGS. 55 to 57, of which the detailed descriptions are omitted.

In this embodiment, after the step of FIG. 57B of the nineteenth embodiment, an insulating resin layer 338 is formed on the entirety of rear surface except for the second conductive pattern electrode parts 337 and on the inclined planes 329 as shown in FIG. 59A. At that time, a liquid resin is applied to the entirety of both the inclined planes 329 and the rear surface so as to achieve the flatness and the resin layer is formed through exposure and development for the openings for the second conductive pattern electrode parts 337. Here, though, in the present embodiment the above step takes place after the step of FIG. 57B, it may take place after FIG. 57C. The liquid resin, such as polyimide, may be able to release stress.

Next, as shown in FIG. 59B, dicing is carried out along the scribe line on the rear surface so as to form the side surfaces perpendicular to the top surface.

Next, as shown in FIG. 59C, the adhesive 328 and the support body 327 are removed and the silicon wiring board 330 is gained.

As described above, in this embodiment the side surfaces formed as the inclined surfaces 329 can be covered with a liquid resin and, by dicing the parts of cured liquid resin, the side surfaces formed of a thick insulating resin layer 338 which are perpendicular to the top surface can be gained and at the same time, division into pieces can be carried out.

Accordingly, the side surfaces of the wiring board for a multi-chip semiconductor device can be reinforced and at the same time the protection of the second conductive patterns 334 on the inclined planes 329 can be enhanced.

Here, the above embodiments describe examples and the present invention is not limited to the above embodiments. Moreover, a variety of modifications can be implemented within the scope without deviating from the gist of the present invention.

What is claimed is:

1. A semiconductor chip comprising a semiconductor substrate which has a top surface on which elements are integrally formed, a rear surface which opposes to said top surface in a parallel manner, an inclined plane formed so that said top surface and the inclined plane form an acute angle and a recess which is created around said top surface and which continues to said inclined plane, wherein the semiconductor chip comprises a first electrode formed on said top surface, a second electrode formed on said rear surface and a conductive pattern which is formed within said recess and on said inclined plane and which is for connecting said first electrode and said second electrode.

2. A semiconductor chip comprising a semiconductor substrate which has a top surface on which elements are integrally formed, a rear surface which opposes to said top surface in a parallel manner, an inclined plane formed so that said top surface and the inclined plane form an acute angle and a recess which is created around said top surface and which continues to said inclined plane and has a surface electrode which is connected to said elements, wherein the semiconductor chip comprises a first insulating layer formed on the inside walls of said recess and on said top surface other than on said surface electrode, a first conductive pattern which is filled into said recess where said first insulating layer is formed and which is formed on said top surface where said first insulating layer is formed in a desired wire and electrode form so as to be connected to said surface electrode, a second insulating layer formed on said top surface with openings for an electrode part made of said first conductive pattern, an inclined part where said first conductive pattern in said recess is exposed so as to continue to said inclined plane around said rear surface, a third insulating layer formed on said rear surface and on said inclined plane with an opening for said inclined part from which said first conductive pattern is exposed, a second conductive pattern which is formed on said inclined plane where said third insulating layer is formed and on the rear surface of said semiconductor chip in a desired wire and electrode form so as to be connected to said first conductive pattern and a fourth insulating layer formed on the rear surface and on said inclined plane of said semiconductor chip with an opening for an electrode part made of said second conductive pattern.

3. A wiring board of which the base material is silicon, characterized in that a plurality of through holes are created in said wiring board, a first conductive pattern is formed on a surface of said wiring board, said through holes are created in an inclined plane formed so that the inner angle made up of a rear surface of said wiring board and the inclined plane is an obtuse angle, a second conductive pattern is formed on said rear surface and on said inclined plane and said first conductive pattern and said second conductive pattern are electrically connected through a third conductive pattern formed in said plurality of through holes.

4. A wiring board according to claim 3, wherein an insulating layer is formed on a side surface so that the surface of the insulating layer and the surface of the substrate form a right angle.

5. A wiring board according to claim 3, comprising a resin layer of low stress inserted either between the first conductive pattern and the substrate or between the second conductive pattern and the substrate or inserted in both cases.

6. A wiring board for a multi-chip semiconductor device on which electronic parts are mounted and which is mounted on a mother board, characterized in that said wiring board has a silicon substrate made of silicon, in that a first conductive pattern for mounting and wiring said electronic parts which is made of, at least, one layer is provided on a top surface of this silicon substrate and a second conductive pattern made of, at least, one layer which has an electrode for being mounted on said mother board is provided on a rear surface of said silicon substrate and in that said first conductive pattern and said second conductive pattern are electrically connected through a third conductive pattern formed on a side surface of said silicon substrate.

7. A wiring board according to claim 6, comprising a resin layer of low stress inserted either between the first conductive pattern and the substrate or between the second conductive pattern and the substrate or inserted in both cases.

8. A wiring board for a multi-chip semiconductor device on which electronic parts are mounted and which is mounted on a mother board, wherein said wiring board is characterized by comprising a silicon substrate made of silicon wherein a side surface is formed so that a top surface and the side surface of the substrate form an acute angle while a recess is formed around the substrate, a first conductive pattern made of, at least, one layer having an electrode formed on the surface and within said recess of said silicon substrate and a second conductive pattern made of, at least, one layer having an electrode which is formed on the rear surface and on said side surface of said silicon substrate and which is connected to said first conductive pattern.

9. A wiring board according to claim 8, wherein an insulating layer is formed on a side surface so that the surface of the insulating layer and the surface of the substrate form a right angle.

10. A wiring board according to claim 8, comprising a resin layer of low stress inserted either between the first conductive pattern and the substrate or between the second conductive pattern and the substrate or inserted in both cases.

11. A semiconductor device, characterized in that a plurality of semiconductor chips, comprising semiconductor substrates, first external electrodes formed on first surfaces of said semiconductor substrates, second external electrodes formed on second surfaces of said semiconductor substrates and through holes created in said semiconductor substrates, wherein said through holes are created in inclined planes formed so that the internal angles made up of said second surfaces and the inclined planes are obtuse angles and said first external electrodes and said second external electrodes are electrically connected through conductive patterns formed so as to follow the inner walls of said through holes and said inclined planes, are layered while said respective first external electrodes and said respective second external electrodes are electrically connected.

12. A semiconductor device characterized in that between two first semiconductor chips comprising semiconductor substrates, first external electrodes formed on first surfaces of said semiconductor substrates, second external electrodes formed on second surfaces of said semiconductor substrates and through holes created in said semiconductor substrates, wherein said through holes are created in inclined planes formed so that the internal angles made up of said second surfaces and the inclined planes are obtuse angles and said first external electrodes and said second external electrodes are electrically connected through first conductive patterns formed so as to follow the inner walls of said through holes and said inclined planes, a second semiconductor chip wherein third external electrodes formed in the parts other than the region of the third surface on which elements are formed and fourth external electrodes formed in the parts other than the region of the fourth surface on which elements are formed are electrically connected through second conductive patterns is provided so that said first semiconductor chips and said second semiconductor chip are electrically connected directly or via connection members.

13. A multi-chip type semiconductor device formed by layering a plurality of semiconductor chips comprising semiconductor substrates with top surfaces on which elements are integrally formed, wherein said layered semiconductor chips comprise semiconductor substrates having said top surfaces, rear surfaces which are opposed to said top surfaces in a parallel manner, inclined planes formed so that the inclined planes and said top surfaces form acute angles and recesses created in the periphery around said top surfaces and comprise first external electrodes formed on said top surfaces, second external electrodes formed on said rear surfaces and conductive patterns formed in said recesses and on said side surfaces for connecting said first external electrodes and said second external electrodes and wherein said semiconductor chips are electrically connected to other semiconductor chips via said first external electrodes and said second external electrodes.

14. A semiconductor device according to claim 13, wherein the layered semiconductor chips are electrically connected to other semiconductor chips directly above and directly below said semiconductor chips by directly connecting the electrodes thereof or via connection members.

* * * * *